US011631824B2

(12) United States Patent
Yao et al.

(10) Patent No.: US 11,631,824 B2
(45) Date of Patent: Apr. 18, 2023

(54) MEMRISTOR DEVICE COMPRISING PROTEIN NANOWIRES

(71) Applicant: University of Massachusetts, Boston, MA (US)

(72) Inventors: Jun Yao, Boston, MA (US); Derek R. Lovley, Amherst, MA (US); Tianda Fu, Boston, MA (US)

(73) Assignee: University of Massachusetts, Boston, MA (US)

( * ) Notice: Subject to any disclaimer, the term of this patent is extended or adjusted under 35 U.S.C. 154(b) by 32 days.

(21) Appl. No.: 17/226,016

(22) Filed: Apr. 8, 2021

(65) Prior Publication Data

US 2021/0336169 A1    Oct. 28, 2021

Related U.S. Application Data

(60) Provisional application No. 63/007,136, filed on Apr. 8, 2020.

(51) Int. Cl.
| | | |
|---|---|---|
| G11C 11/54 | (2006.01) | |
| H01L 51/05 | (2006.01) | |
| G11C 13/00 | (2006.01) | |
| H01L 51/00 | (2006.01) | |

(52) U.S. Cl.
CPC .......... H01L 51/0591 (2013.01); G11C 11/54 (2013.01); G11C 13/0019 (2013.01); H01L 51/0093 (2013.01)

(58) Field of Classification Search
CPC . H01L 51/0591; H01L 51/0093; G11C 11/54; G11C 13/0019
USPC .......................................................... 365/167
See application file for complete search history.

(56) References Cited

U.S. PATENT DOCUMENTS

| | | | | |
|---|---|---|---|---|
| 8,232,584 | B2* | 7/2012 | Lieber | A61B 5/418 |
| | | | | 257/253 |
| 8,608,921 | B2* | 12/2013 | Li | C12Q 1/005 |
| | | | | 435/14 |
| 8,729,233 | B2 | 5/2014 | Reguera | |
| 9,102,521 | B2* | 8/2015 | Lieber | B82Y 10/00 |
| 9,234,508 | B2 | 1/2016 | Sahin | |
| 9,697,460 | B2* | 7/2017 | Collins | H03M 1/74 |

(Continued)

FOREIGN PATENT DOCUMENTS

| | | |
|---|---|---|
| CN | 108365776 A | 8/2018 |
| WO | 2020069523 A1 | 4/2020 |
| WO | 2021102327 A1 | 5/2021 |

OTHER PUBLICATIONS

Gianluca Milano et al, "Self-limited single nanowire systems combining all-in-one memristive and neuromorphic functionalities", Dec. 2018, Nature Communications, Article No. 5151. (Year: 2018).*

(Continued)

*Primary Examiner* — Viet Q Nguyen
(74) *Attorney, Agent, or Firm* — Hamilton, Brook, Smith & Reynolds, P.C.

(57) ABSTRACT

A memristive device includes a biomaterial comprising protein nanowires and at least two electrodes in operative arrangement with the biomaterial such that an applied voltage induces conductance switching. An artificial neuron or an artificial synapse includes a memrisitive device with the electrodes configured to apply a pulsed voltage configured to mimic an action-potential input.

22 Claims, 41 Drawing Sheets

Specification includes a Sequence Listing.

(56) References Cited

U.S. PATENT DOCUMENTS

| | | | |
|---|---|---|---|
| 9,784,249 B2 | 10/2017 | Li | |
| 10,083,974 B1* | 9/2018 | Huang | H01L 45/1233 |
| 10,311,357 B2* | 6/2019 | Nugent | G06N 3/08 |
| 10,388,370 B2* | 8/2019 | Schmidt | G11C 11/54 |
| 10,684,244 B2* | 6/2020 | Chen | G01N 27/27 |
| 10,741,778 B2* | 8/2020 | Kirsch | H01L 51/0051 |
| 11,043,265 B2* | 6/2021 | Li | G11C 5/02 |
| 11,063,227 B2* | 7/2021 | Kirsch | C07C 59/125 |
| 11,133,058 B1* | 9/2021 | Philip | G11C 13/0028 |
| 2006/0113880 A1 | 6/2006 | Pei | |
| 2007/0157967 A1* | 7/2007 | Mershin | B82Y 30/00 |
| | | | 136/263 |
| 2009/0188784 A1* | 7/2009 | Lee | G01N 27/3278 |
| | | | 204/192.1 |
| 2010/0119879 A1* | 5/2010 | Girguis | H01M 8/1016 |
| | | | 429/2 |
| 2014/0330337 A1* | 11/2014 | Linke | H01L 31/075 |
| | | | 607/45 |
| 2018/0202964 A1* | 7/2018 | Alam | H01L 51/0035 |
| 2018/0371029 A1* | 12/2018 | Lovley | H01B 1/12 |
| 2019/0148085 A1 | 5/2019 | Kim | |
| 2020/0090830 A1* | 3/2020 | Lovley | C08L 29/04 |
| 2021/0002332 A1 | 1/2021 | Malvankar | |
| 2021/0070811 A1* | 3/2021 | Reguera | C07K 14/195 |
| 2021/0341406 A1* | 11/2021 | Yao | G01N 27/127 |
| 2021/0344286 A1 | 11/2021 | Yao et al. | |

OTHER PUBLICATIONS

Tianda Fu et al, "Bioinspired bio-voltage memristors", Nature Communications, 2020, Article (Year: 2020).*

Anish Kumar et al, "Protein Biosensors Based on Polymer Nanowires, Carbon Nanotubes and Zinc Oxide Nanorods", Sensors Journal, May 2011 (Year: 2011).*

Jiangfeng Zhou et al, "Development of nanowire-modified electrodes applied in the locally enhanced electric field treatment (LEEFT) for water disinfection", 2020, Journals of Materials Chemistry. Article (Year: 2020).*

Xiaomeng Liu et al, "Power generation from ambient humidity using protein nanowires", Feb. 2020 (Year: 2020).*

Yi Cui et al, "Nanowire Nanosensors for Highly Sensitive and Selective Detection of Biological and Chemical Species", Aug. 2021, Science Magazine, vol. 293, pp. 1289-1292. (Year: 2021).*

Gerald F. Audette et al, "Protein Nanotubes: From Bio-nanotech towards Medical Applications", Jun. 2019, Biomedicines Journal, vol. 7/46. (Year: 2019).*

Jerry A. Fereiro et al, "Tunneling explains efficient electron transport via protein junctions", Weizmann Institute of SCience Reports, Nov. 2017, vol. 114, No. 20 (Year: 2017).*

Ueki T., et al., Decorating the Outer Surface of Microbially Produced Protein Nanowires with Peptides, ACS Synth Biol. Aug. 16, 2019;8(8):1809-1817.

Ueki T., et al., An *Escherichia coli* Chassis for Production of Electrically Conductive Protein Nanowires, ACS Synth Biol. Mar. 20, 2020;9(3):647-654.

Liu X., et al., "Power Generation from Ambient Humidity Using Protein Nanowires," Nature; 578: 550-554 (2020).

Lovley, D. R., Electrically conductive pili: Biological function and potential applications in electronics, Curr. Opin. Electrochem. 4, 190(2017).

Lovely,D., et al., "Geobacter Protein Nanowires", Front. Microbiol. 10, 2078 (2019).

Adhikari, R. Y., et al., Conductivity of individual Geobacter pili, RSC Adv. 6, 8354 (2016).

Tan, Y. et al. Expressing the Geobacter metallireducens PilA in Geobacter sulfurreducens Yields Pili with Exceptional Conductivity. MBio. 8, 02203-16 (2017).

Adhikari, R. Y., et al. Conductivity of individual Geobacter pili. RSC Advances 6, 8354-8357 (2016).

Malvankar, N.S., et al., "Tunable Metallic-Like Conductivity in Microbial Nanowire Networks", Nat. Nanotechnol. 6, 573-579 (2011).

Notification of Transmittal of the International Search Report and Written Opinion of International Application No. PCT/US2019/053882, titled: "Electric Power Generation From Ambient Humidity Using Protein Nanowires," dated Jan. 17, 2020.

Notification Concerning Transmittal of International Preliminary Report on Patentability for International Application No. PCT/US2019/053882, entitled: "Electric Power Generation from Ambient Humidity Using Protein Nanowires," dated Apr. 8, 2021.

* cited by examiner

→ See FIG. 1B

MEMRISTOR DEVICE COMPRISING PROTEIN NANOWIRES

RELATED APPLICATION

This application claims the benefit of U.S. Provisional Application No. 63/007,136, filed on Apr. 8, 2020. The entire teachings of the above application are incorporated herein by reference.

INCORPORATION BY REFERENCE OF MATERIAL IN ASCII TEXT FILE

This application incorporates by reference the Sequence Listing contained in the following ASCII text file:

a) File name: 46821014001_Sequence_Listing.txt; created Jul. 14, 2021, 37 KB in size.

BACKGROUND

Biological brains are highly efficient in signal processing and intelligent decision making. Functional emulation can thus lead to advanced computing systems. The ability to register accumulative stimuli (e.g., charge flux) by a state variable (e.g., conductance) enables typical memristors to mimic neuromorphic behaviors that are inherently history-dependent. Various synaptic devices, neuromorphic components, and computing architectures have been demonstrated based on this property. Recently, a type of diffusive memristor has been shown to complement nonvolatile or drift memristors. The process of conductance decay in the diffusive memristors effectively produces an 'internal clock' to encode the relative temporal information, leading to functional emulations in short-memory synapses, artificial neurons, and capacitive neural networks. However, the switching voltages (0.2-2 V) required for such previously described memristors are higher than the amplitude of 50-120 mV in biological counterparts.

SUMMARY

Memristive devices are provided that can function at biological voltages. The memristive devices can also exhibit temporal integration similar to that observed in biological neurons.

An example of a memristive device includes a biomaterial comprising protein nanowires and at least two electrodes in operative arrangement with the biomaterial such that an applied voltage induces conductance switching.

Another example of a memristive device includes a biomaterial that facilitates reduction of metal ions and electrodes in operative arrangement with the biomaterial. A voltage applied to the biomaterial initiates an electrochemical reduction of metal ions to form a conduction channel in the biomaterial. The biomaterial can include protein nanowires.

The protein nanowires can comprise a pilus structure (e.g., a type IV pilus structure), a cytochrome filament structure, or a combination thereof. For example, the protein nanowires can be of the bacterium *G. sulfurreducens*, including wild-type protein nanowires or modified protein nanowires. Alternatively, the protein nanowires can be synthetically assembled. The protein nanowires can comprise a structure assembled from protein monomers having an amino acid sequence as disclosed in Tables 1 and 2 herein. The protein nanowires can be conductive or non-conductive. For example, the protein nanowires can be protein nanowires capable of exhibiting electrical conductivity, such as in a natural environment.

The biomaterial can comprise a composite of protein nanowires and at least one other material, such as a material that modifies a conductive property of the protein nanowires, confers structural support to the protein nanowires, or a combination thereof. The material can be organic or inorganic.

The memristor can function at biological voltages that are significantly reduced from conventional switching voltages of conventional memristors (e.g., 0.2-2 V). For example, the operative arrangement of the biomaterial and the at least two electrodes exhibits a switching voltage of about 20-150 mV, or of about 40-100 mV.

At least one of the electrodes can comprise a metal for which the biomaterial facilitates reduction in ionic form. For example, at least one of the electrodes can comprise Silver (Ag), Copper (Cu), Nickle (Ni), Chromium (Cr), Titanium (Ti), Tantalum (Ta), Aluminum (Al), Tungsten (W), or any combination thereof.

The biomaterial can be disposed within the device as a thin film. For example, the biomaterial can comprise a protein nanowire film having a thickness or length of about 2 nm to about 500 nm, or of about of about 2 nm to about 100 nm. The biomaterials and electrodes can be arranged in a planar or vertical structure. For example, in a planar structure, the at least two electrodes can be separated by a gap, with the biomaterial disposed within the gap. In a vertical structure, the at least two electrodes can be separated by a layer of the biomaterial or the at least two electrodes can be separated by an insulating layer with the biomaterial at least partially surrounding the layered electrodes.

A memristive device can provide for or be utilized in an artificial neuron or an artificial synapse. In an artificial neuron, the electrodes can be configured to apply a pulsed voltage configured to mimic an action-potential input to a biological neuron. For example, the pulsed voltage can be applied with a frequency pattern representing an integrate-and-fire event or a synaptic event. The synaptic event can exhibit a plasticity feature, such as paired-pulse facilitation or paired-pulse depression.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Figures 29A, 29B:
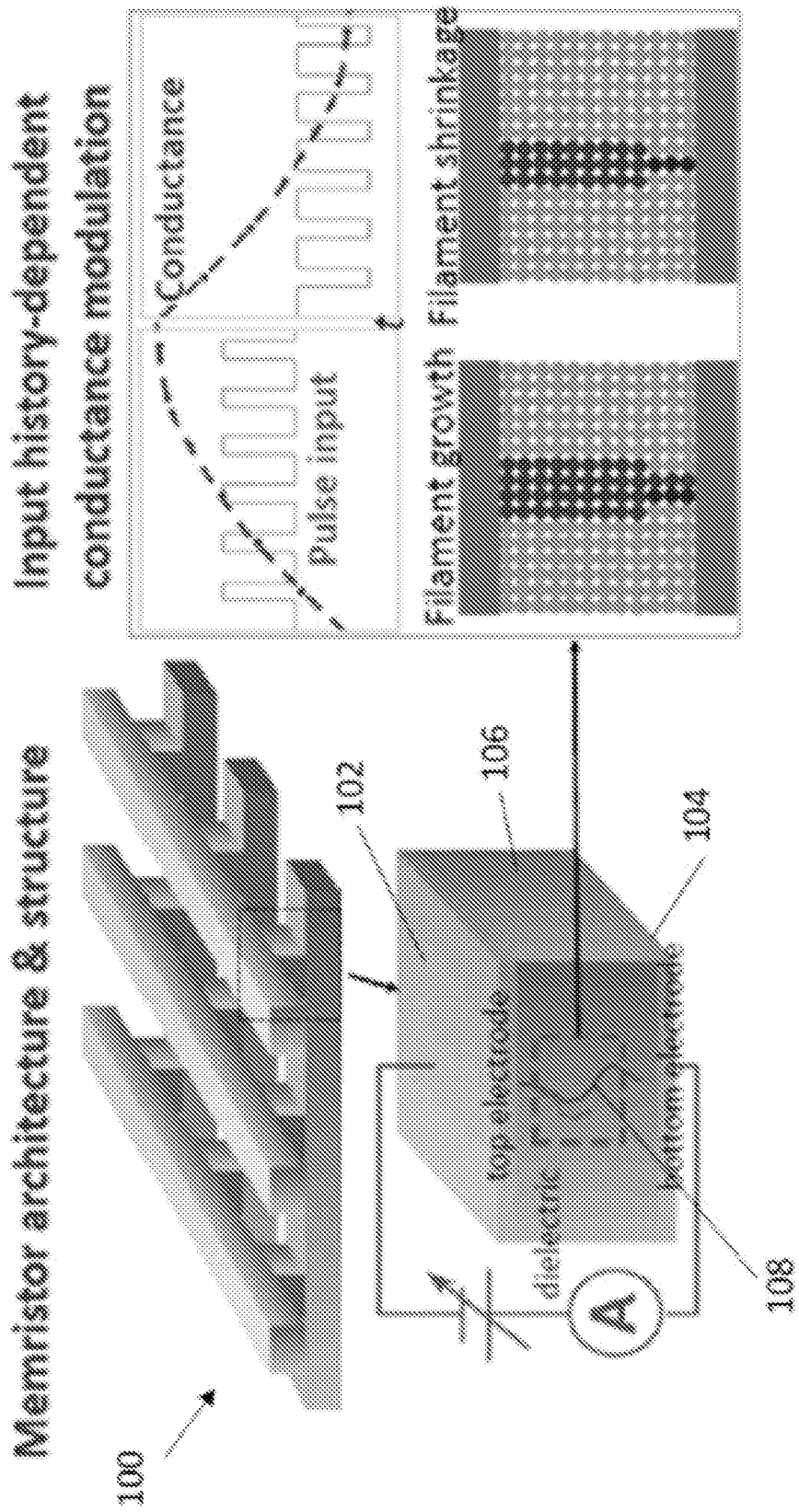
FIG. 29A is a schematic of a memristive device.
FIG. 29B illustrates example operation of the memristive device of FIG. 29A.

An example of a memristive device is shown in FIG. 29A. As illustrated, the device 100 includes at least two electrodes 102, 104 in operative arrangement with a biomaterial 106. The biomaterial can include protein nanowires, which can permit for conductive metal filaments 108 to form within the biomaterial. In operation, the biomaterial can function as a dielectric, with an applied voltage inducing conductance switching of the device. As shown in FIG. 29B, the conductance switching can be dependent upon an input history to the device.

As used herein, the term "biomaterial" is a material that is derived from or mimics a material produced by a biological organism. For example, a biomaterial can include biological macromolecules, such as proteins, nucleic acids, carbohydrates, or any combination thereof. The biomaterial can be provided in a variety of structural forms, such as a biofilm, a biopolymer or a matrix of crosslinked proteins.

For example, the biomaterial can comprise protein polymers having dimensions suitable for forming protein nanowires, as described further herein. The nanowires can be cross-linked to one another to form a matrix, or dispersed in an organic or inorganic medium to form a composite.

The biomaterial can be obtained (e.g., isolated, purified, extracted, secreted) from a biological source, such as a bacterium. Alternatively, the biomaterial can be produced synthetically or recombinantly using standard methods, techniques and reagents.

The biomaterial can be one that facilitates reduction of metal ions. As used herein, a material that facilitates reduction of metal ions is one that demonstrates an ability to function as a reducing agent, or as an electron donor, to reduce an amount of free metal ions in its environment, or as a material that can reduce an overpotential barrier of an electrochemical reaction. For example, the material may reduce the reaction overpotential barrier by at least about 1%, 5%, 10%, 25%, 50% or 75%.

In one example, a memristive device includes a biomaterial comprising nanowires formed of proteins (e.g., pilin monomers, cytochromes). The protein nanowires can comprise a pilus structure, a cytochrome filament structure, or a combination thereof. For example, the pilus structure can be a type IV pilus structure, such as that generated by the bacterium G. sulfurreducens. The cytochrome filament structure can be, for example, an OmcS filament structure, such as that generated by the bacterium G. sulfurreducens.

The nanowires can be wild-type protein nanowires generated by a bacterium, such as G. sulfurreducens. Alternatively, the nanowires can be wild-type protein nanowires generated by other microbes. Tables 1 and 2 below include examples of amino acid sequences of protein monomers that can be arranged into a structure, such as a nanowire, for inclusion in a memristive device.

TABLE 1

Non-limiting Examples of Protein Monomer Sequences Capable of Forming Protein Nanowires when Polymerized

| | |
|---|---|
| SEQ ID NO: 1 | FTLIELLIVVAIIGILAAIAIPQFSAYRVKAYNSAASSDLRNLKTALESAFADD QTYPPES |
| SEQ ID NO: 2 | FTLIELLIVVAIIGILAAIAIPQFAAYRQKAFNSAAESDLKNTKTNLESYYSEH QFYPN |
| SEQ ID NO: 3 | FTLIELLVVVAIIAILAAIAIPQFAKYRENAAKASAVADAKNIATAIESYYAD TQSFPSSISDGSIVPLGTQTFSLSKNNSFKGYYYNNPSYTFVVSNTAFNRSVT FNSATGGVDVNVW |
| SEQ ID NO: 4 | FTLVELMIVVAIIGILAAVAIPQFAQYRIRGFNSSALSDVRNLTTAQEAFFAD WLRYAVTHEAADVTEVKATGDLLEGPSTGAMVLAQWARQAHQQLPLAIG NGVVMQADVIPATAVSYVAISKHLQGNTMYGATNTSTAIHRDQETLVPGQ GGDVLPITGYMPEPHETDDPFIDHEEFEAQ |
| SEQ ID NO: 5 | FTLIELLVVVAIIGILAAIAIPQFAKYRINAFNSAAQSDLANVKSALESYYAE NFTYPSP |
| SEQ ID NO: 6 | FTLIELMIVIAIIGILAAIAIPQFQQYRTRGYNTAAKADAKNAYTAAQAYFSD HPSVTISSITDLANYGFKASADVTTTAAGDMDGLAITAKHSASDTTYQVDS QGTITP |
| SEQ ID NO: 7 | FTLIELMIVIAIIGILAAIAIPQFTQYRKRAYDASSKADLKSAYTAAQAWFND NPSGTLPAATITSATTTGELPGNGFKASTGVTATVTSGTMGTFSIATTHSQG TKTYNITAGGTLTES |
| SEQ ID NO: 8 | FTLIELMIVVAIIGILAAIAIPQFANYRTKGYNTKAKAELKSAYTACQAYFSD NPGATACANATLGGFNNSSDVNIAVGLSTPTGWTATASHIGGNQTFTVDN GGRITP |
| SEQ ID NO: 9 | FTLVELMIVVAIIGILAAVAVPYYQKYIQKSRMVSKVFPGMHAIETNMGTY FSFKNTLLDVGSTATFGQFVQDADTKCFSPSWAGEYLLITIKDPTLCQELKA LTGMTLSATPRMDTSRTKIRGWALAGPLAVQLGLEGEQ |
| SEQ ID NO: 10 | FTLIELMIVVAIIAILAAIAIPQYKKFQLKAKTSEAKANLGSIRSCEEAYSAET DNYVFCGWTPSNAPTAAGQAWVTTSGHEGFVSIGFAPAGTSRYCYCVGGS VNTAGTDAATNAFNEGNVDIYMTAKGDLDGDGSNQWFYATDEDLKVMA DYSQDDF |
| SEQ ID NO: 11 | FTLVELMIVVAIIGILAAVAVPYYQKYIQKARLTSKVIPGIHSIQTDLATYFSF QQMFPGAGATVNAMFTDANTHCFTPTVTSAAGATSNFKITFAIVGAGCTEL SSLYNQTITASPILGNNAQVITGWTFGGTLAANMGLAGAQ |
| SEQ ID NO: 12 | FTLIELLIVIAIIGVLAAIAIPAYTGYTKKAKVGEIIHALGAIKSAVSVYYSEA GATTDATTADLIRTTYGVDVPTGRASFQYTATSREIQATSKITGVTGTMTLT GSTDFKTWTWDGTMDKAYIPKN |
| SEQ ID NO: 13 | FTLIELMIVIAIIGILAAIAIPNFVSYRKKAYNRTAQADLSSAYSTVMAYYAD EKHKEIDNFTLDNLKDAGFKQTVGVAVTVTSVNFQDFELTARHSQGDIVY TIDAAGARSHN |

TABLE 1-continued

Non-limiting Examples of Protein Monomer Sequences Capable of Forming Protein Nanowires when Polymerized SEQ ID NO: 14
FTLIEILVALFLAILVASSLVTVFQMSHHIFYRDFSRSELQYMARKAMEDIID
YVVQAQPDSLAVNGAEGSQLEFILSSGAKIQYSQGANYWLYRKGPDSGPP
QPIVEQIAKVKFCLSGPHILTVDVVAGNEKNSFTLTQMIVPRAEIDENDWLN
SL SEQ ID NO: 15
FTLVELMVVLLIIGILVAIAIPIYNKTQENAQKRACQSNLRTLDSAAAQYGA
ATGNYPTDPLNNANFVGENGYVKTKPTCPAGGVYNYDATNGKFSCNVPD
HVYP SEQ ID NO: 16
FTLIELILALGLLSLIIVITTSFTIYSAGQKTYEYENSKIFVQQNARQAFLWLST
SIKQARSVEVMSENSIKTVAGDGETIIYYFKNGVLYREKNNGINPIAELSQL
KFKQPKDKQYIEIFLAAQGKEGDDIIIKTKATPFGLWVN SEQ ID NO: 17
FTMIEMMVVLIIIAVLIAGGIRFYLGYVERAKVTKAKSETTTMQAALDSYYA
EKGEYPDDENDRELVKAGLATDRISISTEGNDSIQYIYEGGGNSYKIITTATF
RAGKLVGEGQDGKSTEPDFGSGE

TABLE 2

Non-limiting Examples of Type IV Pilin Monomer Sequences

*Geobacter metallireducens*

SEQ ID NO: 18
FTLIELLIVVAIIGILAAIAIPQFAAYRQKAFNSAAESDLKNTKTNLESYYSEH
QFYPN

*Calditerrivibrio nitroreducens*

SEQ ID NO: 19
FTLIELLVVVAIIAILAAIAIPQFAKYRENAAKASAVADAKNIATAIESYYAD
TQSFPSSISDGSIVPLGTQTFSLSKNNSFKGYYYNNPSYTFVVSNTAFNRSVT
FNSATGGVDVNVW

*Desulfurvibrio alkaliphilus*

SEQ ID NO: 20
FTLVELMIVVAIIGILAAVAIPQFAQYRIRGFNSSALSDVRNLTTAQEAFFAD
WLRYAVTHEAADVTEVKATGDLLEGPSTGAMVLAQWARQAHQQLPLAIG
NGVVMQADVIPATAVSYVAISKHLQGNTMYGATNTSTAIHRDQETLVPGQ
GGDVLPITGYMPEPHETDDPFIDHEEFEAQ

*Felxistipes sinusarabici*

SEQ ID NO: 21
FTLIELLVVVAIIGILAAIAIPQFAKYRINAFNSAAQSDLANVKSALEYYAE
NFTYPSP

*Synthrophus aciditrophicus*

SEQ ID NO: 22
FTLIELMIVIAIIGILAAIAIPQFQQYRTRGYNTAAKADAKNAYTAAQAYFSD
HPSVTISSITDLANYGFKASADVTTTAAGDMDGLAITAKHSASDTTYQVDS
QGTITP

*Syntrophus gentianae*

SEQ ID NO: 23
FTLIELMIVIAIIGILAAIAIPQFTQYRKRAYDASSKADLKSAYTAAQAWFND
NPSGTLPAATITSATTTGELPGNGFKASTGVTATVTSGTMGTFSIATTHSQG
TKTYNITAGGTLTES

*Smithella sp. F21*

SEQ ID NO: 24
FTLIELMIVVAIIGILAAIAIPQFANYRTKGYNTKAKAELKSAYTACQAYFSD
NPGATACANATLGGFNNSSDVNIAVGLSTPTGWTATASHIGGNQTFTVDN
GGRITP

TABLE 2-continued

Non-limiting Examples of Type IV Pilin Monomer Sequences

*Syntrophobacter fumaroxidans*

SEQ ID NO: 25
FTLVELMIVVAIIGILAAVAVPYYQKYIQKSRMVSKVFPGMHAIETNMGTY
FSFKNTLLDVGSTATFGQFVQDADTKCFSPSWAGEYLLITIKDPTLCQELKA
LTGMTLSATPRMDTSRTKIRGWALAGPLAVQLGLEGEQ

*Syntrophobacter sp. DG_60*

SEQ ID NO: 26
FTLIELMIVVAIIAILAAIAIPQYKKFQLKAKTSEAKANLGSIRSCEEAYSAET
DNYVFCGWTPSNAPTAAGQAWVTTSGHEGFVSIGFAPAGTSRYCYCVGGS
VNTAGTDAATNAFNEGNVDIYMTAKGDLDGDGSNQWFYATDEDLKVMA
DYSQDDF

*Syntrophobacter sp. SbD1*

SEQ ID NO: 27
FTLVELMIVVAIIGILAAVAVPYYQKYIQKARLTSKVIPGIHSIQTDLATYFSF
QQMFPGAGATVNAMFTDANTHCFTPTVTSAAGATSNFKITFAIVGAGCTEL
SSLYNQTITASPILGNNAQVITGWTFGGTLAANMGLAGAQ

*Syntrophorhabdus aromaticivorans*

SEQ ID NO: 28
FTLIELLIVIAIIGVLAAIAIPAYTGYTKKAKVGEIIHALGAIKSAVSVYYSEA
GATTDATTADLIRTTYGVDVPTGRASFQYTATSREIQATSKITGVTGTMTLT
GSTDFKTWTWDGTMDKAYIPKN

*Desulfatibacillum alkenivorans* PilA

SEQ ID NO: 29
FTLIELMIVIAIIGILAAIAIPNFVSYRKKAYNRTAQADLSSAYSTVMAYYAD
EKHKEIDNFTLDNLKDAGFKQTVGVAVTVTSVNFQDFELTARHSQGDIVY
TIDAAGARSHN

*Syntrophomonas zehnderi* PilA

SEQ ID NO: 30
FTLIEILVALFLAILVASSLVTVFQMSHHIFYRDFSRSELQYMARKAMEDIID
YVVQAQPDSLAVNGAEGSQLEFILSSGAKIQYSQGANYWLYRKGPDSGPP
QPIVEQIAKVKFCLSGPHILTVDVVAGNEKNSFTLTQMIVPRAEIDENDWLN
SL

*Syntrophaceticus schinkii* PilA

SEQ ID NO: 31
FTLVELMVVLLIIGILVAIAIPIYNKTQENAQKRACQSNLRTLDSAAAQYGA
ATGNYPTDPLNNANFVGENGYVKTKPTCPAGGVYNYDATNGKFSCNVPD
HVYP

*Tepidanaerobacter acetatoxydans* PilA

SEQ ID NO: 32
FTLIELILALGLLSLIMTTSFTIYSAGQKTYEYENSKIFVQQNARQAFLWLST
SIKQARSVEVMSENSIKTVAGDGETIIYYFKNGVLYREKNNGINPIAELSQL
KFKQPKDKQYIEIFLAAQGKEGDDIIIKTKATPFGLWVN

*Thermacetogenium phaeum* PilA

SEQ ID NO: 33
FTMIEMMVVLIIIAVLIAGGIRFYLGYVERAKVTKAKSEITTMQAALDSYYA
EKGEYPDDENDRELVKAGLATDRISISTEGNDSIQYIYEGGGNSYKIITTATF
RAGKLVGEGQDGKSTEPDFGSGE

The nanowires can also be edited protein nanowires, for example, nanowires derived from or mimicking naturally-occurring protein nanowires, which have been modified. For example, one or more amino acid groups can be deleted, inserted, or substituted with another amino acid group. Examples of modified nanowires, and methods of producing same, are described in United States Patent Application Publication No. US 2018/0371029 A1, the contents of which are incorporated herein by reference in their entirety. The nanowires may be functionalized to include surface exposed peptides (e.g., ligands). Examples of functionalized nanowires that include surface-exposed ligands, and methods of producing same, are described in Ueki T., et al., Decorating the Outer Surface of Microbially Produced Protein Nanowires with Peptides, *ACS Synth Biol.* 2019 Aug. 16; 8(8): 1809-1817, the contents of which are incorporated herein by reference in their entirety. The nanowires can be synthetically generated, for example by peptide self-assembly or by expression from a modified bacterium, such as *E. coli*. Example methods of producing protein nanowires in a modified bacterium are described in Ueki T., et al., An *Escherichia coli* Chassis for Production of Electrically Conductive Protein Nanowires, *ACS Synth Biol.* 2020 Mar. 20; 9(3):647-654, the contents of which are incorporated herein by reference in their entirety.

The nanowires can be conductive or non-conductive. Within a memristive device, the nanowires can function as a dielectric, but the nanowires may be capable of exhibiting electrical conductivity in some environments. Various types of pili and filaments, such as archaella, have been found to be conductive and can be suitable for inclusion in a memristive device. One example of electrically-conductive nanowires are the pili structures expressed by the bacterium *G. sulfurreducens*.

Figure 30:
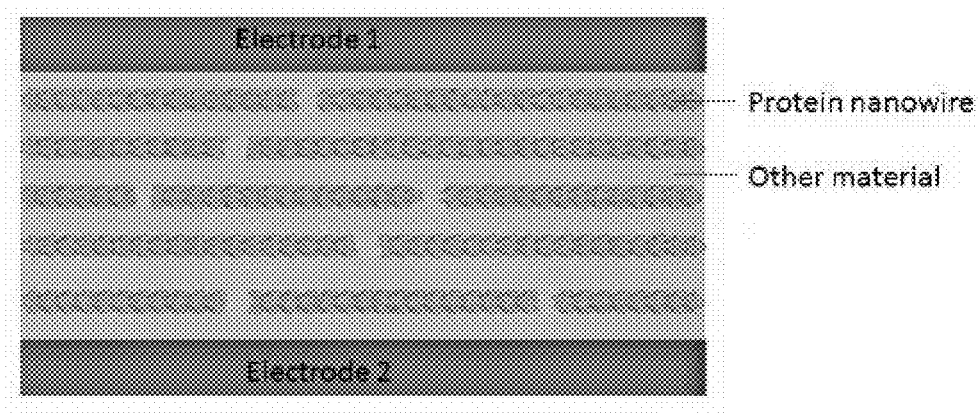
FIG. 30 is a schematic of a memristive device including a composite biomaterial.

The biomaterial can include a composite of protein nanowires and at least one other material. For example, the other material can be one that modifies a conductive property of the protein nanowires, confers structural support to the protein nanowires, or a combination thereof. An example of a composite biomaterial arranged with two electrodes of a memristive device is shown in FIG. 30. The composite biomaterial can include any combination of inorganic and organic elements, as well as other biomaterials. Examples of composite materials fabricated with protein nanowires are described in U.S. Patent Pub. No. 2020/0090830, the entire contents of which are incorporated herein.

The other material forming the composite can be inorganic. For example, the other material can be a conventional dielectric material (e.g., Si, SiOx, SiNx, HfO2, Al2O3, etc.), a two-dimensional material (e.g., graphene, graphene oxides, transition metal dichalcogenides (e.g., MoS2), boron nitride, etc.), or any combination thereof.

The other material forming the composite can be a biomaterial. For example, the other material can be a polysaccharide (e.g., chitosan, carrageenan, starch, etc.), a protein structure (e.g., silk, sericin, ferritin, gelatin, etc.), a nucleic acid structure (e.g., DNA, RNA), or any combination thereof.

The other material forming the composite can be organic. For example, the other material can be a polymer (e.g., polyvinyl alcohol, polyvinylpyrrolidone, poly(4-vinylphenol), parylene, PEDOT:PSS, etc.) or combination of polymers.

An operative arrangement of a biomaterial and electrodes can exhibit a memristive switching voltage within a biological range. For example, the switching voltage can be of about 20-150 mV, or of about 40-100 mV.

At least one of the electrodes within the memristive device can comprise a metal for which a biomaterial facilitates reduction in ionic form. For example, at least one of the electrodes can include Silver (Ag), Copper (Cu), Nickle (Ni), Chromium (Cr), Titanium (Ti), Tantalum (Ta), Aluminum (Al), Tungsten (W), or any combination thereof. In a particular example, a memristive device includes at least one silver (Ag) electrode and the biomaterial includes nanowires comprising pili structures expressed by the bacterium *G. sulfurreducens*. Other suitable combinations of electrodes and biomaterials are possible.

Figure 2A:
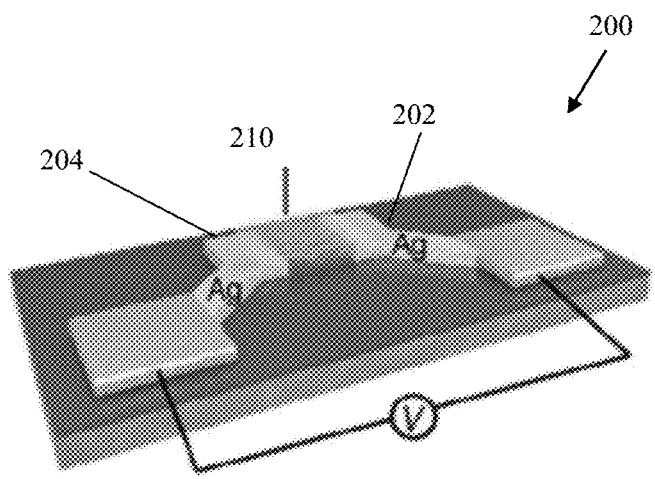
FIG. 2A is a schematic of a planar memristive device.
Figure 2B:
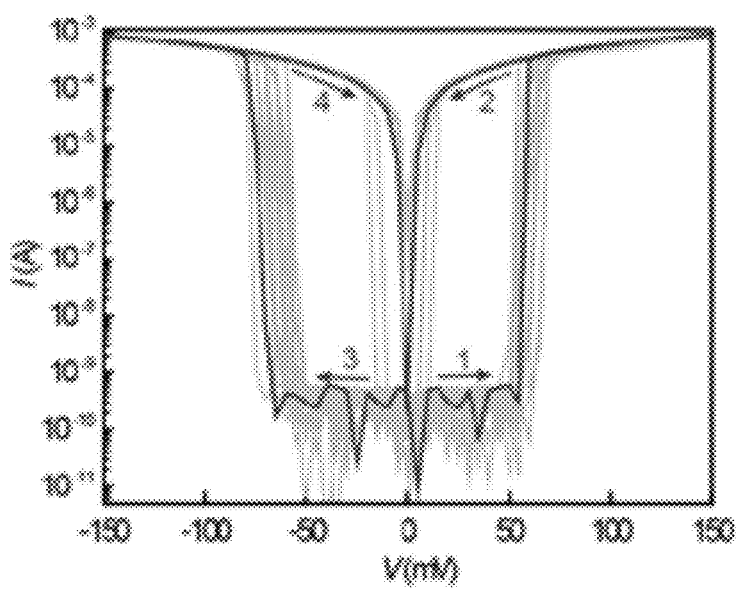
FIG. 2B is a graph of representative current-velocity (I-V) curves from a prototype memristive device. The bolded curves illustrate a complete sweep loop from 0 mV→150 mV→0 mV→150 mV→0 mV.
Figure 2C:
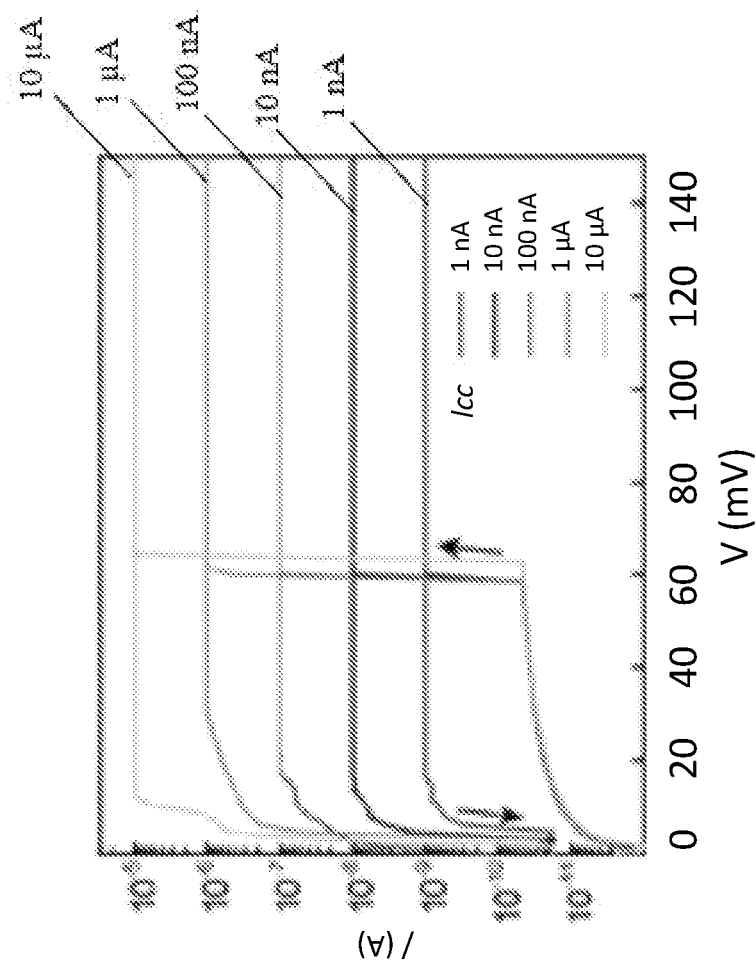
FIG. 2C is a graph of switching I-V curves from a device with the current compliance ($I_{CC}$) set from 10 μA to 1 nA.
Figure 2D:
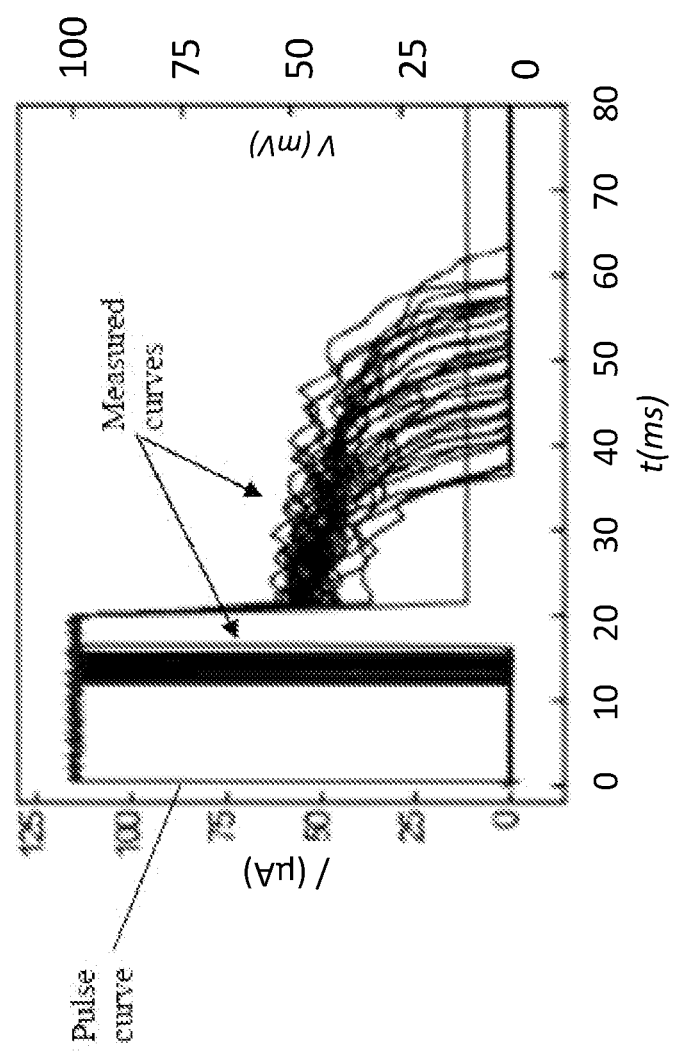
FIG. 2D is a graph illustrating pulsed measurements (N=32) in an example memristive device. Same pulses (100 mV, 20 ms; grey curve) were applied to the device with the current (black curves) measured. The conduction state in the device was continuously monitored after the pulse by using a 10 mV reading voltage.
Figure 2E:
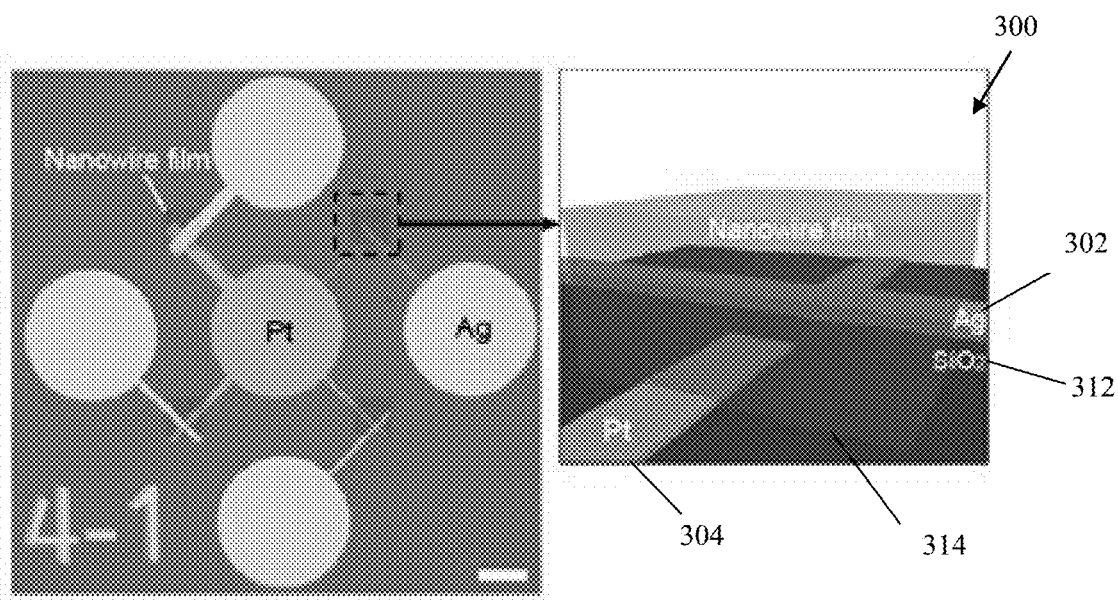
FIG. 2E is an image of four (4) vertical protein-nanowire devices with varying sizes of 20×20, 10×10, 5×5, and 2×2 μm². Scale bar 50 μm. The schematic shows the layered Ag—SiO$_2$—Pt (100-25-30 nm thick) device structure embedded in patterned protein-nanowire film (~500 nm thick).

A memristive device can include an arrangement of biomaterial and electrodes in any suitable structure, such as a planar structure or a vertical structure (e.g., FIGS. 2A and 2E and Examples). For example, the memristor can include a planar arrangement in which at least two electrodes are separated by a gap and the biomaterial is disposed within the gap. In another example, the memristor can include a vertical arrangement in which the electrodes are layered and separated by the biomaterial, or in which the electrodes are layered and separated by an insulating layer with the biomaterial at least partially surrounding the layered electrodes. Example configurations of memristive devices are further described in the Exemplification section herein.

The biomaterial can be provided in the device as a film. For example, a monolayer of protein nanowires can be provided, which can provide for a film thickness of about 2 nm. The protein nanowires can be provided in a film having a thickness and/or length of about 2 nm to about 500 nm or of about 2 nm to about 100 nm (e.g., 1.5 nm, 2 nm, 5 nm, 10 nm, 50 nm, 100 nm, 200 nm, 300 nm, 400 nm, 500 nm, and 510 nm). Example preparations of protein nanowires are provided in the appended manuscript.

Memristive devices can provide for artificial neurons and artificial synapses, as further described in the examples below. For example, the electrodes of the memristive device can be configured to apply a pulsed voltage to mimic an action-potential input to a biological neuron. A frequency pattern of the pulsed voltage can be one that represents, for example, an integrate-and-fire event or a synaptic event. Example synaptic events include those that exhibit a plasticity feature, such as paired-pulse facilitation or paired-pulse depression.

As noted above, the ability to register accumulative stimuli (e.g., charge flux) by a state variable (e.g., conductance) enables typical memristors to mimic neuromorphic behaviors that are inherently history-dependent. With diffusive memristors, a process of conductance decay can effectively produce an 'internal clock' to encode relative temporal information, leading to functional emulations in short-memory synapses, artificial neurons, and capacitive neural networks. However, the switching voltages (0.2-2 V) required for such memristors are higher than the amplitude of 50-120 mV in biological counterparts.

Power consumption typically scales quadratically with signal amplitude, and thus functional emulation with memristors has yet to attain the low power requirements of biosystems. A field-driven mechanism in many filamentary memristors means that device scaling may not necessarily reduce the switching voltage, and hence the power demands for high-density applications. On the other hand, the functional similarity of memristors to biological systems may facilitate electronic-biological interfaces. However, the functional similarity without parameter matching still requires additional circuitry for interfacing, adding costs to the vision of a seamless integration. Therefore, neuromorphic devices functioning at biological voltages (bio-voltage, e.g., ≤100 mV) may not only lower the power requirements, but also enable communicative electronic-biological interfaces.

Figure 1A:
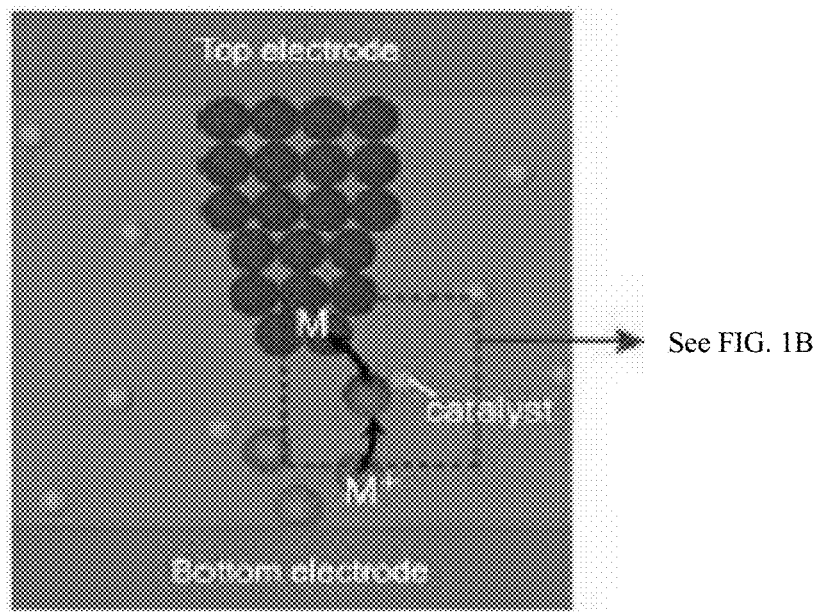
FIG. 1A is a schematic an introduced catalyst in a memristive device, alternatively referred to as a memristor, that facilitates the cathodic reduction by bringing down reduction overpotential ($\Delta E$), as illustrated in FIG. 1B, which can lead to a decrease in switching voltage ($\Delta V_{th}$), as illustrated in FIG. 1C.
Figure 1B:
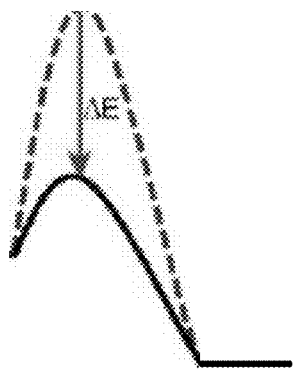
FIG. 1B is a graph illustrating a reduction overpotential ($\Delta E$).
Figure 1C:
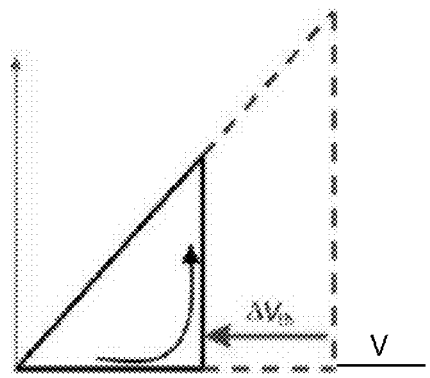
FIG. 1C is a graph illustrating a decrease in a switching voltage ($\Delta V_{th}$).

Memristive switching can involve an electrochemical process associated with an ionic/valence state change in the dielectric layer. For example, a three-step process of anodic oxidization (M→M$^+$+e), M$^+$ migration, and cathodic reduction (M$^+$+e→M) is typically involved in the switching dynamics in metallization memristors. The active metals (M) involved are generally readily oxidized to ions in the ambient environment, and ion migration is usually not a threshold event. A catalyst that can lower the reduction overpotential (FIG. 1A) can reduce the switching voltage in memristors (FIGS. 1B-1C) as cathodic reduction can be a major factor affecting switching voltage.

Figure 1D:
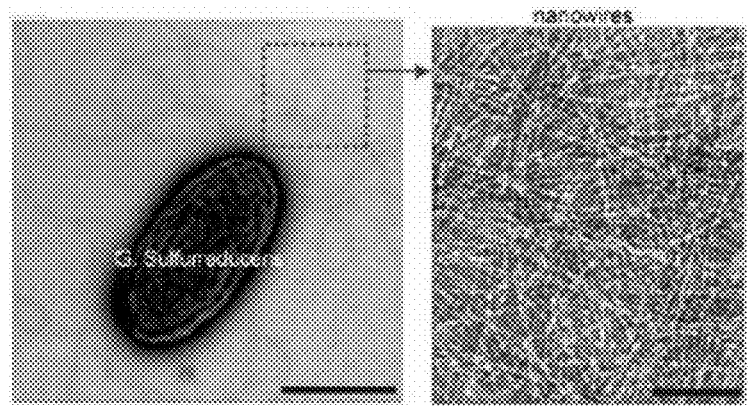
FIG. 1D is a Transmission Electron Microscopy (TEM) image of a *G. sulfurreducens* bacterium and purified protein nanowires (right) harvested from *G. sulfurreducens*. Scale bars, 1 μm (left) and 100 nm (right).
Figure 1E:
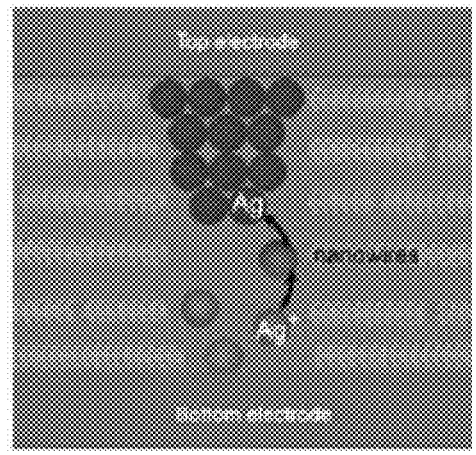
FIG. 1E is a schematic of protein nanowires in a memristive device that facilitate the cathodic reduction of $Ag^+$ for bio-voltage switching.

The protein nanowires of the bacterium *G. sulfurreducens* (FIG. 1D) are able to facilitate metal reduction and they may facilitate Ag$^+$ reduction. Protein nanowires may be able to catalyze bio-voltage memristors (FIG. 1E). Ag memristors were constructed with protein nanowires harvested from *G.*

*sulfurreducens* and tested, as described in the examples below, establishing that the nanowires facilitate the memristive switching.

As further shown in the below examples, a low voltage of the devices can be attributed to the protein nanowires which facilitate cathodic Ag$^+$ reduction. Based on this, neuromorphic components such as artificial neuron and synapse functioning at biological action potential were realized. The artificial neuron achieved the temporal integration similar to the frequency response in biological neurons. The biovoltage operation substantially reduced the energy cost in constructed neuromorphic components (FIGS. 22A-28F). The protein nanowires are stable under harsh chemical and temperature conditions, providing broad options for the incorporation in electronic devices.

EXEMPLIFICATION

Example 1—Device Structures and Characterizations

Two memristor device configurations were fabricated with protein nanowires and were studied. The first device, also referred to as a "planar" device or memristor was comprised of a pair of Ag electrodes (~200 nm spacing) on an insulating (SiO$_2$/Si) substrate. A schematic of an example planar memristive device 200 is shown in FIG. 2A with electrodes 202, 204 forming a gap 210 (e.g., a nanogap) within which a thin-film of biomaterial is disposed.

Figure 7A:
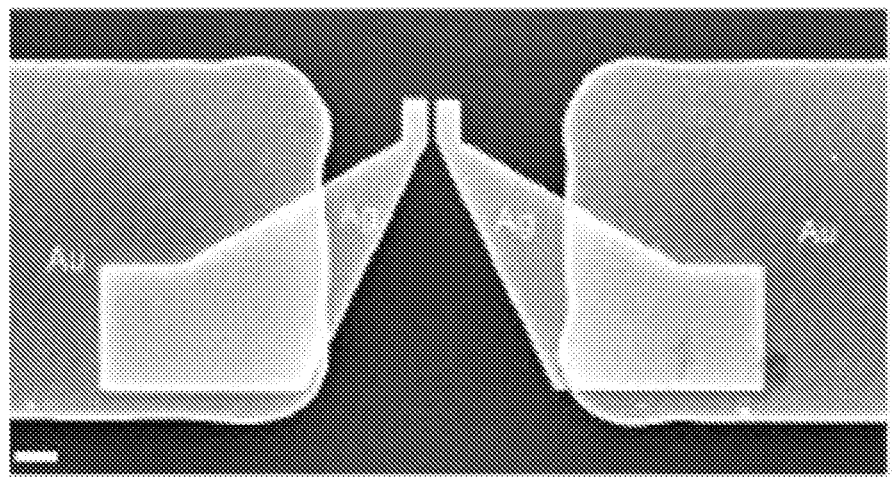
FIG. 7A is a Scanning Electron Microscopy (SEM) image of an example, as-made nanowire device, similar to schematic of FIG. 2A, and showing a protein-nanowire thin film sandwiched in a nanogap defined by a pair of Ag electrodes that further connect to Au contacts (for probe access). Scale bar, 1 μm
Figure 7B:
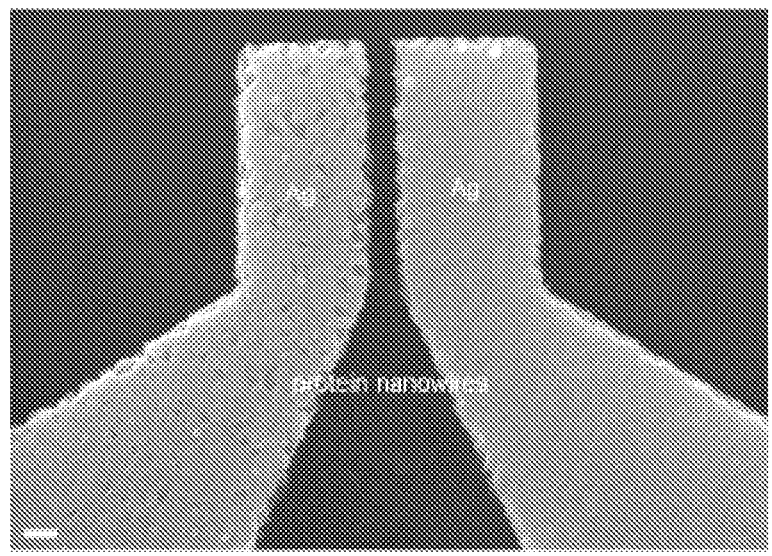
FIG. 7B is an SEM image of the nanogap region of the device shown in FIG. 7A. Note that nanowire film is less visible under SEM. Scale bar, 100 nm.
Figures 7C, 7D:
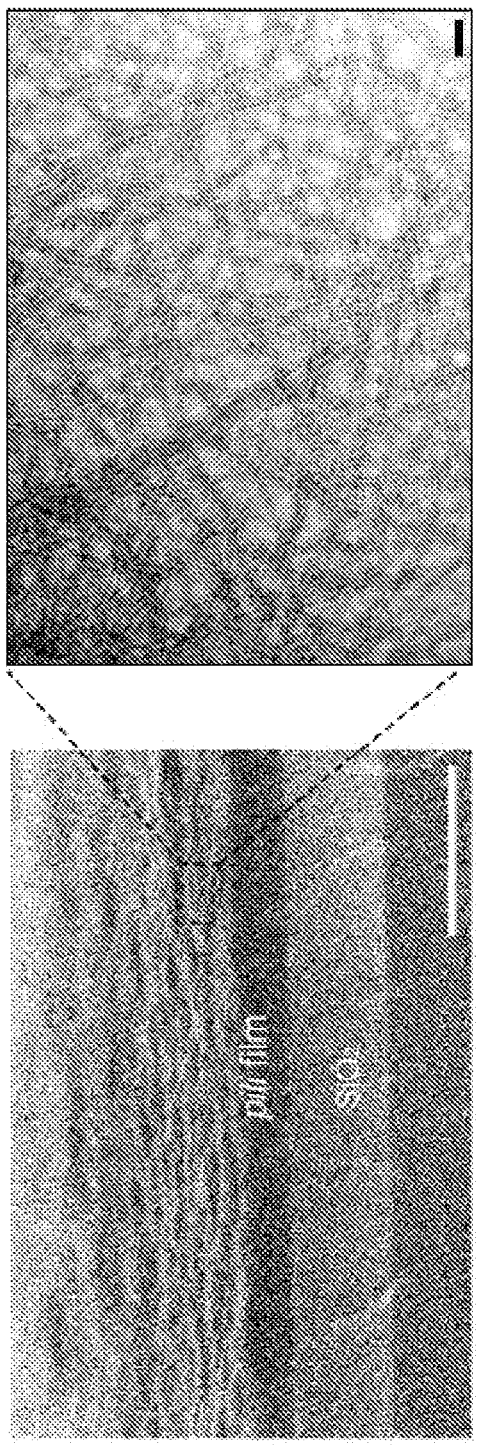
FIG. 7C is an SEM image with a cross-section view of a nanowire film prepared by a dropcasting procedure. Scale bar, 1 μm.
FIG. 7D is a Transmission Electron Microscopy (TEM) image of a few nanowire layers of the film shown in FIG. 7C. Scale bar, 100 nm.
Figure 8A:
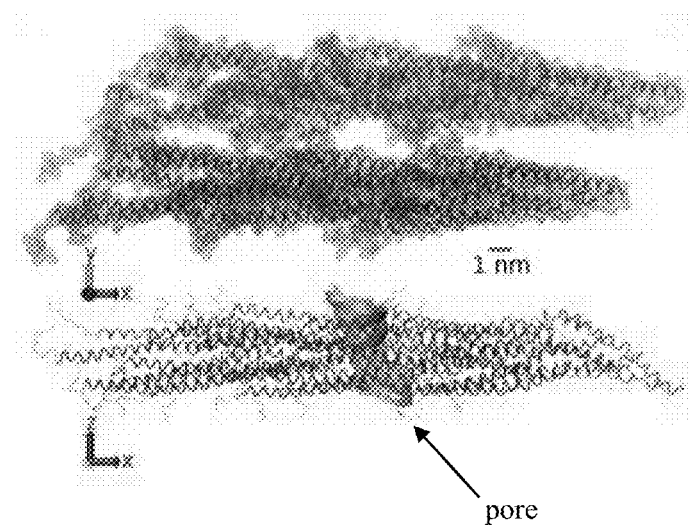
FIG. 8A is a representation of a pili-pili interface and the water-permeable pore (green) from molecular modelling.
Figure 8B:
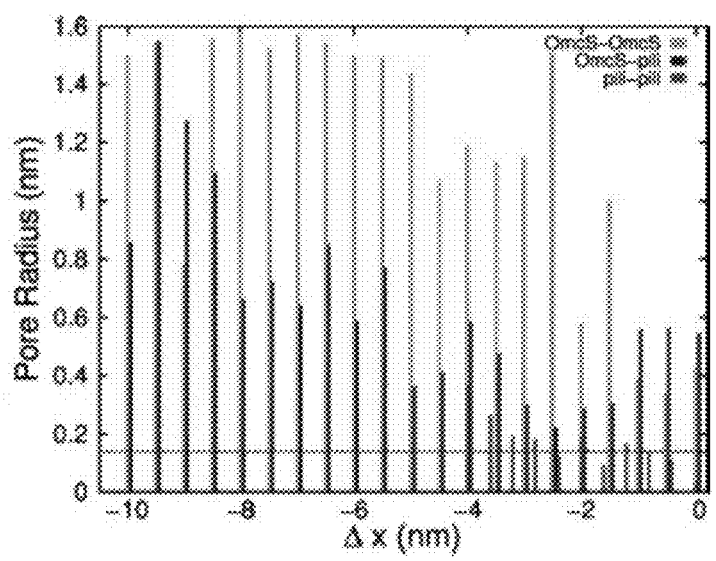
FIG. 8B is a graph of pore radius at each shift distance (Δx) along x-axis for the most stable packing conformation in OmcS-OmcS (green), OmcS-pili (blue), and pili-pili nanowire interfaces (red). The black dashed line indicates the radius of water molecule.
Figure 9:
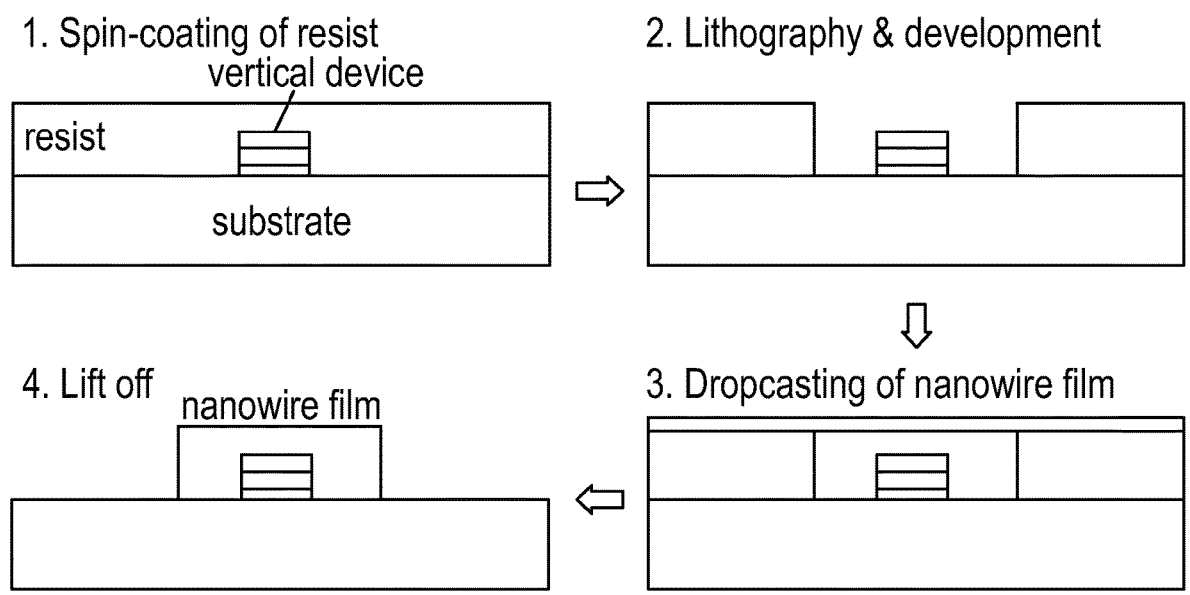
FIG. 9 is a schematic illustrating a process of patterning nanowire film using lithography and lift-off.
Figure 10:
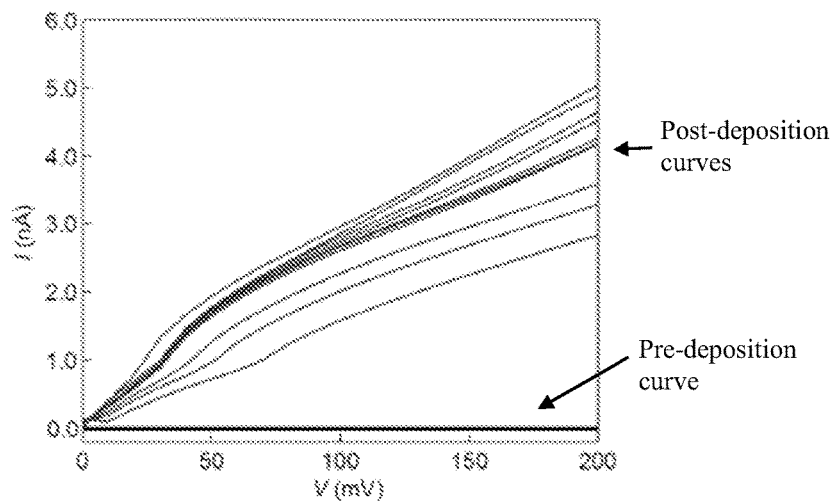
FIG. 10 is a graph illustrating initial conduction in a protein-nanowire planar device. Before deposition of nanowire film in the planar Ag—Ag nanogap (~200 nm), the device showed no conduction (black curve). The nanowire film (500 nm thick) was then formed by dropcasting. Low conductance was observed in the nanowire films (N=5, grey curves). The estimated conductivity was ~80 μS/cm which was consistent to previous values measured from wild-type protein nanowires prepared in basic solution. 7

A thin (~500 nm) layer of protein nanowires was deposited in the nanogap (FIG. 2A; FIGS. 7A-7B, see also Example 7, Methods). Scanning electron microscope (SEM) and transmission electron microscope (TEM) images revealed that the nanowires were densely packed in the film (FIGS. 7C-7D). Molecular dynamics simulations (FIGS. 8A-8B) indicated that the inter-wire spacing is at subnanometer scale, which is similar to that of the grain boundary in inorganic dielectrics. As a result, the nanowire film behaved like a dielectric and was demonstrated to be compatible with lithographic patterning (FIG. 9). The conductivity of the protein nanowires depends on the pH at which the nanowires are prepared. Protein nanowires of relatively low conductivity were used (FIG. 10), which acted like a dielectric employed in electrochemical metallization memristors.

Figure 11:
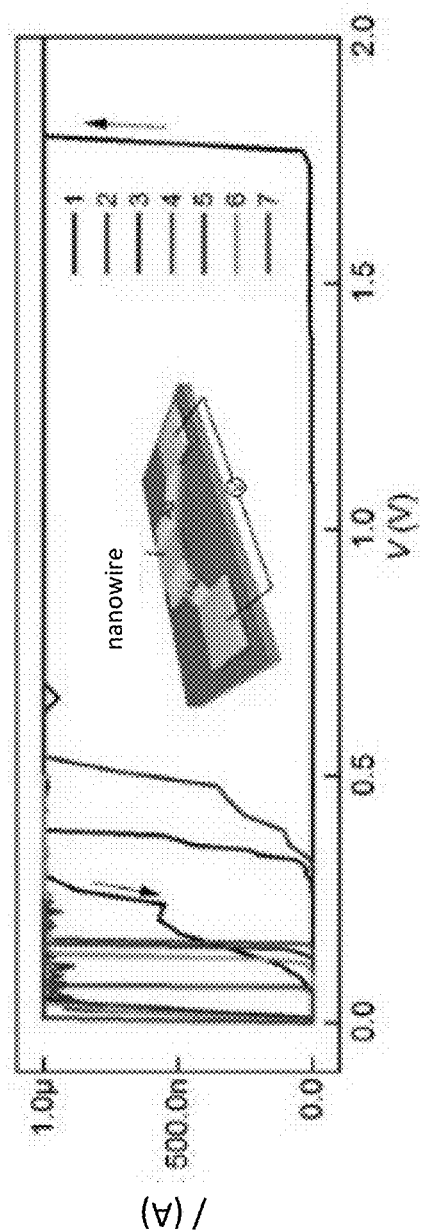
FIG. 11 is a graph illustrating voltage sweeps of an electroforming process for a planar device, as shown in the inset, with a gap size of ~200 nm. The looped voltage sweep was initially up to 2.0 V, during which a sudden conductance jump was observed (black arrow). The voltage in the following sweeps was gradually reduced, within which the sudden conductance jump still maintained with its threshold voltage gradually reducing until stable switching was established (red curve). The numbers indicate the sweep order.
Figure 12A:
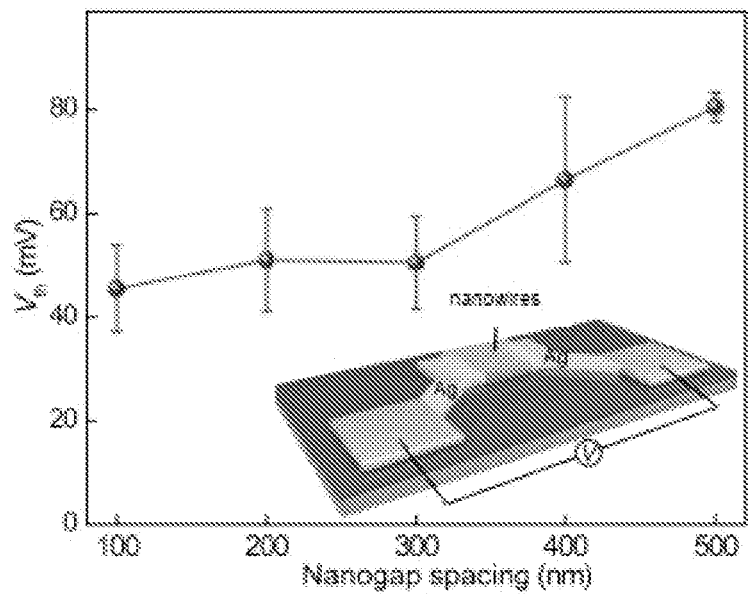
FIG. 12A is a graph of average turn-on threshold voltage ($V_{th}$) with respect to the nanogap spacing in protein-nanowire memristors. A total number of 60 devices, with 12 for each spacing, were studied. The average $V_{th}$ maintained a value between 40-80 mV. $V_{th}$ is also largely independent of the nanogap size, which is consistent to a filamentary switching mechanism in which the confined switching point generally is independent of the filament length. The inset shows the schematic of the memristive device, with the protein nanowires filled in the nanogap defined by a pair of Ag electrodes.
Figure 12B:
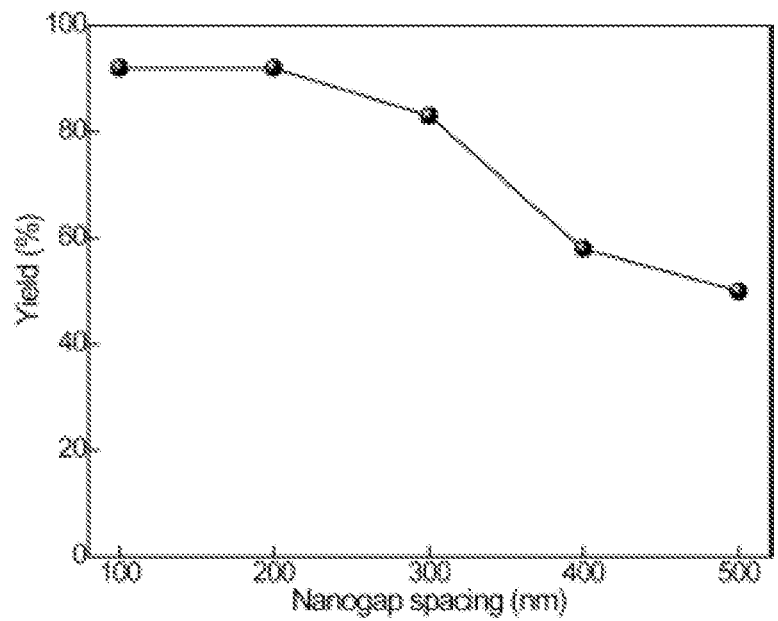
FIG. 12B is a graph of device yield with respect to the nanogap spacing. All the measurements were performed in an ambient environment with RH ~40%.

After electroforming (FIG. 11), the device formed stable unipolar switching in the ambient environment (FIG. 2B). In a representative sweep loop (black curves), the device transitioned to a low-resistance state (LRS) at 60±4 mV (±s.d.), which spontaneously relaxed to a high-resistance state (HRS) at close-to-zero bias. The following sweep in the negative bias showed symmetric behavior, with the turn-on voltage at −65±5 mV (±s.d.). Statistics of over 60 planar devices having different electrode spacing (e.g., 100-500 nm, each set 12 devices) revealed a consistent distribution of average turn-on voltage between 45-80 mV (FIGS. 12A-12B). This is at least 3-fold lower than the lowest values in previously described diffusive memristors, and is in the range of biological action potentials.

Figure 13:
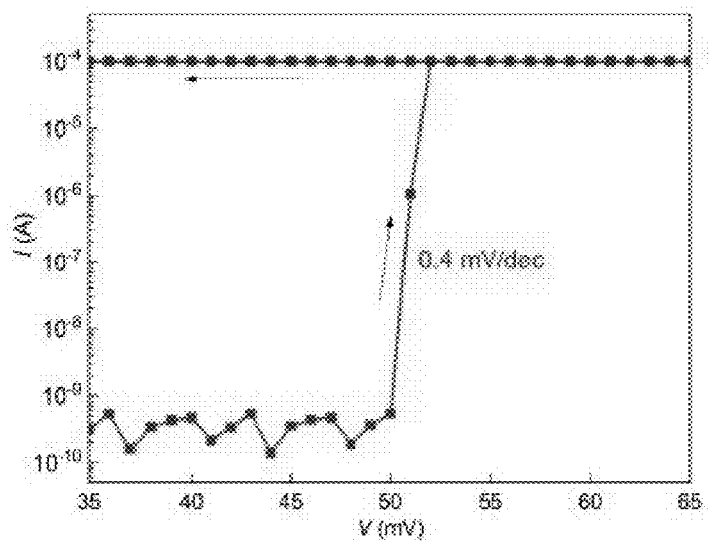
FIG. 13 is a graph illustrating a turn-on curve from an example planar protein-nanowire memristor, showing a steep slope of 0.4 mV/dec.

The large On-Off ratio (e.g., ~10$^6$) in the device, for a reduced switching window, led to a sharp turn-on slope ~0.4 mV/dec (FIG. 13), which is the sharpest demonstrated to date. The switching voltage was largely independent of programming current, which maintained at ~60 mV with current compliance ($I_{cc}$) reduced to 1 nA (FIG. 2C), indicating a field-dominant mechanism. The $I_{cc}$ was among the lowest in memristors, which, due to further reduced programming voltage, indicates the potential for low-power operation. The volatile switching was further elucidated with pulse measurements (FIG. 2D), during which fixed voltage pulses (100 mV) yielded stochastic incubation delay ($\tau_d$=13±1 ms, s.d.) and relaxation ($\tau_r$=29±7 ms, s.d.). $\tau_d$ and $\tau_r$ are close to time scale in biological responses such as synaptic Ca$^{2+}$ rise and decay; longer pulses yielded longer relaxation (FIGS. 14A-14B), indicating the evolving dynamics in conduction that is desirable for biological emulations.

Vertical device configuration, which may be preferable for device integration, was also examined. The top (Ag) and bottom (Pt) electrodes were separated by a 25 nm-thick SiO$_2$ layer, which was further embedded in the protein-nanowire film (FIG. 2E; see also Example 7, Methods). A schematic of an example vertical memrisitive device 300 is shown in FIG. 2E in which electrodes 302, 304 are layered and separated by an insulating layer 312. Alternatively, the electrodes 302, 304 can be separated by the biomaterial. The layered electrodes are disposed within a nanowire film 314.

Figure 2F:
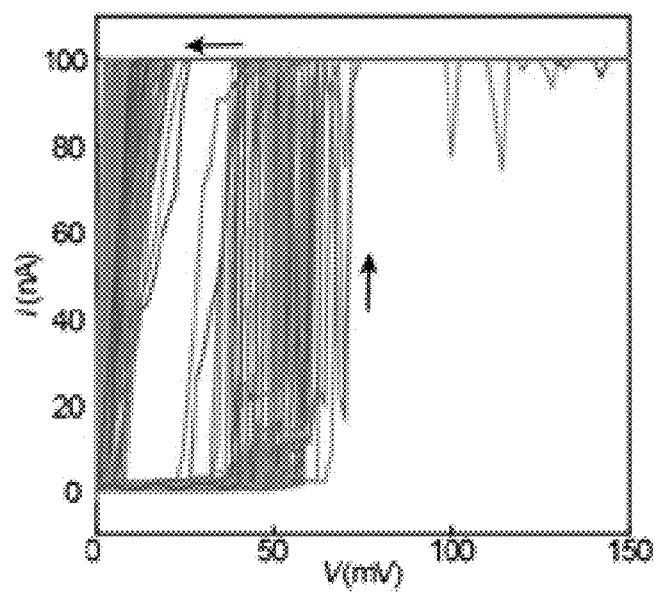
FIG. 2F is a graph of continuous 800 I-V sweeps in a vertical protein-nanowire device. There measurements were done in an ambient environment with Relative Humidity (RH) of ~35%.
Figure 2G:
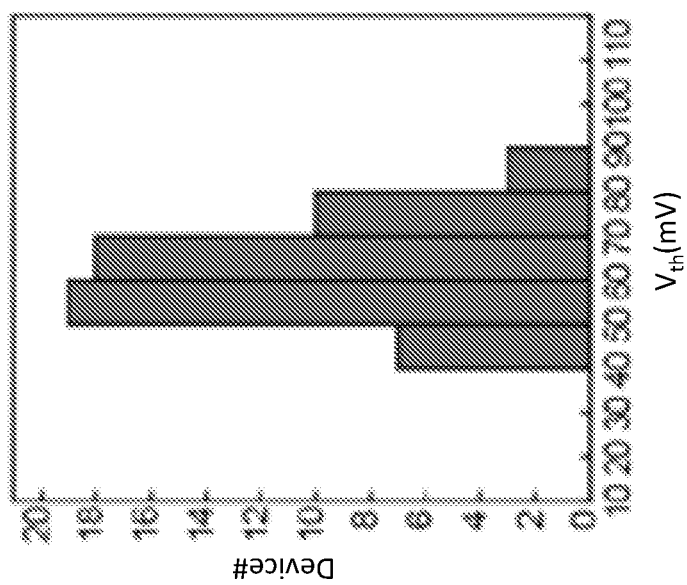
FIG. 2G is a graph of statistical results of turn-on voltages from 57 vertical devices, with an average value of 58±10 mV (±s.d.).
Figure 2H:
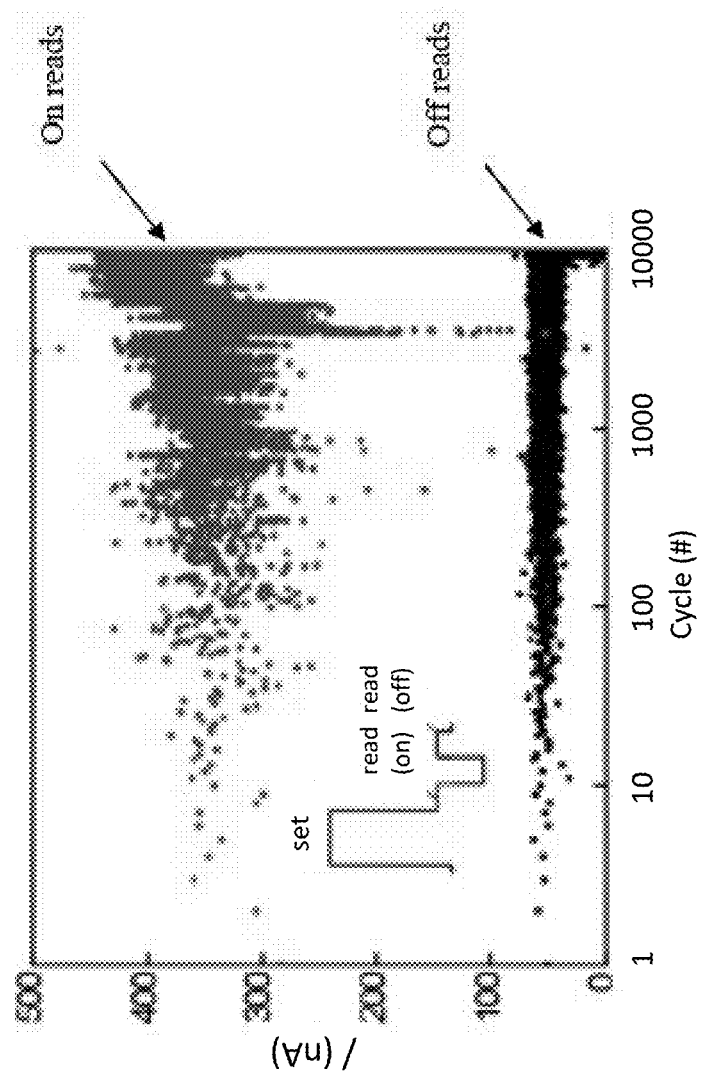
FIG. 2H is a plot of results of 104 cycles from a vertical device. Each cycle involved a pulse wave form (inset) consisting of a programming (set) pulse (100 mV, 40 ms), a read pulse (10 mV, 19 ms) of the On current, a reset pulse (−50 mV, 20 ms) to facilitate the relaxation, and a read pulse (10 mV, 19 ms) of the Off current. Current compliance was applied to the On read current with a load resistor. The Off read current was at the instrument noise level (<100 nA) for the measurement range used.
Figure 15A:
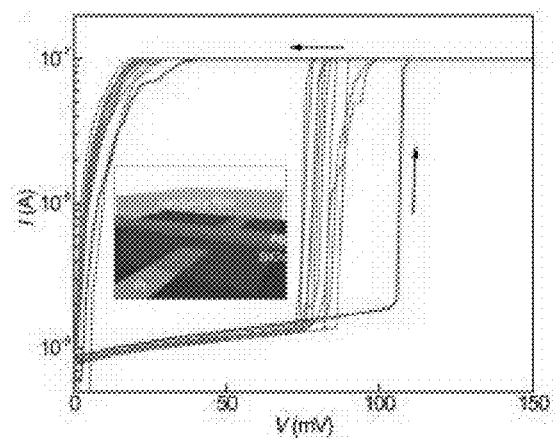
FIG. 15A is a graph illustrating voltage sweeps of an electroforming process (black curve) followed by switching I-Vs (gray curves) in a vertical device (size ~2×2 μm²) at RH-35% for a vertical protein-nanowire memristor.
Figure 15B:
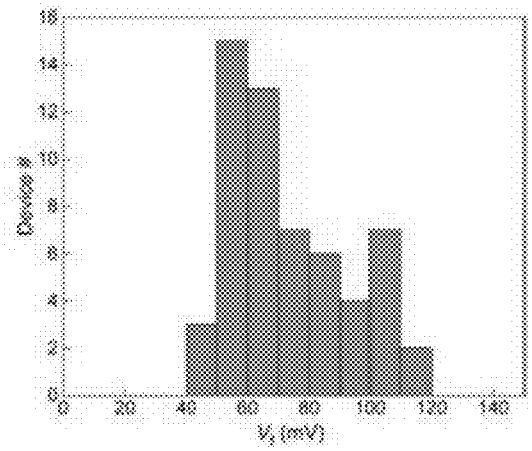
FIG. 15B is a graph of statistical results of the forming voltages ($V_f$) from 57 devices, showing an average value of 70±19 mV.
Figure 16A:
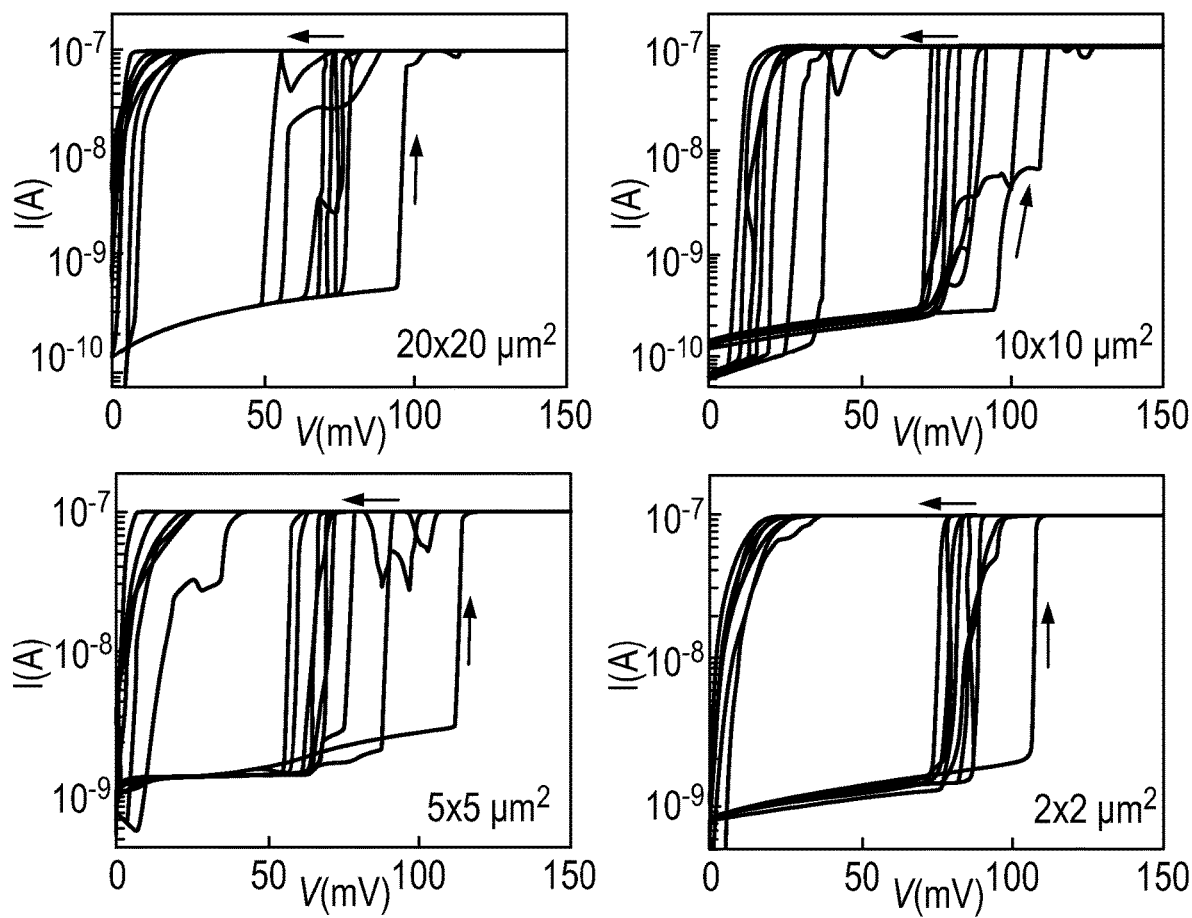
FIG. 16A is a graph illustrating device scaling in vertical protein-nanowire memristors. Representative electroforming process (black curve) followed by 10 consecutive switching I-Vs (gray curves) in vertical devices of different sizes (20×20, 10×10, 5×5, 2×2 μm2).
Figure 16B:
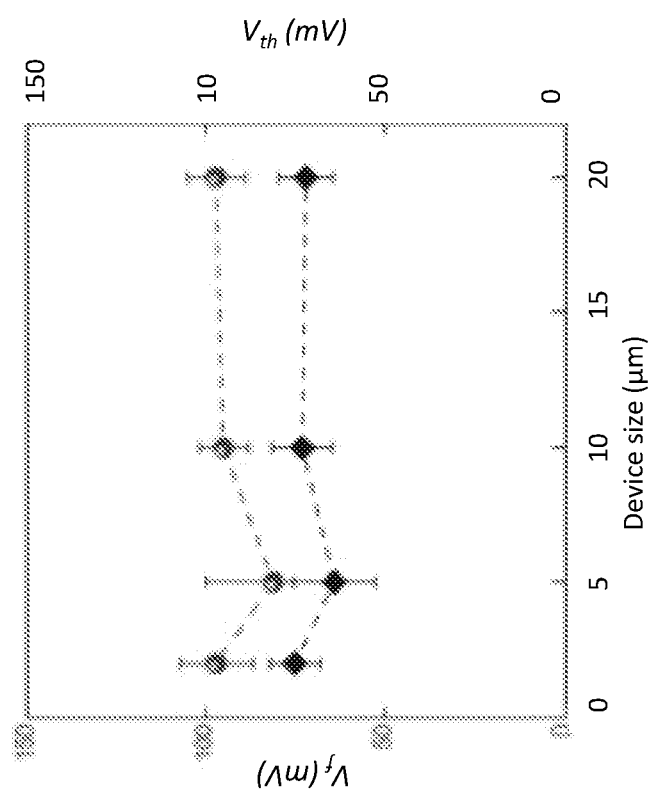
FIG. 16B is a graph of statistical results of the forming voltages ($V_f$, dot curve) and turn-on voltages ($V_{th}$, diamond curve) with respect to device sizes (N=5 for each size). The electrical characterizations were performed at RH~35%.
Figure 17A:
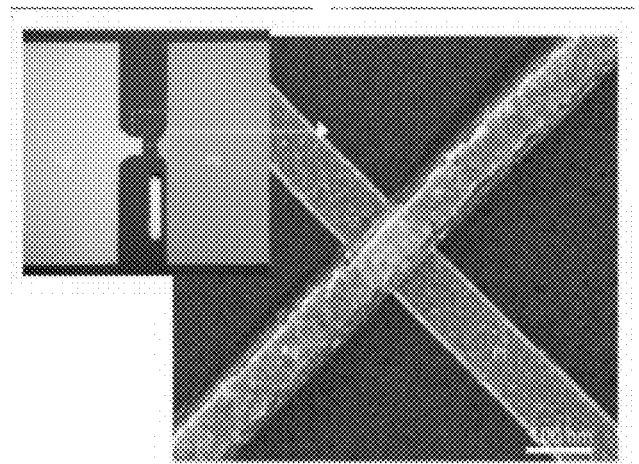
FIG. 17A is an optical and SEM image of a vertical Ag—SiO$_2$-Pt structure in a 100×100 nm2 vertical protein-nanowire device.
Figure 17B:
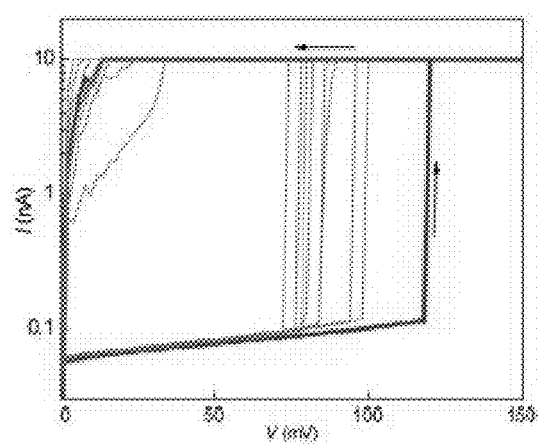
FIG. 17B is a graph illustrating voltage sweeps of the electroforming process (black curve) followed by switching I-Vs (grey curves) in the device of FIG. 17A (ambient RH ~35%).

The vertical device is topologically the same as a planar one, as the exposed SiO$_2$ vertical edge defines a vertical insulating substrate. An edged device structure was employed previously in both device characterization and crossbar integration. As the electroforming is typically field-driven, a closer electrode spacing in the vertical device resulted in almost forming-free switching (FIG. 15A). The average forming voltage ~70±19 mV (±s.d.) (FIG. 15B) was even smaller than the switching voltages in previous memristors. The formed device showed a narrow distribution of turn-on voltages at ~55 mV (FIG. 2F). Statistics of 60 vertical devices showed a high yield of ~95% (⁵⁷/₆₀). The turn-on voltages were 40-80 mV (FIG. 2G), which is consistent with results from planar devices (FIGS. 12A-12B). The device was repeatedly programmed (with 100-mV pulses) for at least 10$^4$ cycles (FIG. 2H), showing robust endurance over typical organic or soft-material memristors. The vertical structure also enabled investigations into device scaling. The devices showed similar switching behaviors when the size was reduced from 20×20 μm$^2$ to 2×2 μm$^2$ (FIGS. 16A-16B), indicating a localized filamentary switching nature. Similar switching was obtained in devices with sizes as small as ~100×100 nm$^2$ (FIGS. 17A-17B), demonstrating the potential in device scaling for high-density integration.

Example 2. Mechanistic Investigations

Figure 18:
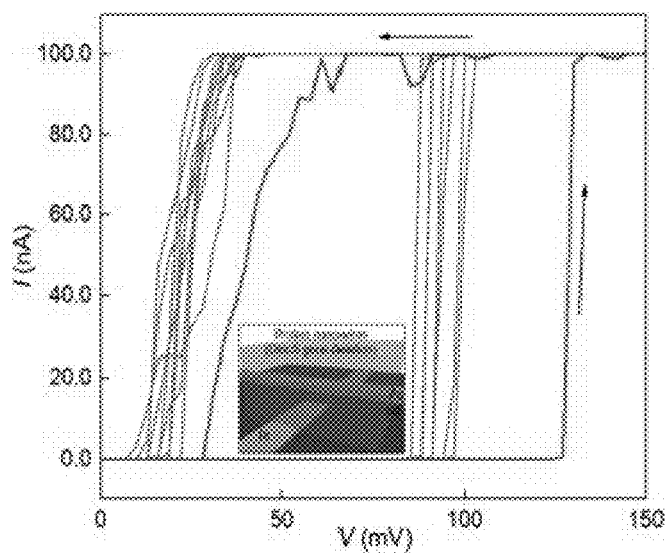
FIG. 18 is a graph illustrating voltage sweeps of the electroforming process (black curve) and memristive switching (gray curves) of a vertical device fabricated with protein nanowires harvested from a strain of *G. sulfurreducens* in which the gene for OmcS was deleted.

Two types of protein nanowires can be recovered from *G. sulfurreducens*, protein wires that assemble from the pilin monomer PilA and wires that assemble from the c-type cytochrome OmcS. The relative abundance of each type of wires depends upon the conditions under which the cells are grown. The protein nanowires in our preparations had an average diameter of 2.9±0.35 nm (±s.d.), which is consistent with the 3 nm diameter of pilin-based nanowires and inconsistent with the 4 nm diameter of protein nanowires comprised of OmcS. Furthermore, devices constructed with protein nanowires harvested from a strain of *G. sulfurreducens* in which the gene for OmcS was deleted yielded similar results (FIG. 18). Specifically, to clarify whether OmcS-based nanowire filaments are a contributing factor in observed memristive switching (FIGS. 2A-2F), protein nanowires were harvested from a strain of *G. sulfurreducens* with the gene for OmcS deleted and used to construct vertical device (inset) similar to that in FIG. 2E. The device showed forming (black curve) and memristive switching (gray curves) similar to ones made with wild type protein nanowires (FIGS. 16A-16B), indicating that OmcS is not a contributing factor in observed phenomenon. These results suggested that pilin-based protein nanowires were the important functional components.

Note that, for SEM imaging, few-layer nanowires were chosen for electron transparency. Consequently, the nanowire density revealed was not a close representation of the nanowire packing density in the actual film (~500 nm thick) used in the memristors. As was revealed by cross-section SEM image in FIG. 2C, the protein nanowires assumed a dense packing configuration in the thin film. The tight nanowire-nanowire interface, revealed by molecular dynamics simulations (FIGS. 8A-8B), acted more like the grain boundary in inorganic dielectrics. As a result, the nanowire film behaved like a biological dielectric that allowed for standard lithographic patterning (FIG. 9), as opposed to loose "nanowire mesh."

Figure 3A:
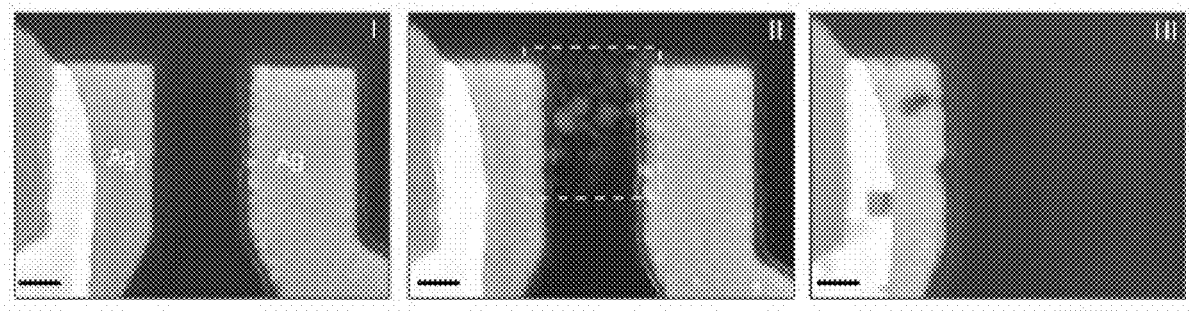
FIG. 3A is a Scanning Electron Microscope (SEM) image of a prototype protein-nanowire device before electroforming (I), after electroforming (II), and after removal of the protein nanowires with ultrasonication (III). Scale bars, 100 nm.
Figure 19:
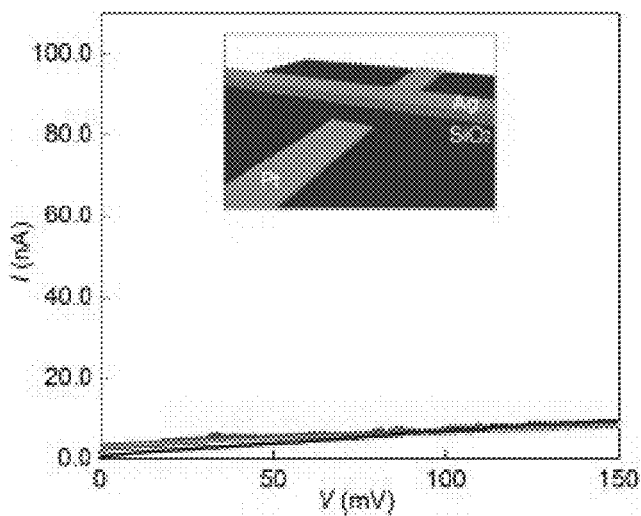
FIG. 19 is a graph illustrating electroforming results of vertical Ag—SiO2-Pt devices treated with ethanolamine. None of the devices showed any switching behaviors (color curves) following typical electroforming steps.
Figure 20A:
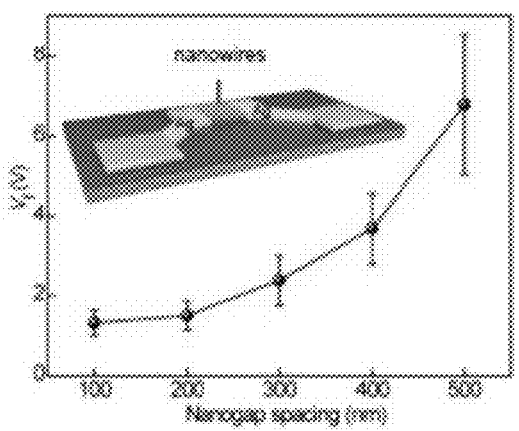
FIG. 20A is a graph of average forming voltage ($V_f$) in protein-nanowire devices with respect to the nanogap spacing. The data were from the same 60 devices of FIGS. 12A and 12B. A general trend of increasing $V_f$ with increasing nanogap spacing was observed, consistent with the field-driven mechanism involved in typical soft breakdown.
Figures 20B, 20C:
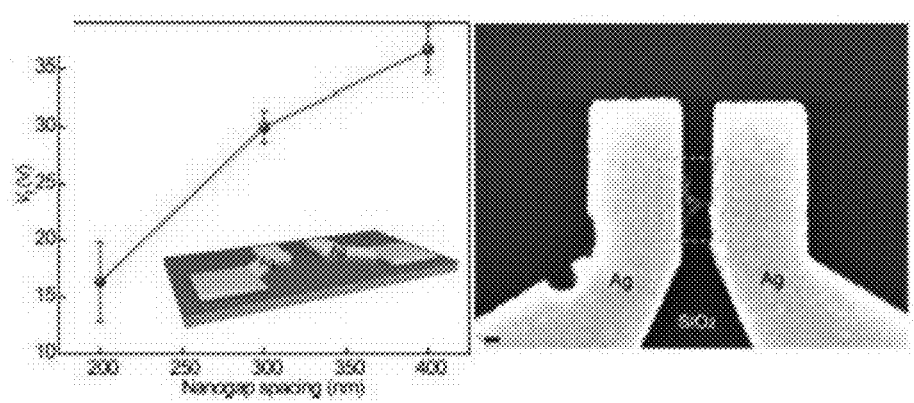
FIG. 20B is a graph of average forming voltage ($V_f$) in a bare pair of Ag electrodes (without protein nanowires) with respect to nanogap spacing. No stable switching was observed at low bias (e.g., <200 mV) afterwards.
FIG. 20C is an SEM image showing Ag migration (dashed area) in SiO$_2$ substrate between a bare pair of Ag electrodes during an electroforming attempt. Scale bar, 100 nm.
Figure 21:
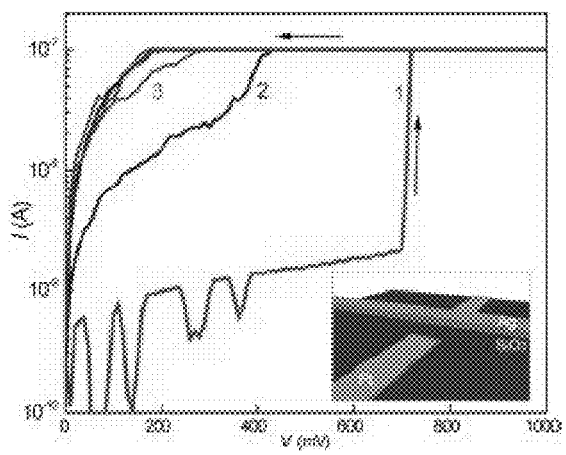
FIG. 21 is a graph of voltage sweeps of attempted electroforming and switching in bare Ag—SiO$_2$-Pt devices. The devices tested (N=6) had all the same structure parameters, but did not have protein nanowires (as shown in the inset schematic). The testing was carried out in an ambient condition (RH~35%). The I-V curves from a representative device show an initial forming voltage ~700 mV (red curve), but failed to form reliable switching at smaller bias (e.g., <200 mV). The remaining 5 devices showed similar forming voltages of ~600, 550, 450, 550, and 600 mV, but also failed to yield stable low-voltage switching.
Figure 22A:
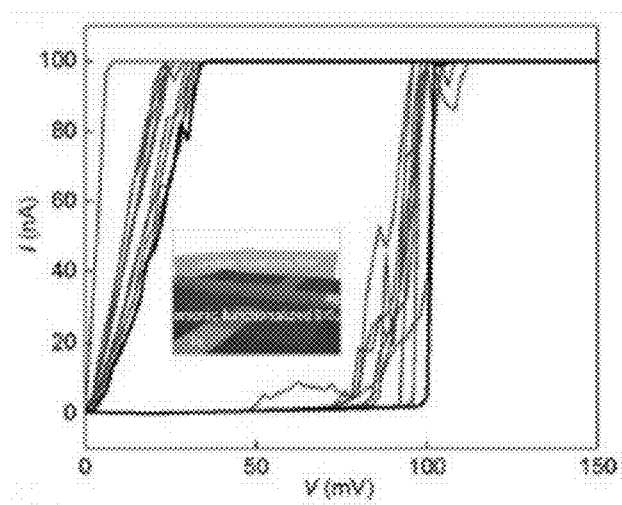
FIG. 22A is a graph illustrating I-V curves of an example device in which an anionic (α-NH2, ω-COOH-terminated polyethylene glycol)) surfactant was used to change the surface charge state and hence surface potential in SiO$_2$ before depositing protein nanowires.
Figure 22B:
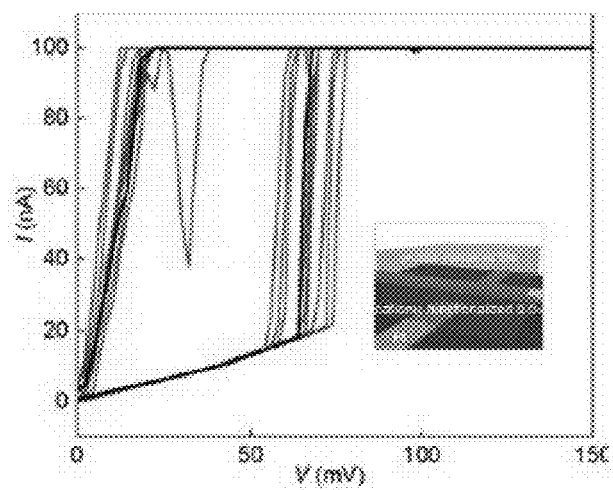
FIG. 22B is a graph illustrating I-V curves of an example device in which a cationic (ω-Amino-terminated poly(ethylene glycol) methyl ether) surfactant was used to change the surface charge state and hence surface potential in SiO$_2$ before depositing protein nanowires. Both of the devices (FIGS. 22A and 22B) showed similar bio-voltage switching. The black curves were the initial forming curves. Surface functionalization alone (without protein nanowire) could not yield bio-voltage memristive switching.

The protein nanowires were found to provide for the bio-voltage switching. First, the possible contribution from chemical residue in the protein-nanowire solution was excluded (FIG. 19). Second, the protein nanowires helped to reduce the electroforming voltage substantially (e.g., <2 V; FIG. 20A), compared to that of a pair of bare Ag electrodes on SiO$_2$ (e.g., >15 V; FIGS. 20B-20C) in planar devices. Similarly, vertical devices without protein nanowires could not yield low-voltage forming or switching (FIG. 21). Although surface defects introduced by material deposition can facilitate electroforming, such a large reduction indicates that the conduction channel may be built up entirely in the protein nanowire film. A device with a larger electrode spacing (~500 nm) was used to facilitate observation of the conduction channel (FIG. 3A, I). After electroforming, Ag nanoparticles were distributed between the electrodes (FIG. 3A, II). This observation is consistent with the general proposed mechanism for Ag-based memristors in which Ag nanoparticles are the signature of anodic Ag$^+$ migration and metallization to form the conductive filaments. In particular, the spherical configuration of the particles helps to lower the interfacial energy, which is considered to be responsible for the spontaneous filament rupture in a diffusive memristor. When the protein nanowire film was removed with ultrasonication in water, a clean SiO$_2$ substrate without Ag nanoparticles was observed (FIG. 3A, III). These results confirmed that the conduction channel or Ag filament was built up entirely in the protein nanowire film. Control studies indicated that neither the SiO$_2$ surface property (FIGS. 22A-22B) nor the percolation material structure (FIGS. 23A-23B) contributed to the bio-voltage switching.

Figure 23A:
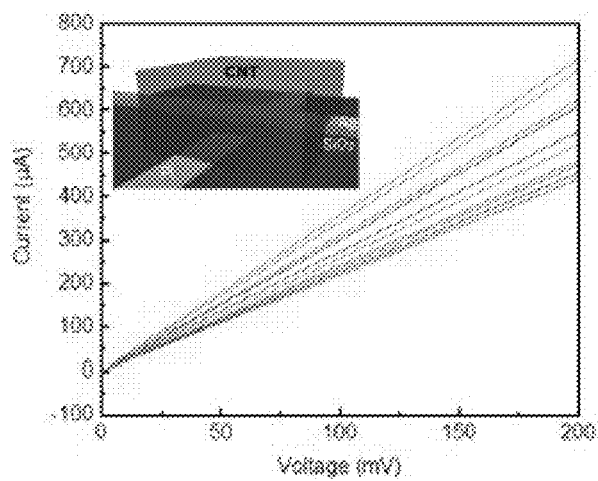
FIG. 23A is an I-V graph of a sample vertical Ag—SiO2-Pt memristor structure embedded in single-walled carbon nanotubes (CNT). Devices embedded in CNT initially showed high conduction dominated by CNT transport.
Figure 23B:
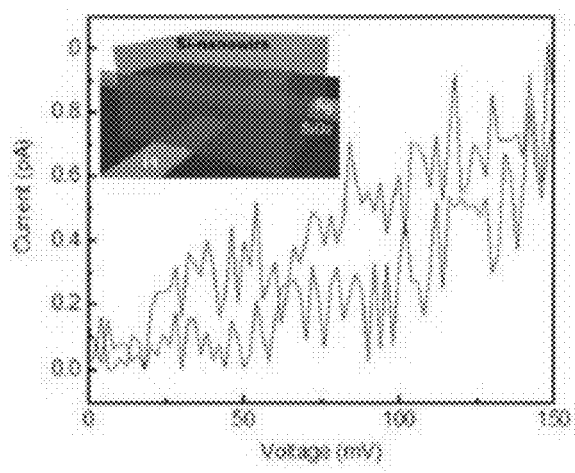
FIG. 23B is an I-V graph of a sample vertical Ag—SiO$_2$—Pt memristor structure embedded in Si-nanowire networks. Devices embedded in semiconducting Si-nanowire network showed low conduction (e.g., similar to bare device).

As illustrated in FIGS. 23A-23B, none of the devices formed bio-voltage switching following the same forming process. The results are consistent with previous studies in which Ag-based memristors using nanowire mesh/network did not yield low-voltage switching. These 'negative' controls indicate that it is not the percolation material structure that contributes to the observed effect.

Figures 24A, 24B:
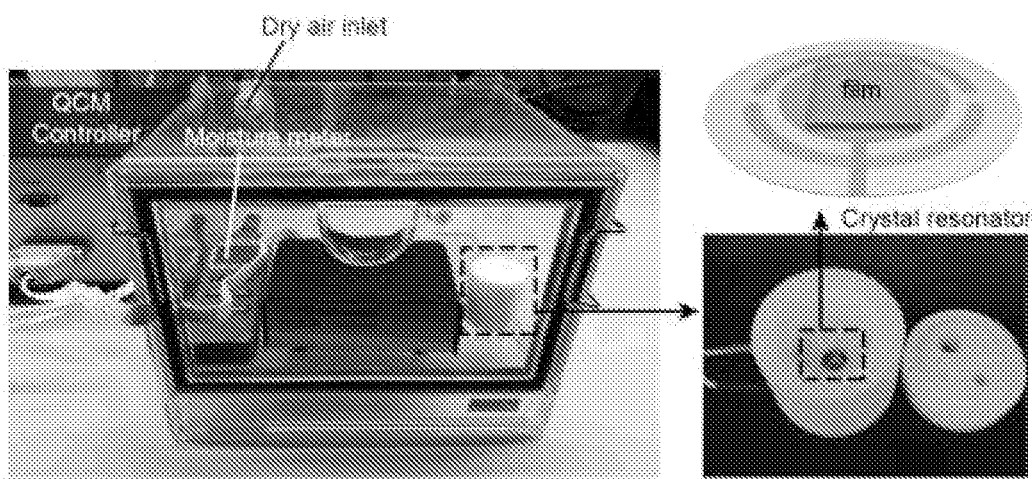
FIG. 24A is a photo of a measurement setup for measuring moisture-absorption of thin films and including a gas-purge desiccator cabinet (H42053-0002; Bel-Art) with an inlet and outlet that allow the controlled flow of dry air, a portable hygrometer (Model 8706; REED Instruments) that can real-time monitor the relative humidity (RH) in the cabinet, and a quartz crystal microbalance (QCM; 400C, CH Instruments) that can monitor the thin-film mass.
FIG. 24B is a photo illustrating the thin film (e.g., protein nanowires or polyvinylpyrrolidone film) deposited on the quartz crystal resonator (top) by dropcasting.
Figure 24C:
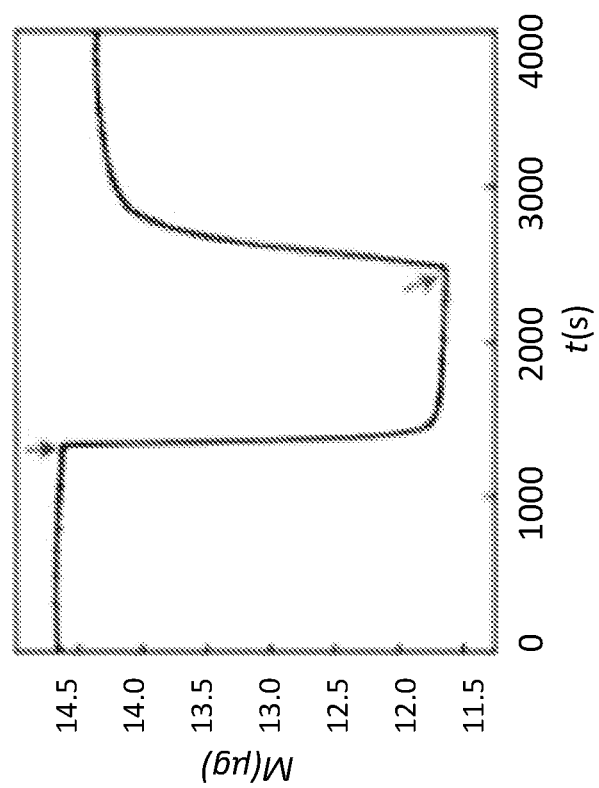
FIG. 24C is a graph of weight change in a protein nanowire film measured with QCM. The upper arrow indicates the start of moisture removal by dry air, whereas the lower arrow indicates the start of moisture re-adsorption in the protein nanowire film (at ambient RH~35%).

Additional studies elucidated the catalytic role of protein nanowires. The influence of moisture is important in various inorganic memristors because it affects oxidization rate and cation mobility, and hence the switching dynamics. The protein-nanowire film also adsorbed moisture in the ambient environment (FIGS. 24A-24C). As illustrated in FIGS. 24A-24C, a thin film (e.g., protein nanowires or polyvinylpyrrolidone film) was deposited on a quartz crystal resonator by dropcasting. The mass sensitivity of the QCM originates from the dependence of the oscillation frequency on the total mass of the metal-coated crystal, including any deposited material. The mass change can be determined by $$\Delta m = -\Delta f \cdot A \cdot \frac{\sqrt{\mu \rho}}{2 f_0^2},$$

where $f_0$, A, $\rho$, $\mu$ are resonant frequency of crystal's fundamental mode, area of the gold disk on the crystal, crystal's density (2.684 g·cm−3) and shear modulus of quartz (2.947× 1011 g·cm−1·s−2), respectively. The mass of the coated thin film ($W_{film}$) was first determined in the ambient environment. Then the resonator was placed in the desiccator cabinet with dry air flowing in to reduce RH to ~0% inside to force out adsorbed moisture in the thin film. During the process, the mass change ($\Delta W_{film}$) that corresponds to the amount of moisture loss in the film, was continuously monitored (reflected by the resonant-frequency change in QCM).

Figure 3B:
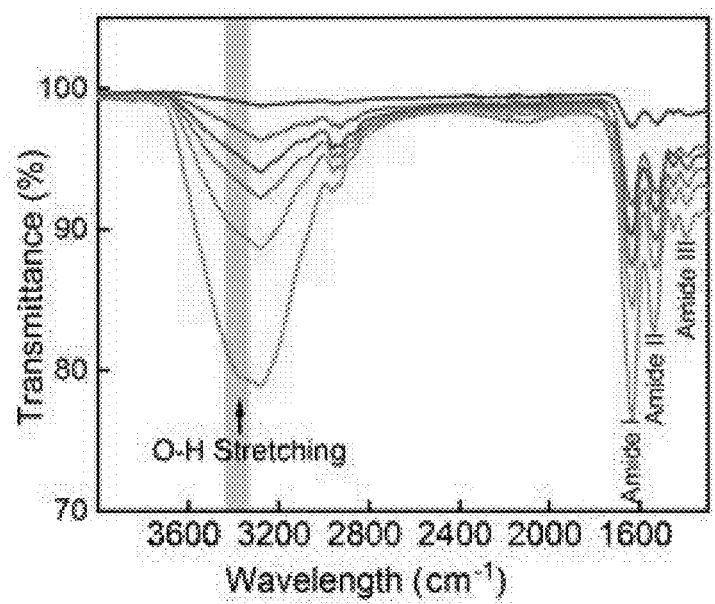
FIG. 3B is a graph of Fourier transform infrared (FTIR) spectra of a prototype protein-nanowire film (~200 nm thick) at relative humidity (RH) of 0% (gray), 35% (red), 50% (blue), 65% (green), 80% (purple) and 100% (yellow). The broad peaks ~3400 cm−1 correspond to O—H stretching band in free water. The increased intensity indicates increased water adsorption in the film at higher RH. The increased intensities in other amide peaks may be caused by protein segments that became more mobile after moisture filling interstitial voids.
Figure 3C:
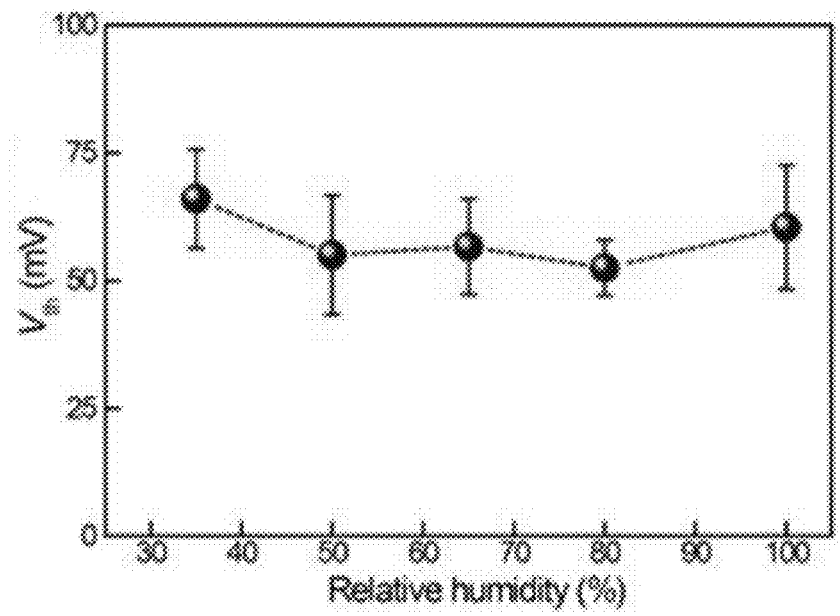
FIG. 3C is a graph of average turn-on voltage ($V_{th}$) from devices (N=12) in different Relative Humidity (RH). The error bars represent the standard deviation (s.d.).
Figures 25A, 25B:
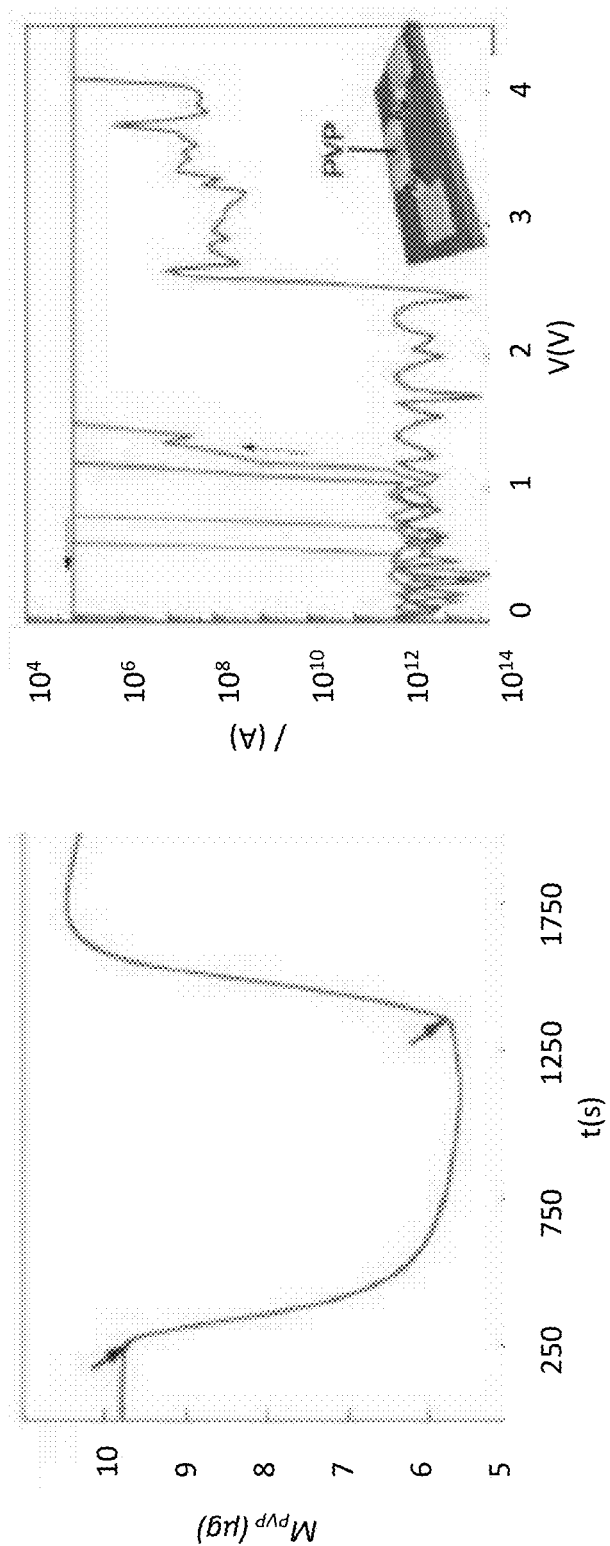
FIG. 25A is a graph of moisture content measured by QCM (FIG. 24A), which showed that a thin polyvinylpyrrolidone (PVP) film (~1.8 µm) adsorbed ~40% weigh-percentage moisture. The upper, red arrow indicates when dry air flew in to drive out the moisture, whereas the lower, blue arrow indicates the dry-air flow stopped and when moisture re-adsorption happened.
FIG. 25B is an I-V graph of a forming and switching process in a PVP memristor (inset) in the first five consecutive sweeps. The device never went to a turn-on voltage below 0.5 V. The turn-on voltage featured a large variation with the average value >0.5 V. The nanogap spacing between the pair of Ag electrode was 200 nm. The testing was in the ambient environment with RH ~40%.

Fourier-transform infrared spectroscopy (FTIR) spectra revealed that moisture adsorption increased with increased relative humidity (FIG. 3B). However, the devices maintained a similar switching voltage ($V_{th}$) over a wide range of relative humidity (FIG. 3C), indicating that anodic oxidization and ion migration were not the determining factors in bio-voltage switching. Further evidence that oxidization and ion migration were not the determining component was the finding that turn-on voltage <0.5 V could not be achieved with devices made from polyvinylpyrrolidone (PVP), which adsorbs similar amounts of moisture as protein nanowires (FIGS. 25A-25B). This result is consistent with previous studies in which Ag memristors based on other organic materials that could easily adsorb moisture also did not yield switching voltages below 0.5 V. Collectively, these results suggested that the protein nanowires played an important role in the cathodic reduction step rather than anodic oxidization and cation migration.

Figure 3D:
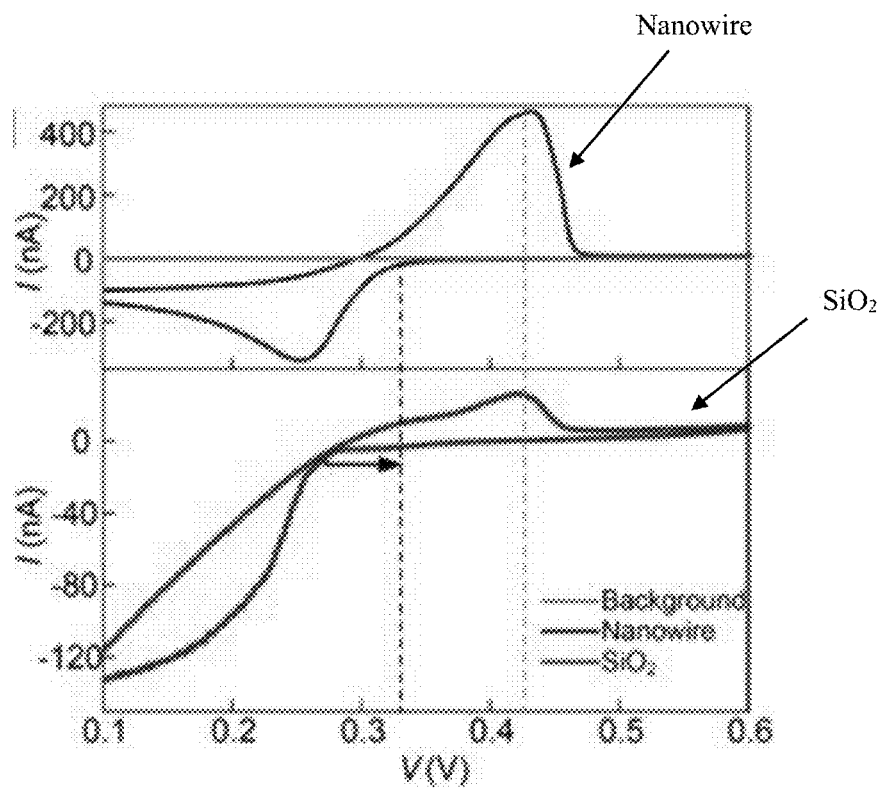
FIG. 3D is a graph of cyclic voltammetry curves using protein-nanowire coated Au cathode (top) and SiO2-coated Au cathode (bottom) in Ag+ (5 mM) solution at a rate of 25 mV·s−1. The background curve (gray) was performed without Ag+. The onset reduction potential shows a right shift (black arrow) from ~0.25 V to ~0.35 V when switching from SiO$_2$ coating to protein-nanowire coating in the Au cathode, whereas the oxidation peak (~0.43 V) does not shift.

Studies were carried out in decoupled Ag$^+$ reduction in an electrochemical cell using cyclic voltammetry. A previous study revealed a direct electron donation from the dielectric to Ag$^+$ during the reduction or filament formation in Ag memristors. To mimic the dielectric environment of Ag$^+$ reduction in a memristor, the working electrode was coated with a thin layer of dielectric. The cyclic voltammetry measurements showed that, compared to a SiO$_2$ dielectric coating, the protein-nanowire coating yielded a right shift in the reduction peak (FIG. 3D). This right shift or decrease in reduction potential, with respect to an unchanged position in the oxidization peak, demonstrated that protein nanowires facilitate cathodic reduction of Ag$^+$. Protein nanowires have specifically evolved for electron transfer to metals, but the specific molecular mechanism for Ag$^+$ reduction warrants further investigations.

The bio-voltage memristor studied here can be considered to be within the category of electrochemical metallization cells, in which the conductance modulation requires a physical morphology change in the metallic filament. A reading voltage below the threshold switching voltage is hardly expected to perturb the conductance, because the physical evolution in the filament requires an electrochemical reduction that is largely a threshold event by overcoming the electrochemical reduction potential as discussed above. These considerations suggest that the bio-voltage memristors have functional stability.

Example 3. Bio-Voltage Artificial Neuron

Figure 4A:
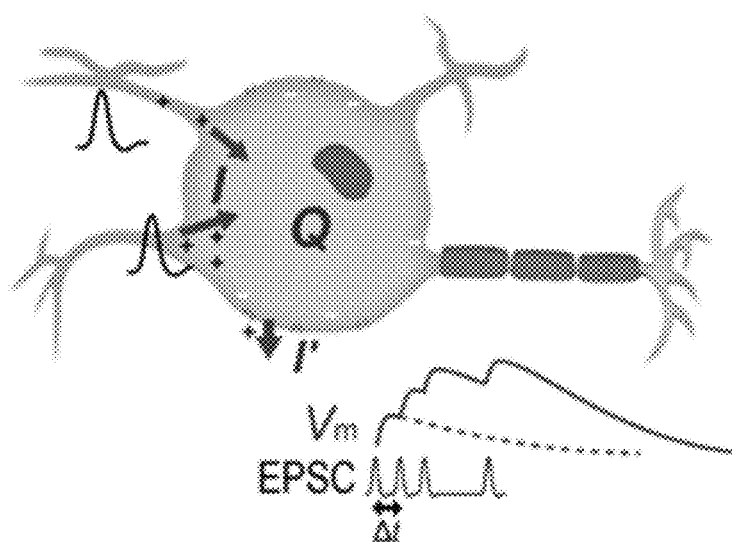
FIG. 4A is a schematic of a biological neuron integrating excitatory postsynaptic current (EPSC). I denotes the injected EPSC, I' denotes the leaky current through the cell membrane, and Q denotes the net cytosolic charge. A lower schematic of temporal integration of EPSC is also shown. The membrane potential ($V_m$) shows a close-to-linear summation of short-interval EPSC spikes, whereas the summation deviates for long-interval EPSC spikes.

The protein-nanowire memristors enable the construction of bio-voltage neuromorphic components such as an artificial neuron. The biological neural firing is triggered by membrane potential ($V_m$), which is directly related to net charge (Q) in a given cytosolic volume ($Q=C_m \cdot V_m$; $C_m$ is the membrane capacitance); therefore the state dynamics are often modeled[44] by $$C_m \frac{dVm}{dt} = I - g_m V_m, \quad (Eq. 1)$$

where I denotes injection current and $g_m V_m$ the leaky current related to the membrane conductance $g_m$ (FIG. 4A). The equation indicates that for short-interval input spikes (e.g., $\Delta t < C_m/g_m$), an approximately linear temporal integration is expected, whereas for long-interval spikes (e.g., $\Delta t > C_m/g_m$) it will deviate to sub-linearity. Although excitatory postsynaptic current (EPSC) is different from the direct current injection modeled, close-to-linear and sub-linear postsynaptic temporal integrations were experimentally observed at high frequency (e.g., >200 Hz) and low frequency (e.g., <100 Hz) in biological neurons.

Figure 4B:
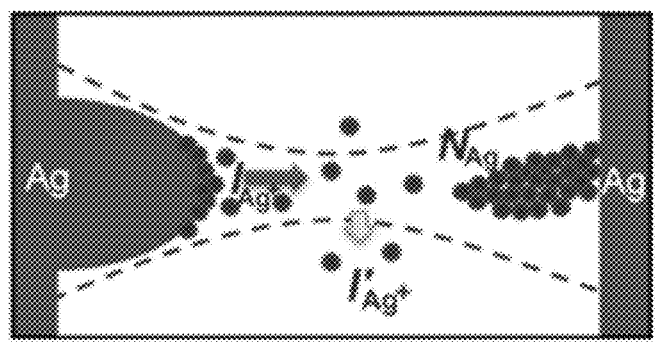
FIG. 4B is a schematic of proposed dynamics of filament formation in a protein nanowire memristor. The dashed lines delineate the given filamentary volume. $I_{Ag+}$ denotes injected cationic $Ag^+$ current, $I'_{Ag}{}^+$ denotes the $Ag^+$ diffusion (leaky) current out of the filamentary volume, and $N_{Ag}$ denotes the net Ag element in the filamentary volume.

The dynamics of filament formation in the memristor (FIG. 4B) can be qualitatively analogous to the depolarization in a biological neuron (FIG. 4B). Specifically, the filament formation is also a 'threshold' event governed by the net Ag numbers ($N_{Ag}$) in a given filamentary volume (S), which corresponds to the net charges (Q) in a given cytosolic volume. A leaky term governed by $Ag^+$ diffusion (out of 5) corresponds to the leaky current (out of cytosol). Based on Fick's law, the leaky term is proportional to $D \cdot \nabla \rho$, where $\rho$ is the $Ag^+$ concentration and D the diffusion coefficient. As $Ag^+$ concentration outside the filamentary volume is very low, $\nabla \rho$ is approximately proportional to $\rho$; so the leaky term can be written as $k \cdot \rho$ (k is a coefficient). Therefore, a similar equation governing the state dynamics ($N_{Ag}=S \cdot \rho$) for filament formation can be expressed as q·

$$S \frac{d\rho}{dt} = I_{Ag+} - k \cdot \rho, \quad (Eq. 2)$$

where q and $I_{Ag+}$ represent the charge quanta and $Ag^+$ injection current, respectively. Although the actual values of the components are determined by the physical properties of the protein nanowire-Ag system and largely unknown, the similar form between (Eq. 2) and (Eq. 1) indicates that similar temporal integration may be realized in the memristor to realize an artificial integrate-and-fire neuron.

Figure 4C:
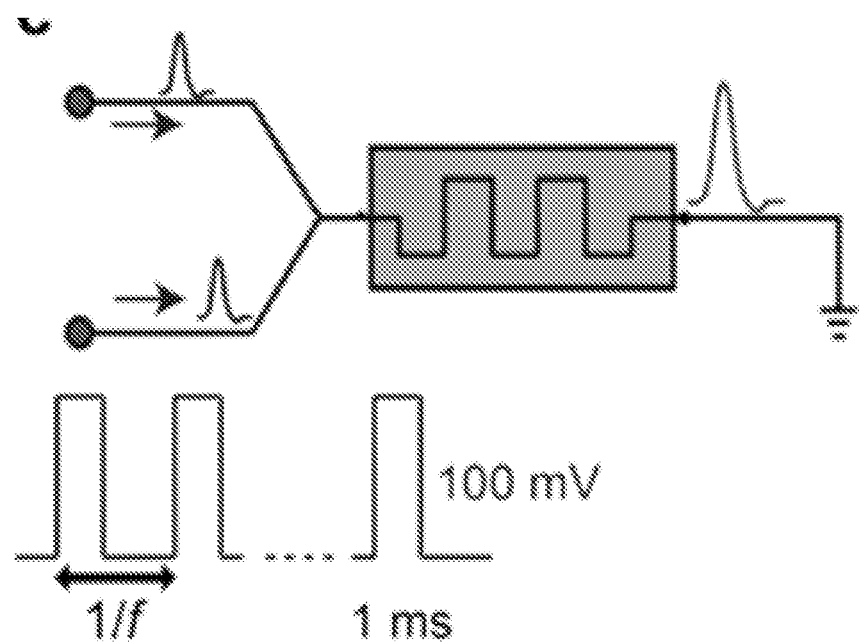
FIG. 4C is a schematic of a leaky integrate-and-fire artificial neuron built from a protein nanowire memristor. Excitatory postsynaptic potential (EPSP) signals are represented by action-potential alike spikes (100 mV, 1 ms) and their temporal correlation is modulated by frequency f.
Figure 4D:
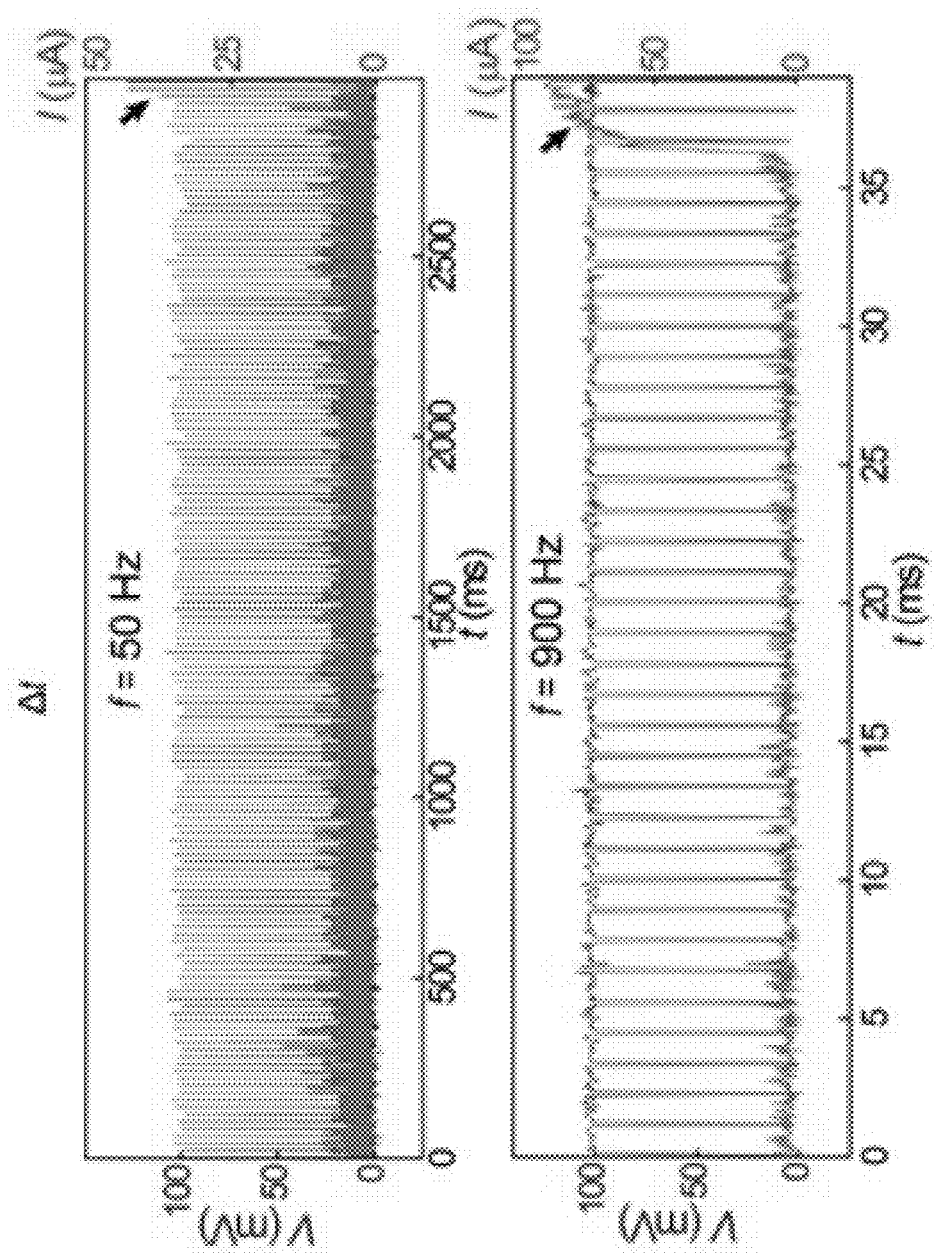
FIG. 4D is a graph of neural firing (turn-on, indicated by black arrows) in a protein nanowire device at low-frequency (50 Hz, top panel) and high-frequency (900 Hz, bottom panel) EPSP signals.
Figure 4C:
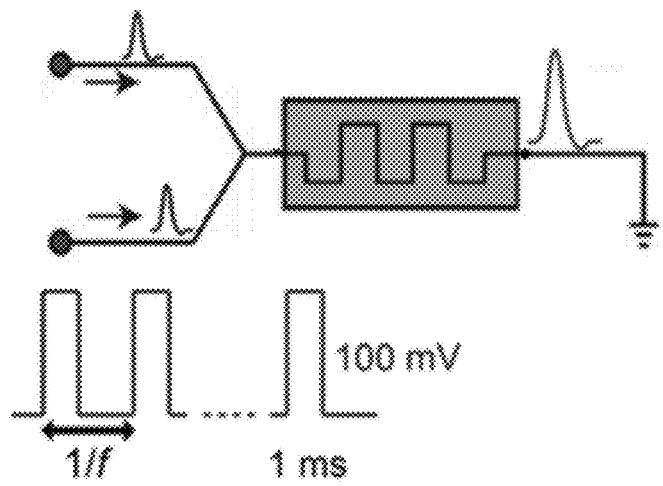
Figure 4D:
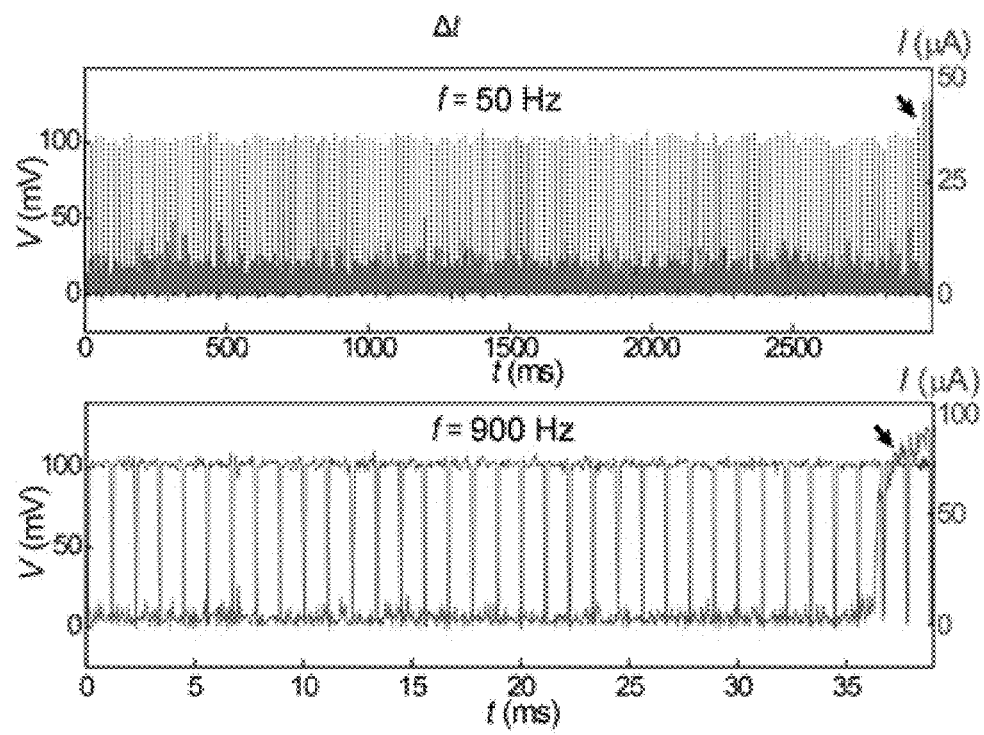
Figure 4E:
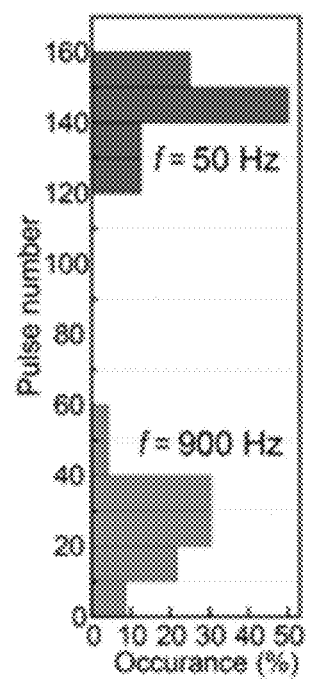
FIG. 4E is a plot of statistics of pulse number for neural firing for low-frequency (50 Hz, cyan) and high-frequency (900 Hz, orange) EPSP signals.
Figure 4F:
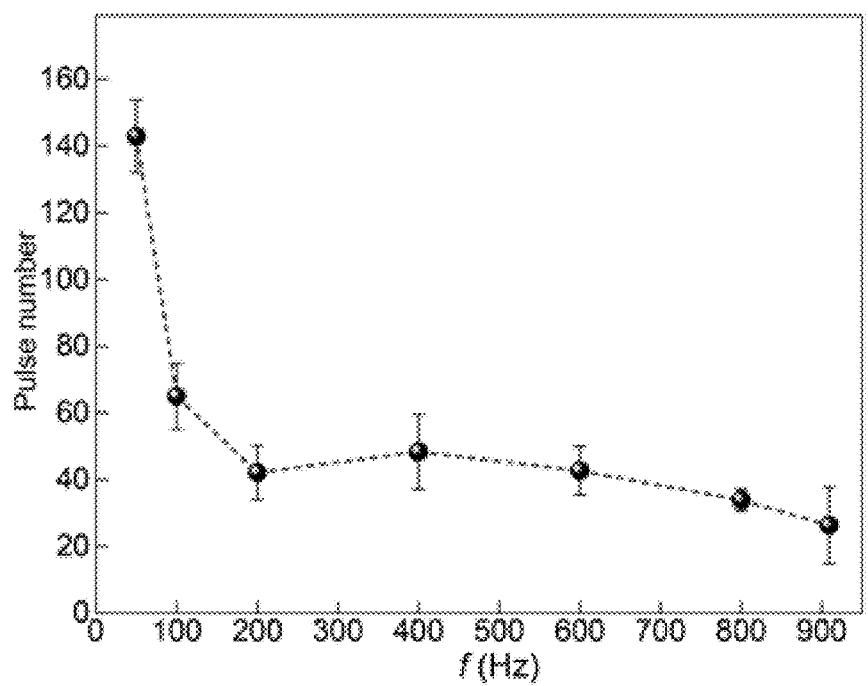
FIG. 4F is a graph of average pulse number of EPSP signals for neural firing at different frequencies (50-900 Hz). The error bars represent the standard deviation (s.d.). The pulse number shows a relatively flat trend at high frequency (200-900 Hz), indicating a close-to-linear temporal integration less sensitive to spike interval. The trend deviates at low frequency (<100 Hz).

Input spikes (100 mV, 1 ms) close to biological action potential were used and the frequency (or pulse interval) was varied from 50 to 900 Hz to experimentally investigate the temporal integration in the artificial neuron (FIG. 4C). At a given frequency, the neuron integrated a certain number of spikes before its firing (turn-on) (FIG. 4D), followed by spontaneous repolarization or relaxation to HRS. The number of pulses featured a stochastic distribution (FIG. 4E), similar to that in a biological neuron. Nonetheless, a clear difference in the average number of pulses was observed between high- and low-frequency spikes (FIG. 4E). Collectively, the number of pulses needed for firing remained close in the high-frequency range (e.g., >200 Hz) but appeared to deviate (increased) in the low-frequency range (e.g., ≤100 Hz) (FIG. 4F). Such integration reflects a close-to-linear summation at high frequency and sub-linear one at low frequency, which is similar to the postsynaptic temporal integration by neurons. In particular, it features a quantitative emulation as both frequency domains overlap with those in biological neurons.

Example 4. Bio-Voltage Artificial Synapse

Figure 5A:
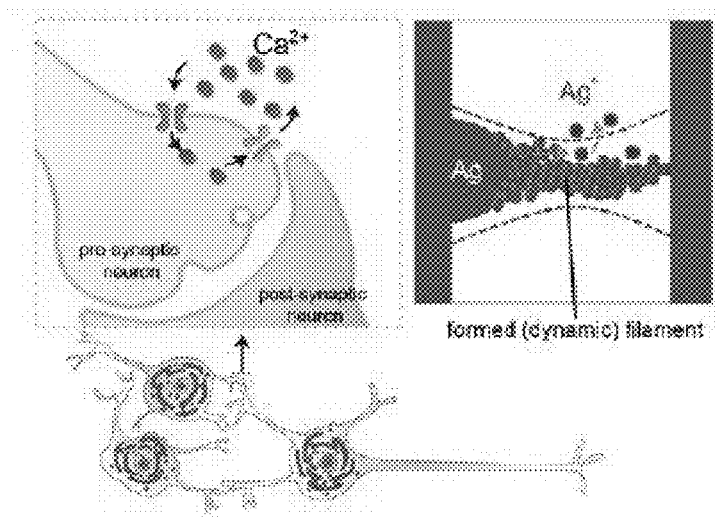
FIG. 5A is a schematic of $Ca^{2+}$ influx and extrusion in a biosynapse that underlies synaptic plasticity (left) and the increase (by anodic injection) or decrease (by diffusion) of Ag atoms in a formed filament that can lead to the dynamic increase or decrease in filament size (right). The resultant conductance change can mimic the synaptic plasticity.
Figure 5B:
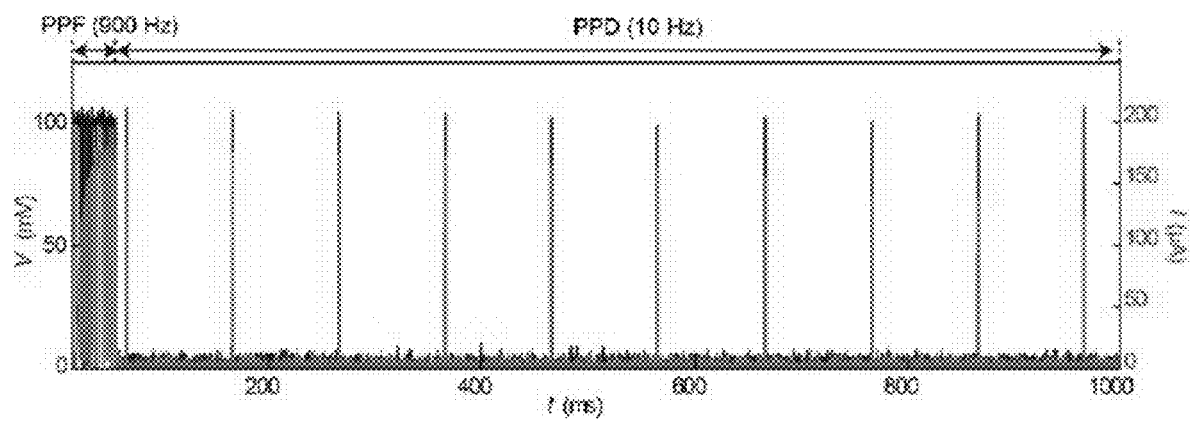
FIG. 5B is a graph of conductance modulation in an activated protein nanowire memristor by modulating the frequency in inputs (100 mV, 1 ms). Paired-pulse facilitation (PPF) featuring continuous conductance increase was observed at high frequency (900 Hz), whereas paired-pulse depression (PPD) featuring continuous conductance decrease was observed at low frequency (10 Hz).
Figure 5C:
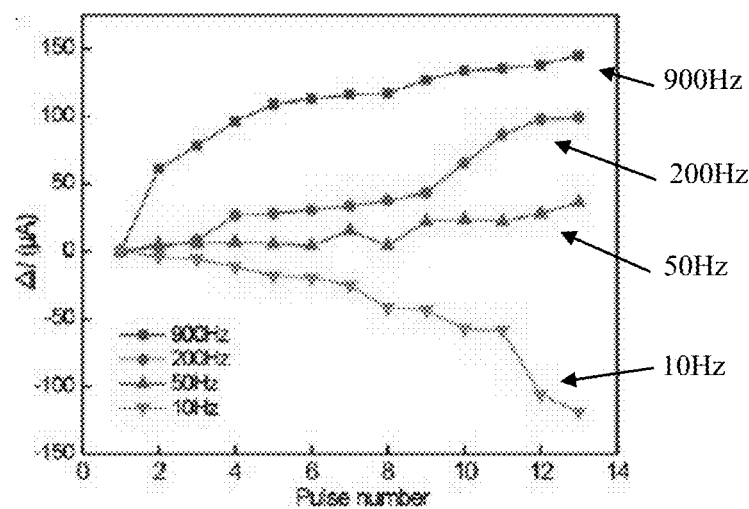
FIG. 5C is a graph of conductance modulation in a protein nanowire memristor with different input frequencies.
Figure 14A:
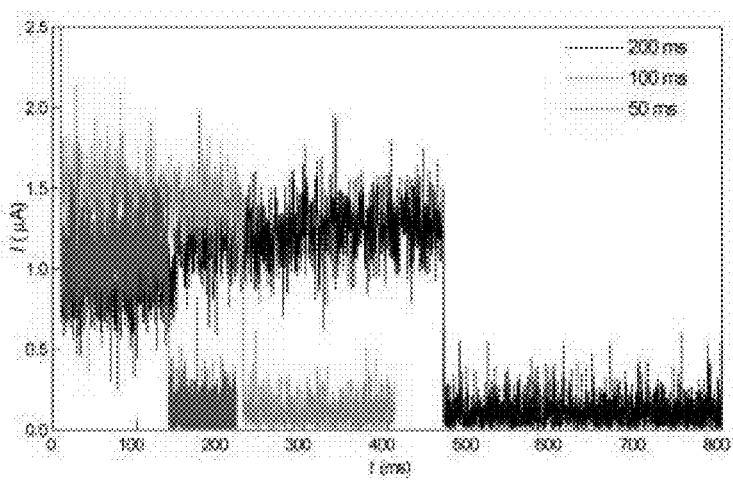
FIG. 14A is a graph illustrating representative conductance relaxations from a vertical protein-nanowire device switched by programming pulses of different widths. The pulse amplitude was kept at 100 mV. The relaxation current was recorded at 10 mV.
Figure 14B:
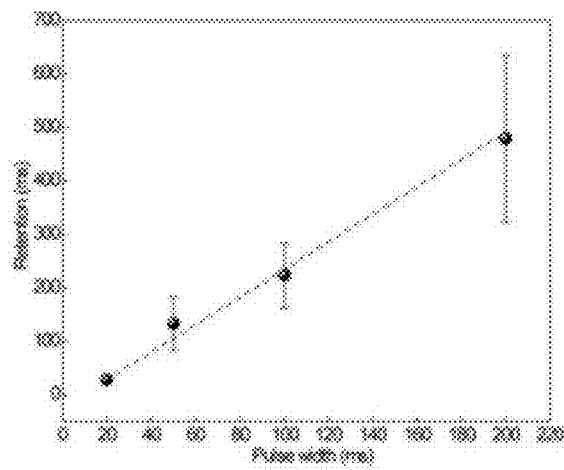
FIG. 14B is a graph illustrating average relaxation time with respect to programming pulse width. There is an approximately linear increase in relaxation time with respect to pulse width. Note that this linear fitting does not pass the origin, because pulses with width >10 ms can turn on the device. The extrapolated 0 ms retention at ~10 ms input pulse width is consistent to the experimental result (FIG. 2D).
Figure 26:
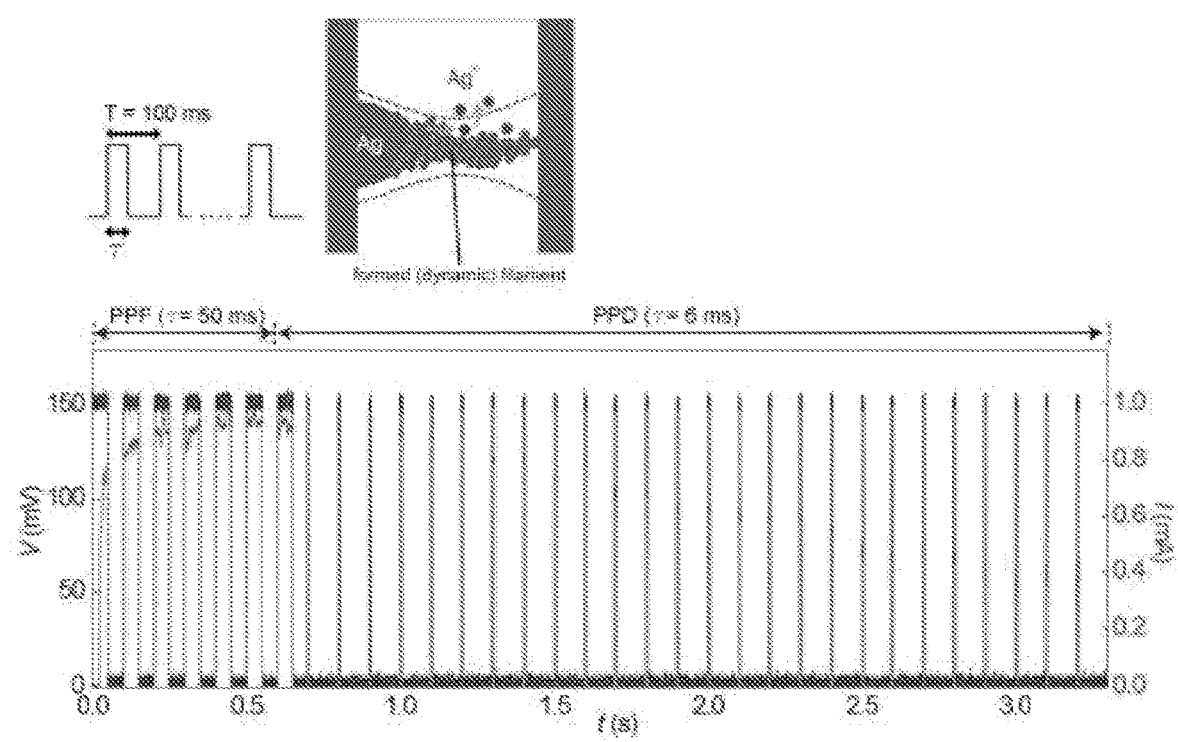
FIG. 26 is a graph illustrating conduction modulation by pulse width in protein-nanowire synapse made from a planar memristor. A schematic of the input pulse train to an activated protein-nanowire memristor is shown. The pulse frequency (f=10 Hz) or period (T=100 ms) is fixed, whereas the pulse width (t) is modulated. At t=50 ms, the activated nanowire synapse showed increasing conductance (red curve) or paired pulse facilitation (PPF) with increased number of pulses. Reduced pulse width (t=6 ms) resulted in a decrease in conductance or paired pulse depression (PPD) with increased number of pulses.
Figure 27A:
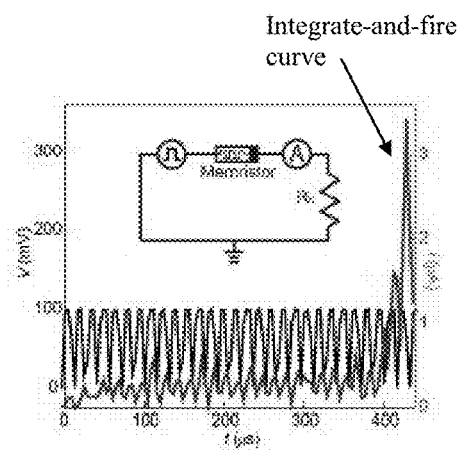
FIG. 27A is a graph illustrating a representative (grey) integrate-and-fire process in an artificial neuron by using (black) bio-voltage pulses (100 mV, 10 µs width, 15 µs period). Current compliance ($I_{CC}$) can be added by connecting a compliance resistor ($R_C$).
Figure 27B:
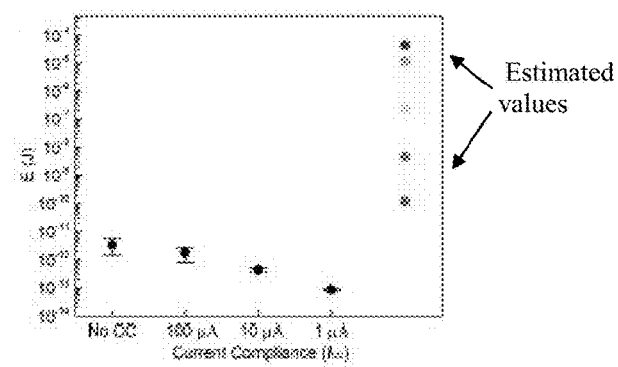
FIG. 27B is a graph illustrating energy consumption (E) in the spiking event at different $I_{CC}$ in the sample device (black dots), compared to estimated values (grey dots) from previously reported neurons. The data shows that even without current compliance, the energy cost in the sample device is still close to two orders of magnitude lower than the lowest reported value.
Figure 27C:
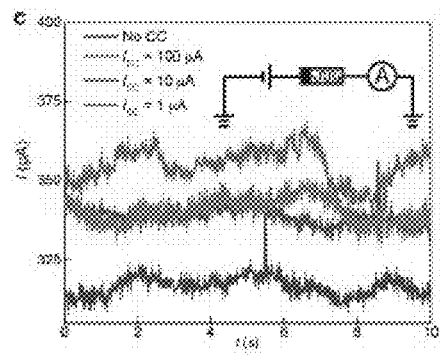
FIG. 27C is a graph of the Off currents measured (the device was reversely biased to prevent turning On) to include the energy cost in the incubation period (i.e., leaky current before spiking).
Figure 27D:
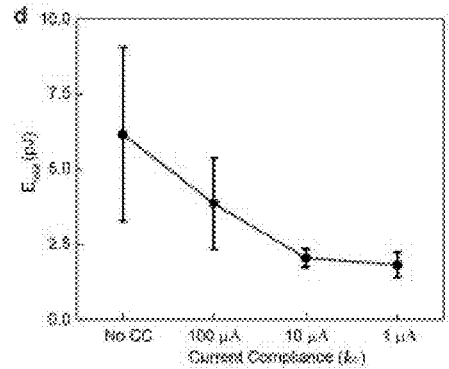
FIG. 27D is a graph of total energy cost ($E_{total}$) in a spiking event, as the summation of dynamic energy in (FIG. 27B) and energy loss through leaky current in (FIG. 27C) during the incubation period.
Figure 28A:
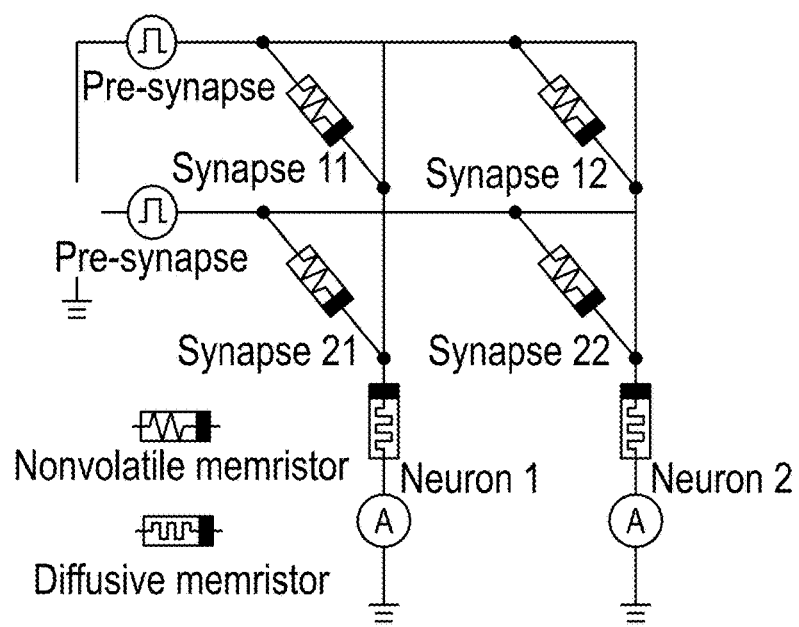
FIG. 28A is a schematic representation of an example neural network consisting of a 2×2 synapse matrix and 2 neurons (made from bio-voltage diffusive memristors). The pre-synaptic input vector is first computed by the synapse matrix, forming the post-synaptic signal vector that further feeds into the neuron array. The neuron array integrates the post-synaptic vector (or weighted synaptic signals) to form the output vector. Previous work has demonstrated efficient pattern classification using a fully memristive neural network integrated with both synapses (by nonvolatile memristors) and neurons (by diffusive memristors).
Figure 28B:
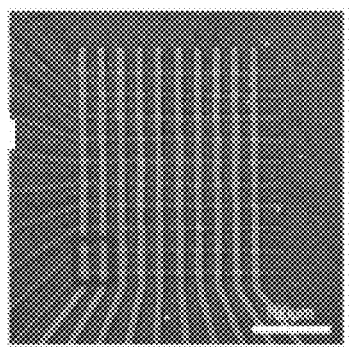
FIG. 28B is an SEM image of a 10×10 synapse matrix in a crossbar architecture, each synapse being a nonvolatile memristor made of Ag/SiO$_2$/Pt (150 nm/35 nm/20 nm). A 2×2 synapse matrix (box) from it was used.
Figure 28C:
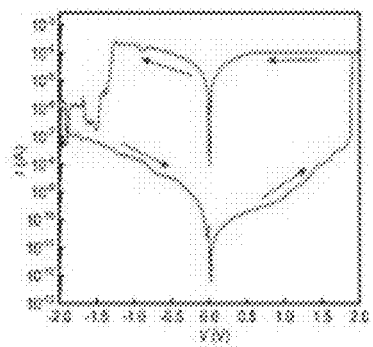
FIG. 28C is a graph of characteristic switching I-V from a synapse in the crossbar (FIG. 28B), showing a set voltage ~1.8 V and reset voltage ~−1.5 V.
Figure 28D:
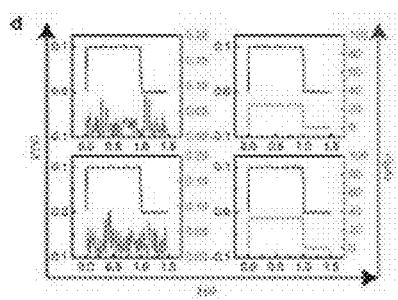
FIG. 28D is a graph of the weight/conduction in each pre-trained synapse (read by 100 mV), which is further represented in a color map in FIG. 28E.
Figure 28E:
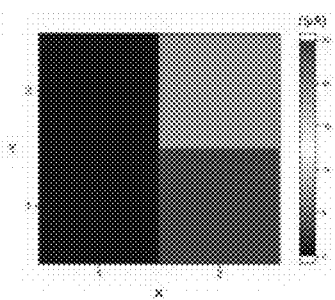
FIG. 28E is a color map of the weight/conduction in each pre-trained synapse.
Figure 28F:
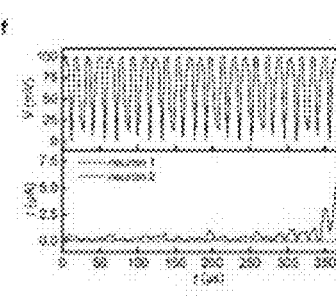
FIG. 28F is a graph illustrating the spiking amplitude of 100 mV (top) used for post-synaptic readout, which was subsequently integrated by the neurons (owing to the bio-voltage function) for different outputs (bottom). The energy cost in this reading process was substantially reduced by using bio-voltage neurons, as analyzed before (FIGS. 29A-D). If the high-voltage (e.g., $V_T$>1V) synapses are replaced with bio-voltage (e.g., $V_T$<100 mV) synapses, the entire unsupervised training/learning can be realized with 100 mV spikes to yield substantial power reduction as well.

In addition, the influx and efflux of Ag in the filamentary volume can also emulate Ca' influx and extrusion in a biosynapse (FIG. 5A). The competing effect can lead to growth or shrinkage in the filament size, which is inferred from the experimental observation that a longer programming pulse yielded a longer relaxation (FIGS. 14A-14B). Consequently, the steady-state evolution in the built-up filament (conductance) can be used to emulate synaptic plasticity. A bio-voltage artificial synapse with a protein nanowire memristor (FIG. 5B) was demonstrated. After activation (turn-on), the device's conductance increased with the increase in pulse number at high frequency (900 Hz), presumably because a high-rate $Ag^+$ injection into the filament volume would facilitate filament growth, similar to enhancement in synaptic strength by $Ca^{2+}$ surge. Low-frequency (e.g., ~10 Hz) pulse train lead to conductance decrease (depression) (FIG. 5B), corresponding to a shrinkage in filament due to the dominance of Ag diffusion (leakage) over low-rate injection. Alternatively, tuning the pulse width at fixed frequency can also be used to modulate the conductance (FIG. 26). These properties enabled the artificial synapse to realize frequency-dependent paired-pulse facilitation (PPF) and paired-pulse depression (PPD) (FIG. 5C), which implies the potential for autonomic computing. Compared with previous artificial synapses, the features of the protein-nanowire memristors are much closer to matching the parameters of biosynapses in signal amplitude (e.g., at least 10× smaller) and/or frequency range (e.g., <1 kHz).

Example 5. Bioelectronic Interfacing

The potential of implementing the bio-voltage memristors in biointerfaces was shown. Various electronic devices such as self-powered wearable sensors and intracellular bio-probes have been developed to record physiological signals. The recorded signals are generally small and often in the sub-100 mV range, which require amplification before conventional signal processing. This pre-processing adds to the power and circuitry requirements for future closed-loop bioelectronic interfaces or biomimetic systems. The bio-voltage memristor provides the possibility for direct bio-signal processing to reduce the power and circuitry budget, which is highly desirable for improved sustainability and reduced invasiveness in bio-integrated systems.

Figure 6A:
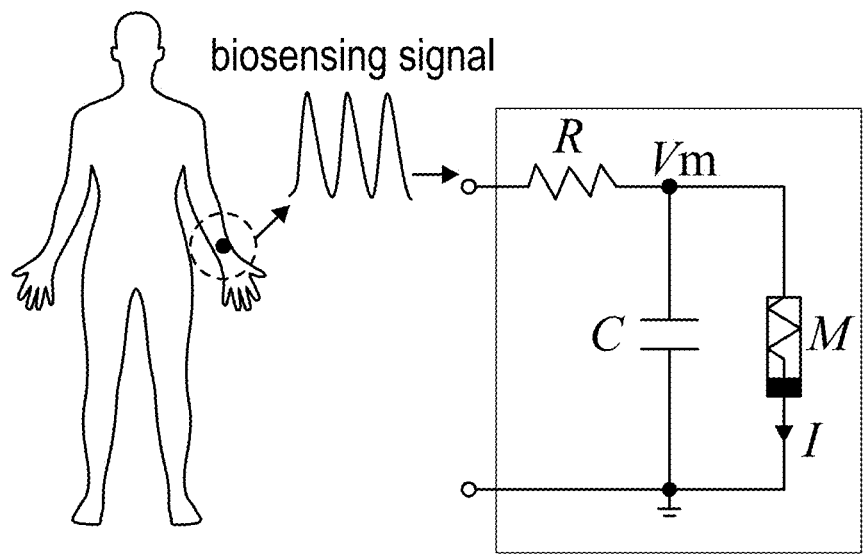
FIG. 6A is an example circuit of an artificial neuron constructed using a bio-voltage memristor (M). A parallel capacitor C=100 μF and series resistor R=10 kΩ were used to yield a time constant (RC=1 s). Emulated biosensing signals (e.g., pulse) can be input to the artificial neuron.

FIG. 6A shows the circuit of an artificial neuron with tunable integrate-and-fire response. The input pulses gradually increase the voltage across the memristor ($\underline{V}_m$) by charging up the capacitor (C) through the resistor (R). The equilibrium voltage peak is dependent on the input frequency relative to the time constant (RC). If the threshold voltage is reached, the memristor will be turned on and transits to low resistance ($R_{ON}$). If $R_{ON}$ is considerably smaller than R, it will discharge the capacitor to lower $\underline{V}_m$. Meanwhile, the input pulses across the memristor will also be attenuated (e.g., by a factor of $R_{ON}/(R_{ON}+R)$) through the R—$R_{ON}$ voltage divider) and below the threshold. This forms a 'refractory' period similar to that in a biological neuron after firing. Therefore, the memristor naturally decays to Off after the firing, before it starts to integrate the next round of pulses. The input frequency-dependent firing in the artificial neuron can enable artificial bio-reporter to monitor bio-signal changes.

Figure 6B:
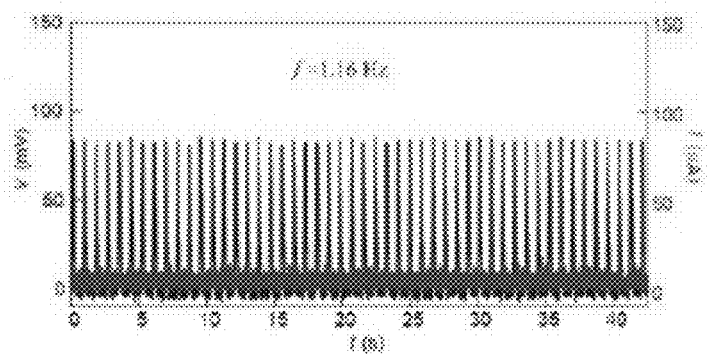
FIG. 6B is a graph illustrating that pulse (blue) frequency of normal heart rate (1.16 Hz) could not trigger the neuronal firing (red).
Figure 6C:
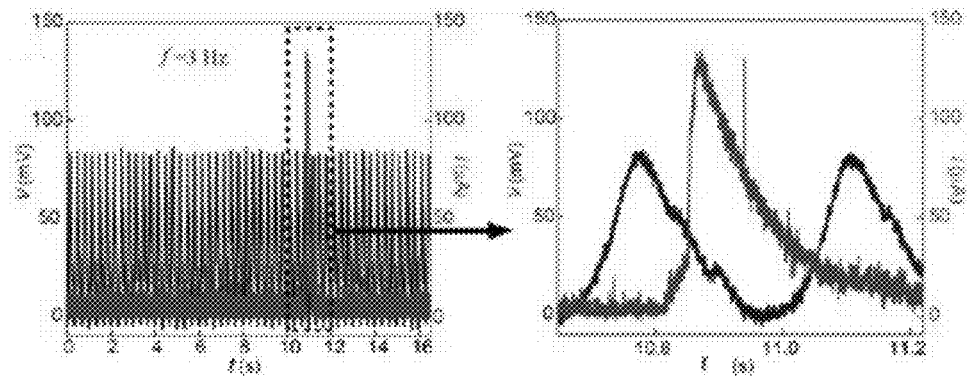
FIG. 6C is a graph illustrating that pulse (blue) frequency of abnormal heart rate (3 Hz) triggered the neuronal firing (red peak, in dotted box), and a zoom-in of the pulse signal (blue) with dicrotic feature and triggered neuronal firing (red) featuring a fast depolarization and relatively slow repolarization similar to an action potential.
Figure 6D:
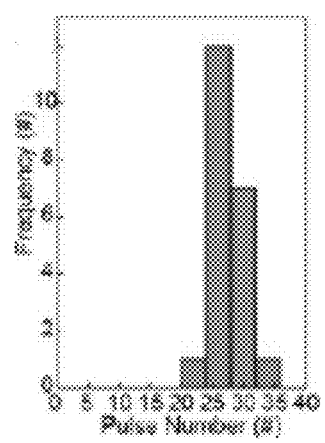
FIG. 6D is a graph of statistical results of pulse number (26.3±16.4, s.d.) to trigger neuronal firing at f=3 Hz.

In a proof-of-concept demonstration, emulated biosensing signals (e.g., 80 mV pulses) were input to the artificial neuron (FIG. 6A). The RC constant (~1 s) was tuned to be close to the period in normal heart rate, so the competing charging and discharging yielded a peak $V_m$ below the threshold and could not trigger the neuronal firing FIG. 6B). Abnormal heart rate (e.g., 180 bpm) increased the charging rate to yield a $V_m$ larger than threshold and triggered the neuronal firing (FIG. 6C). Thus, the artificial neuron functioned as an on-site health reporter, showing the potential of bio-voltage memrisistors to perform on-site bio-signal processing. Cellular signal (e.g., action potential) has similar amplitude, although the retrieval of the intracellular amplitude requires an efficient cell-sensor coupling. Recent advances in 3D nanoscale bioprobes, including nanotransistors, nanopipettes, and nanopillar electrodes, have successfully demonstrated close-to-full-amplitude signal recording. These advances have indicated the potential in integrating intracellular bioprobes with bio-voltage memristors in new generations of bioelectronic interfaces, in which the bio-voltage artificial neuron may form direct communication with biological neurons.

Example 6. Bio-Power Computing

Bio-realistic systems (e.g., spiking neural network) are expected to integrate both synaptic (e.g., weighted interconnects) and somatic components (e.g., pulse-signal processing units). Previous nonvolatile memristors have been demonstrated to be an ideal candidate to realize synaptic functions. Diffusive memristors, due to the inherent mimicry to an 'auto-reset' in biological signal processing (e.g., repolarization), can be advantageous in constructing the somatic pulse-processing components (e.g., artificial neurons). The complementary integration of the two types can lead to expanded neuromorphic functions, as were initially demonstrated in synaptic functions, capacitive networks, and spiking neural networks. Moreover, the concept of introducing catalytic elements in memristors and the mechanism revealed can be employed to engineer bio-voltage nonvolatile memristors, hence possibly forming the complementary pair of volatile and nonvolatile bio-voltage memristors for constructing bio-voltage neuromorphic systems. In an ideal spiking neural network (e.g., with minimal energy cost in the idle state), energy consumption will mainly go to the spiking events. As a result, reducing the spiking amplitude is expected to play the dominant role for power reduction. Our initial studies in single device (FIGS. 27A-27D) and neural network (FIGS. 28A-28F) have shown that the achieved bio-voltage amplitude can substantially reduce the energy cost in spiking events to close to or even below that of a biological neuron, demonstrating the potential in improving low-power neuromorphic computing.

The initiation of an action potential in biological cells is estimated to consume 107-108 ATP. This leads to an estimated 1-10 pJ energy cost (e.g., based on a free energy of ~60 kJ/mol during the hydrolysis of ATP to ADP). Therefore, as illustrated in FIGS. 27A-27D, the energy cost in the bio-voltage neuronal spiking is close to or even below that of a biological cell.

Example 7. Methods

Synthesis of protein nanowires. The protein nanowires were harvested and purified from *G. sulfurreducens*. Harvested nanowire preparation was dialyzed against deionized water to remove the buffer and stored at 4° C. The resultant nanowire preparation yielded a measured pH~9.

Device fabrication: Planar nanogap devices. A pair of contacts (e.g., 80×80 µm² with extending interconnects), on which the probe tips land for electrical measurements, were first defined on a silicon substrate coated with 600 nm thermal oxide (Nova Electronic Mater., Inc.) through standard photolithography, metal evaporation (Au/Cr=30/10 nm) and lift-off processes. Then standard electron-beam lithography (EBL) was employed to define a pair of Ag electrodes with nanogap configuration (e.g., 100-500 nm spacing), followed by metal evaporation (Ag/Ti=200/3 nm) and lift-off processes (FIG. 9). The protein nanowire solution was then dropcasted onto the device and thermally dried (e.g., 60-80° C., 1-3 mins) or naturally dried (e.g., 25° C., 1 hr) in the ambient environment. The drying rate did not affect the memristive result. The final nanowire-film thickness was controlled by tuning the solution volume over unit area. Empirically, 110 µL/cm² nanowire solution (150 µg/mL) yielded an average film thickness ~1 µm. For control devices FIGS. 25A-25B) using polyvinylpyrrolidone (PVP) as the dielectric, PVP solution (3 mg/mL, molecular weight 360000) was dropcasted onto the nanogaped electrodes and naturally dried in the ambient environment. The final film thickness was ~1.8 µm.

Device fabrication: Vertical devices. The bottom electrode was first defined by standard lithography, metal evaporation (Pt/Ti=20/3 nm) and lift-off processes on a silicon substrate coated with 600 nm thermal oxide. Then the top electrode pattern was defined by photolithography, followed by electron-beam evaporation of $SiO_2$ (25 nm) and Ag/Ti (150/3 nm) and life-off processes. For the 100×100 nm² feature size (FIGS. 17A-17B), EBL was used to define the vertical device (electrodes were defined by photolithography). After the fabrication of the Pt—$SiO_2$—Ag device, the protein nanowire solution was dropcasted onto the device and naturally dried (e.g., 25° C., 1 hr) in the ambient environment. In a proof-of-concept demonstration to show the feasibility of patterning nanowire film in device fabrication (FIG. 9), photolithography, dropcasting and lift-off processes were carried out to define patterned protein-nanowire film (~50×50 µm²) on to the device.

As illustrated in FIG. 9: (1) ~500 nm thick photoresist (Microposit S1805) was spin-coated on the fabricated vertical Ag—SiO2-Pt devices. (2) The vertical device was then exposed (within a window size ~50×50 µm2) by standard exposure (with alignment) and development processes. (3) The protein-nanowire solution was dropcasted into the exposed window region and naturally dried in the ambient environment. The thickness (~500 nm) was controlled by dropcasting volume. (4). A final lift-off in acetone yielded Ag—SiO2-Pt devices embedded in patterned protein-nanowire film.

Electrical measurements. The electrical measurements were performed in the ambient environment, unless otherwise specified. The current-voltage (I-V) curves were measured by using an Agilent 4155C semiconductor parameter analyzer or a Keysight B1500A semiconductor analyzer. The pulsed measurements were carried out by using the B1530A waveform generator/fast measurement unit (WGFMU) integrated in the Keysight B1500A semiconductor analyzer. The emulated biosensing pulse signals were programmed using the WGFMU. The relative humidity (RH) in the ambient environment was real-time monitored by a hygrometer (Model 8706; REED Instruments). The higher RH (e.g., >50%) was controlled by tuning the equilibrium vapor pressure of sulfuric acid solutions in a sealed testing stage containing the device.

Material characterizations. The thicknesses in protein nanowires and PVP films (cross section) were measured by a desktop scanning electron microscope (SEM, EM-30 Plus; Element Pi). The device structure and filamentary evolution were measured by a high-resolution SEM (JSM-7001F; JEOL). The nanowire-nanowire networks were imaged by using a transmission electron microscope (TEM, JEM-2200FS; JEOL). The $H_2O$ bonding spectra in protein nanowires were performed by a Fourier-transform infrared spectroscopy (FTIR; Perkin Elmer) equipped with a universal attenuated-total-reflection (ATR) sampling accessory.

Cyclic voltammetry measurements. The cyclic voltammetry was performed with a computer-controlled electrochemical analyzer (CHI 440C, CH Instruments), using three-electrode configuration; Protein nanowires (~170 nm) or $SiO_2$ dielectric (~160 nm) were coated on Au electrodes (size~25 mm$^2$) as the working electrodes. A platinum wire and Ag/AgCl electrode were used as the counter electrode and reference electrode, respectively. A 0.10 M $KNO_3$ solution (with $Ag^+$ 5 mM) was used as the electrolyte for the electrochemical measurements.

Molecular dynamics simulation. Detailed modelling protocols can be found in our previous work. In brief, to examine the formation of water-permeable pores in protein nanowire networks, three nanowire-nanowire filaments, pili-pili, OmcS-OmcS, and OmcS-pili, were modelled using the latest CHARMM 36 m force field implemented in the CHARMM program. The initial structure of pili was obtained from a previous modeling work and that of OmcS was from Protein Data Bank (ID: 6EF8). In all cases, one filament was set as the reference filament, with its principal axis oriented along x-axis. The other filament, in parallel with the reference filament, was mobile, which could both translate along y-axis and rotate along its filament axis (FIG. 8A). As illustrated, the blue filament was set as the reference filament, with its principal axis oriented along x-axis. The red filament, in parallel with the blue one, was mobile, which could both translate along y-axis and rotate along its filament axis. A similar procedure was adopted in the modelling of OmcS-OmcS and OmcS-pili nanowire interfaces.

These configurations represented possible tightest packing between filaments. For each packing configuration, the system was energy minimized and then equilibrated at 300 K for 3 ns. After simulation, the first half of each trajectory was discarded as the equilibration process, and the averaged potential energy was computed for each system. This allowed one to identify the most stable configuration, i.e., the inter-filament distance along y-axis and filament rotation with minimal averaged potential energy, for each shift distance along x-axis. The pore profiles were analyzed using the HOLE program[69] for these stable packing configurations, and radius of narrowest region along the pore profile was reported as the pore radius The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A memristive device, comprising:
   a biomaterial layer comprising protein nanowires; and
   at least two electrodes in operative arrangement with the biomaterial layer such that an applied voltage induces memristive switching within the biomaterial layer.

2. The memristive device of claim 1, wherein the protein nanowires comprise a pilus structure, a cytochrome filament structure, or a combination thereof.

3. The memristive device of claim 2, wherein the pilus structure is a type IV pilus structure.

4. The memristive device of claim 1, wherein the protein nanowires are of the bacterium *G. sulfurreducens*.

5. The memristive device of claim 1, wherein the protein nanowires comprise a structure assembled from protein monomers having an amino acid sequence selected from the group consisting of SEQ ID NOs.: 1-33 and combinations thereof.

6. The memristive device of claim 1, wherein the protein nanowires are capable of exhibiting electrical conductivity.

7. The memristive device of claim 1, wherein the biomaterial layer comprises a composite of protein nanowires and at least one other material.

8. The memristive device of claim 7, wherein the at least one other material is an organic or inorganic material that modifies a conductive property of the protein nanowires, confers structural support to the protein nanowires, or a combination thereof.

9. The memristive device of claim 1, wherein the operative arrangement of the biomaterial and the at least two electrodes exhibits a switching voltage of about 20-150 mV.

10. The memristive device of claim 1, wherein at least one of the electrodes comprises a metal for which the biomaterial facilitates reduction in ionic form.

11. The memristive device of claim 1, wherein the biomaterial layer and electrodes are arranged in a planar structure, the planar structure comprising at least two electrodes separated by a gap, the biomaterial layer disposed within the gap.

12. The memristive device of claim 1, wherein the biomaterial and electrodes are arranged in a vertical structure, the vertical structure comprising at least two layered electrodes separated by an insulating layer, the biomaterial at least partially surrounding the layered electrodes.

13. The memristive device of claim 1, wherein the biomaterial and electrodes are arranged in a vertical structure, the vertical structure comprising at least two layered electrodes separated by a layer of the biomaterial.

14. An artificial neuron comprising a memristive device comprising:
  a biomaterial comprising protein nanowires, and
  at least two electrodes in operative arrangement with the biomaterial such that an applied voltage induces conductance switching, the electrodes configured to apply a pulsed voltage configured to mimic an action-potential input to a biological neuron.

15. The artificial neuron of claim 14, wherein the electrodes are configured to apply the pulsed voltage with a frequency pattern representing an integrate-and-fire event.

16. The artificial neuron of claim 14, wherein the electrodes are configured to apply the pulsed voltage with a frequency pattern representing a synaptic event.

17. The artificial neuron of claim 16, wherein the synaptic event exhibits a plasticity feature.

18. The artificial neuron of claim 17, wherein the plasticity feature is paired-pulse facilitation or paired-pulse depression.

19. A memristive device, comprising:
  a biomaterial comprising protein nanowires of the bacterium G. sulfurreducens; and
  at least two electrodes in operative arrangement with the biomaterial such that an applied voltage induces conductance switching.

20. A memristive device, comprising:
  a biomaterial comprising protein nanowires, the protein nanowires comprising a structure assembled from protein monomers having an amino acid sequence selected from the group consisting of SEQ ID NOs.: 1-33 and combinations thereof; and
  at least two electrodes in operative arrangement with the biomaterial such that an applied voltage induces conductance switching.

21. A memristive device, comprising:
  a biomaterial comprising protein nanowires; and
  at least two electrodes in operative arrangement with the biomaterial such that an applied voltage induces conductance switching at a switching voltage of about 20-150 mV.

22. A memristive device, comprising:
  a biomaterial comprising protein nanowires; and
  at least two electrodes in operative arrangement with the biomaterial such that an applied voltage induces conductance switching, the biomaterial and electrodes arranged in a vertical structure, the vertical structure comprising at least two layered electrodes separated by an insulating layer, the biomaterial at least partially surrounding the layered electrodes.

* * * * *

SEQUENCE LISTING

```
<160> NUMBER OF SEQ ID NOS: 33

<210> SEQ ID NO 1
<211> LENGTH: 61
<212> TYPE: PRT
<213> ORGANISM: Geobacter sulfurreducens

<400> SEQUENCE: 1

Phe Thr Leu Ile Glu Leu Leu Ile Val Val Ala Ile Ile Gly Ile Leu
1               5                   10                  15

Ala Ala Ile Ala Ile Pro Gln Phe Ser Ala Tyr Arg Val Lys Ala Tyr
            20                  25                  30

Asn Ser Ala Ala Ser Ser Asp Leu Arg Asn Leu Lys Thr Ala Leu Glu
        35                  40                  45

Ser Ala Phe Ala Asp Asp Gln Thr Tyr Pro Pro Glu Ser
    50                  55                  60

<210> SEQ ID NO 2
<211> LENGTH: 59
<212> TYPE: PRT
<213> ORGANISM: Geobacter metallireducens

<400> SEQUENCE: 2

Phe Thr Leu Ile Glu Leu Leu Ile Val Val Ala Ile Ile Gly Ile Leu
1               5                   10                  15

Ala Ala Ile Ala Ile Pro Gln Phe Ala Ala Tyr Arg Gln Lys Ala Phe
            20                  25                  30

Asn Ser Ala Ala Glu Ser Asp Leu Lys Asn Thr Lys Thr Asn Leu Glu
        35                  40                  45
```

```
Ser Tyr Tyr Ser Glu His Gln Phe Tyr Pro Asn
    50                  55

<210> SEQ ID NO 3
<211> LENGTH: 119
<212> TYPE: PRT
<213> ORGANISM: Calditerrivibrio nitroreducens

<400> SEQUENCE: 3

Phe Thr Leu Ile Glu Leu Leu Val Val Ala Ile Ile Ala Ile Leu
1               5                   10                  15

Ala Ala Ile Ala Ile Pro Gln Phe Ala Lys Tyr Arg Glu Asn Ala Ala
            20                  25                  30

Lys Ala Ser Ala Val Ala Asp Ala Lys Asn Ile Ala Thr Ala Ile Glu
        35                  40                  45

Ser Tyr Tyr Ala Asp Thr Gln Ser Phe Pro Ser Ser Ile Ser Asp Gly
    50                  55                  60

Ser Ile Val Pro Leu Gly Thr Gln Thr Phe Ser Leu Ser Lys Asn Asn
65                  70                  75                  80

Ser Phe Lys Gly Tyr Tyr Tyr Asn Asn Pro Ser Tyr Thr Phe Val Val
                85                  90                  95

Ser Asn Thr Ala Phe Asn Arg Ser Val Thr Phe Asn Ser Ala Thr Gly
            100                 105                 110

Gly Val Asp Val Asn Val Trp
        115

<210> SEQ ID NO 4
<211> LENGTH: 182
<212> TYPE: PRT
<213> ORGANISM: Desulfurvibrio alkaliphilus

<400> SEQUENCE: 4

Phe Thr Leu Val Glu Leu Met Ile Val Ala Ile Ile Gly Ile Leu
1               5                   10                  15

Ala Ala Val Ala Ile Pro Gln Phe Ala Gln Tyr Arg Ile Arg Gly Phe
            20                  25                  30

Asn Ser Ser Ala Leu Ser Asp Val Arg Asn Leu Thr Thr Ala Gln Glu
        35                  40                  45

Ala Phe Phe Ala Asp Trp Leu Arg Tyr Ala Val Thr His Glu Ala Ala
    50                  55                  60

Asp Val Thr Glu Val Lys Ala Thr Gly Asp Leu Leu Glu Gly Pro Ser
65                  70                  75                  80

Thr Gly Ala Met Val Leu Ala Gln Trp Ala Arg Gln Ala His Gln Gln
                85                  90                  95

Leu Pro Leu Ala Ile Gly Asn Gly Val Val Met Gln Ala Asp Val Ile
            100                 105                 110

Pro Ala Thr Ala Val Ser Tyr Val Ala Ile Ser Lys His Leu Gln Gly
        115                 120                 125

Asn Thr Met Tyr Gly Ala Thr Asn Thr Ser Thr Ala Ile His Arg Asp
    130                 135                 140

Gln Glu Thr Leu Val Pro Gly Gln Gly Asp Val Leu Pro Ile Thr
145                 150                 155                 160

Gly Tyr Met Pro Glu Pro His Glu Thr Asp Asp Pro Phe Ile Asp His
                165                 170                 175

Glu Glu Phe Glu Ala Gln
            180
```

<210> SEQ ID NO 5
<211> LENGTH: 60
<212> TYPE: PRT
<213> ORGANISM: Felxistipes sinusarabici

<400> SEQUENCE: 5

```
Phe Thr Leu Ile Glu Leu Leu Val Val Ala Ile Ile Gly Ile Leu
1               5                   10                  15

Ala Ala Ile Ala Ile Pro Gln Phe Ala Lys Tyr Arg Ile Asn Ala Phe
            20                  25                  30

Asn Ser Ala Ala Gln Ser Asp Leu Ala Asn Val Lys Ser Ala Leu Glu
        35                  40                  45

Ser Tyr Tyr Ala Glu Asn Phe Thr Tyr Pro Ser Pro
    50                  55                  60
```

<210> SEQ ID NO 6
<211> LENGTH: 110
<212> TYPE: PRT
<213> ORGANISM: Synthrophus aciditrophicus

<400> SEQUENCE: 6

```
Phe Thr Leu Ile Glu Leu Met Ile Val Ile Ala Ile Ile Gly Ile Leu
1               5                   10                  15

Ala Ala Ile Ala Ile Pro Gln Phe Gln Gln Tyr Arg Thr Arg Gly Tyr
            20                  25                  30

Asn Thr Ala Ala Lys Ala Asp Ala Lys Asn Ala Tyr Thr Ala Ala Gln
        35                  40                  45

Ala Tyr Phe Ser Asp His Pro Ser Val Thr Ile Ser Ser Ile Thr Asp
    50                  55                  60

Leu Ala Asn Tyr Gly Phe Lys Ala Ser Ala Asp Val Thr Thr Thr Ala
65                  70                  75                  80

Ala Gly Asp Met Asp Gly Leu Ala Ile Thr Ala Lys His Ser Ala Ser
                85                  90                  95

Asp Thr Thr Tyr Gln Val Asp Ser Gln Gly Thr Ile Thr Pro
            100                 105                 110
```

<210> SEQ ID NO 7
<211> LENGTH: 120
<212> TYPE: PRT
<213> ORGANISM: Syntrophus gentianae

<400> SEQUENCE: 7

```
Phe Thr Leu Ile Glu Leu Met Ile Val Ile Ala Ile Ile Gly Ile Leu
1               5                   10                  15

Ala Ala Ile Ala Ile Pro Gln Phe Thr Gln Tyr Arg Lys Arg Ala Tyr
            20                  25                  30

Asp Ala Ser Ser Lys Ala Asp Leu Lys Ser Ala Tyr Thr Ala Ala Gln
        35                  40                  45

Ala Trp Phe Asn Asp Asn Pro Ser Gly Thr Leu Pro Ala Ala Thr Ile
    50                  55                  60

Thr Ser Ala Thr Thr Gly Glu Leu Pro Gly Asn Gly Phe Lys Ala
65                  70                  75                  80

Ser Thr Gly Val Thr Ala Thr Val Ser Gly Thr Met Gly Thr Phe
                85                  90                  95

Ser Ile Ala Thr Thr His Ser Gln Gly Thr Lys Thr Tyr Asn Ile Thr
            100                 105                 110
```

Ala Gly Gly Thr Leu Thr Glu Ser
         115                 120

<210> SEQ ID NO 8
<211> LENGTH: 109
<212> TYPE: PRT
<213> ORGANISM: Smithella sp. F21

<400> SEQUENCE: 8

Phe Thr Leu Ile Glu Leu Met Ile Val Val Ala Ile Ile Gly Ile Leu
1               5                   10                  15

Ala Ala Ile Ala Ile Pro Gln Phe Ala Asn Tyr Arg Thr Lys Gly Tyr
            20                  25                  30

Asn Thr Lys Ala Lys Ala Glu Leu Lys Ser Ala Tyr Thr Ala Cys Gln
        35                  40                  45

Ala Tyr Phe Ser Asp Asn Pro Gly Ala Thr Ala Cys Ala Asn Ala Thr
    50                  55                  60

Leu Gly Gly Phe Asn Asn Ser Ser Asp Val Asn Ile Ala Val Gly Leu
65                  70                  75                  80

Ser Thr Pro Thr Gly Trp Thr Ala Thr Ala Ser His Ile Gly Gly Asn
                85                  90                  95

Gln Thr Phe Thr Val Asp Asn Gly Gly Arg Ile Thr Pro
            100                 105

<210> SEQ ID NO 9
<211> LENGTH: 141
<212> TYPE: PRT
<213> ORGANISM: Syntrophobacter fumaroxidans

<400> SEQUENCE: 9

Phe Thr Leu Val Glu Leu Met Ile Val Val Ala Ile Ile Gly Ile Leu
1               5                   10                  15

Ala Ala Val Ala Val Pro Tyr Tyr Gln Lys Tyr Ile Gln Lys Ser Arg
            20                  25                  30

Met Val Ser Lys Val Phe Pro Gly Met His Ala Ile Glu Thr Asn Met
        35                  40                  45

Gly Thr Tyr Phe Ser Phe Lys Asn Thr Leu Leu Asp Val Gly Ser Thr
    50                  55                  60

Ala Thr Phe Gly Gln Phe Val Gln Asp Ala Asp Thr Lys Cys Phe Ser
65                  70                  75                  80

Pro Ser Trp Ala Gly Glu Tyr Leu Leu Ile Thr Ile Lys Asp Pro Thr
                85                  90                  95

Leu Cys Gln Glu Leu Lys Ala Leu Thr Gly Met Thr Leu Ser Ala Thr
            100                 105                 110

Pro Arg Met Asp Thr Ser Arg Thr Lys Ile Arg Gly Trp Ala Leu Ala
        115                 120                 125

Gly Pro Leu Ala Val Gln Leu Gly Leu Glu Gly Glu Gln
    130                 135                 140

<210> SEQ ID NO 10
<211> LENGTH: 159
<212> TYPE: PRT
<213> ORGANISM: Syntrophobacter sp. DG_60

<400> SEQUENCE: 10

Phe Thr Leu Ile Glu Leu Met Ile Val Val Ala Ile Ile Ala Ile Leu
1               5                   10                  15

Ala Ala Ile Ala Ile Pro Gln Tyr Lys Lys Phe Gln Leu Lys Ala Lys

```
                20                  25                  30

Thr Ser Glu Ala Lys Ala Asn Leu Gly Ser Ile Arg Ser Cys Glu Glu
        35                  40                  45

Ala Tyr Ser Ala Glu Thr Asp Asn Tyr Val Phe Cys Gly Trp Thr Pro
    50                  55                  60

Ser Asn Ala Pro Thr Ala Gly Gln Ala Trp Val Thr Thr Ser Gly
65                  70                  75                  80

His Glu Gly Phe Val Ser Ile Gly Phe Ala Pro Ala Gly Thr Ser Arg
                85                  90                  95

Tyr Cys Tyr Cys Val Gly Gly Ser Val Asn Thr Ala Gly Thr Asp Ala
            100                 105                 110

Ala Thr Asn Ala Phe Asn Glu Gly Asn Val Asp Ile Tyr Met Thr Ala
        115                 120                 125

Lys Gly Asp Leu Asp Gly Asp Ser Asn Gln Trp Phe Tyr Ala Thr
    130                 135                 140

Asp Glu Asp Leu Lys Val Met Ala Asp Tyr Ser Gln Asp Phe
145                 150                 155

<210> SEQ ID NO 11
<211> LENGTH: 145
<212> TYPE: PRT
<213> ORGANISM: Syntrophobacter sp. SbD1

<400> SEQUENCE: 11

Phe Thr Leu Val Glu Leu Met Ile Val Val Ala Ile Ile Gly Ile Leu
1               5                   10                  15

Ala Ala Val Ala Val Pro Tyr Tyr Gln Lys Tyr Ile Gln Lys Ala Arg
                20                  25                  30

Leu Thr Ser Lys Val Ile Pro Gly Ile His Ser Ile Gln Thr Asp Leu
            35                  40                  45

Ala Thr Tyr Phe Ser Phe Gln Gln Met Phe Pro Gly Ala Gly Ala Thr
        50                  55                  60

Val Asn Ala Met Phe Thr Asp Ala Asn Thr His Cys Phe Thr Pro Thr
65                  70                  75                  80

Val Thr Ser Ala Ala Gly Ala Thr Ser Asn Phe Lys Ile Thr Phe Ala
                85                  90                  95

Ile Val Gly Ala Gly Cys Thr Glu Leu Ser Ser Leu Tyr Asn Gln Thr
            100                 105                 110

Ile Thr Ala Ser Pro Ile Leu Gly Asn Asn Ala Gln Val Ile Thr Gly
        115                 120                 125

Trp Thr Phe Gly Gly Thr Leu Ala Ala Asn Met Gly Leu Ala Gly Ala
    130                 135                 140

Gln
145

<210> SEQ ID NO 12
<211> LENGTH: 128
<212> TYPE: PRT
<213> ORGANISM: Syntrophorhabdus aromaticivorans

<400> SEQUENCE: 12

Phe Thr Leu Ile Glu Leu Leu Ile Val Ile Ala Ile Ile Gly Val Leu
1               5                   10                  15

Ala Ala Ile Ala Ile Pro Ala Tyr Thr Gly Tyr Thr Lys Lys Ala Lys
                20                  25                  30

Val Gly Glu Ile Ile His Ala Leu Gly Ala Ile Lys Ser Ala Val Ser
```

```
                35                  40                  45
Val Tyr Tyr Ser Glu Ala Gly Ala Thr Thr Asp Ala Thr Ala Asp
 50                  55                  60

Leu Ile Arg Thr Thr Tyr Gly Val Asp Val Pro Thr Gly Arg Ala Ser
 65                  70                  75                  80

Phe Gln Tyr Thr Ala Thr Ser Arg Glu Ile Gln Ala Thr Ser Lys Ile
                 85                  90                  95

Thr Gly Val Thr Gly Thr Met Thr Leu Thr Gly Ser Thr Asp Phe Lys
                100                 105                 110

Thr Trp Thr Trp Asp Gly Thr Met Asp Lys Ala Tyr Ile Pro Lys Asn
            115                 120                 125

<210> SEQ ID NO 13
<211> LENGTH: 114
<212> TYPE: PRT
<213> ORGANISM: Desulfatibacillum alkenivorans PilA

<400> SEQUENCE: 13

Phe Thr Leu Ile Glu Leu Met Ile Val Ile Ala Ile Ile Gly Ile Leu
 1               5                  10                  15

Ala Ala Ile Ala Ile Pro Asn Phe Val Ser Tyr Arg Lys Lys Ala Tyr
                 20                  25                  30

Asn Arg Thr Ala Gln Ala Asp Leu Ser Ser Ala Tyr Ser Thr Val Met
             35                  40                  45

Ala Tyr Tyr Ala Asp Glu Lys His Lys Glu Ile Asp Asn Phe Thr Leu
 50                  55                  60

Asp Asn Leu Lys Asp Ala Gly Phe Lys Gln Thr Val Gly Val Ala Val
 65                  70                  75                  80

Thr Val Thr Ser Val Asn Phe Gln Asp Phe Glu Leu Thr Ala Arg His
                 85                  90                  95

Ser Gln Gly Asp Ile Val Tyr Thr Ile Asp Ala Ala Gly Ala Arg Ser
                100                 105                 110

His Asn

<210> SEQ ID NO 14
<211> LENGTH: 157
<212> TYPE: PRT
<213> ORGANISM: Syntrophomonas zehnderi PilA

<400> SEQUENCE: 14

Phe Thr Leu Ile Glu Ile Leu Val Ala Leu Phe Leu Ala Ile Leu Val
 1               5                  10                  15

Ala Ser Ser Leu Val Thr Val Phe Gln Met Ser His His Ile Phe Tyr
                 20                  25                  30

Arg Asp Phe Ser Arg Ser Glu Leu Gln Tyr Met Ala Arg Lys Ala Met
             35                  40                  45

Glu Asp Ile Ile Asp Tyr Val Val Gln Ala Gln Pro Asp Ser Leu Ala
 50                  55                  60

Val Asn Gly Ala Glu Gly Ser Gln Leu Glu Phe Ile Leu Ser Ser Gly
 65                  70                  75                  80

Ala Lys Ile Gln Tyr Ser Gln Gly Ala Asn Tyr Trp Leu Tyr Arg Lys
                 85                  90                  95

Gly Pro Asp Ser Gly Pro Pro Gln Pro Ile Val Glu Gln Ile Ala Lys
                100                 105                 110

Val Lys Phe Cys Leu Ser Gly Pro His Ile Leu Thr Val Asp Val Val
            115                 120                 125
```

```
Ala Gly Asn Glu Lys Asn Ser Phe Thr Leu Thr Gln Met Ile Val Pro
            130                 135                 140

Arg Ala Glu Ile Asp Glu Asn Asp Trp Leu Asn Ser Leu
145                 150                 155

<210> SEQ ID NO 15
<211> LENGTH: 105
<212> TYPE: PRT
<213> ORGANISM: Syntrophaceticus schinkii PilA

<400> SEQUENCE: 15

Phe Thr Leu Val Glu Leu Met Val Val Leu Ile Ile Gly Ile Leu
1               5                   10                  15

Val Ala Ile Ala Ile Pro Ile Tyr Asn Lys Thr Gln Glu Asn Ala Gln
                20                  25                  30

Lys Arg Ala Cys Gln Ser Asn Leu Arg Thr Leu Asp Ser Ala Ala Ala
            35                  40                  45

Gln Tyr Gly Ala Ala Thr Gly Asn Tyr Pro Thr Asp Pro Leu Asn Asn
        50                  55                  60

Ala Asn Phe Val Gly Glu Asn Gly Tyr Val Lys Thr Lys Pro Thr Cys
65                  70                  75                  80

Pro Ala Gly Gly Val Tyr Asn Tyr Asp Ala Thr Asn Gly Lys Phe Ser
                85                  90                  95

Cys Asn Val Pro Asp His Val Tyr Pro
            100                 105

<210> SEQ ID NO 16
<211> LENGTH: 144
<212> TYPE: PRT
<213> ORGANISM: Tepidanaerobacter acetatoxydans PilA

<400> SEQUENCE: 16

Phe Thr Leu Ile Glu Leu Ile Leu Ala Leu Gly Leu Leu Ser Leu Ile
1               5                   10                  15

Met Thr Thr Ser Phe Thr Ile Tyr Ser Ala Gly Gln Lys Thr Tyr Glu
                20                  25                  30

Tyr Glu Asn Ser Lys Ile Phe Val Gln Gln Asn Ala Arg Gln Ala Phe
            35                  40                  45

Leu Trp Leu Ser Thr Ser Ile Lys Gln Ala Arg Ser Val Glu Val Met
        50                  55                  60

Ser Glu Asn Ser Ile Lys Thr Val Ala Gly Asp Gly Glu Thr Ile Ile
65                  70                  75                  80

Tyr Tyr Phe Lys Asn Gly Val Leu Tyr Arg Glu Lys Asn Asn Gly Ile
                85                  90                  95

Asn Pro Ile Ala Glu Leu Ser Gln Leu Lys Phe Lys Gln Pro Lys Asp
            100                 105                 110

Lys Gln Tyr Ile Glu Ile Phe Leu Ala Ala Gln Gly Lys Glu Gly Asp
        115                 120                 125

Asp Ile Ile Ile Lys Thr Lys Ala Thr Pro Phe Gly Leu Trp Val Asn
130                 135                 140

<210> SEQ ID NO 17
<211> LENGTH: 128
<212> TYPE: PRT
<213> ORGANISM: Thermacetogenium phaeum PilA

<400> SEQUENCE: 17
```

Phe Thr Met Ile Glu Met Met Val Val Leu Ile Ile Ala Val Leu
1               5                   10                  15

Ile Ala Gly Gly Ile Arg Phe Tyr Leu Gly Tyr Val Glu Arg Ala Lys
            20                  25                  30

Val Thr Lys Ala Lys Ser Glu Ile Thr Thr Met Gln Ala Ala Leu Asp
        35                  40                  45

Ser Tyr Tyr Ala Glu Lys Gly Glu Tyr Pro Asp Asp Glu Asn Asp Arg
    50                  55                  60

Glu Leu Val Lys Ala Gly Leu Ala Thr Asp Arg Ile Ser Ile Ser Thr
65                  70                  75                  80

Glu Gly Asn Asp Ser Ile Gln Tyr Ile Tyr Glu Gly Gly Asn Ser
            85                  90                  95

Tyr Lys Ile Ile Thr Thr Ala Thr Phe Arg Ala Gly Lys Leu Val Gly
            100                 105                 110

Glu Gly Gln Asp Gly Lys Ser Thr Glu Pro Asp Phe Gly Ser Gly Glu
            115                 120                 125

<210> SEQ ID NO 18
<211> LENGTH: 59
<212> TYPE: PRT
<213> ORGANISM: Geobacter metallireducens

<400> SEQUENCE: 18

Phe Thr Leu Ile Glu Leu Leu Ile Val Val Ala Ile Ile Gly Ile Leu
1               5                   10                  15

Ala Ala Ile Ala Ile Pro Gln Phe Ala Ala Tyr Arg Gln Lys Ala Phe
            20                  25                  30

Asn Ser Ala Ala Glu Ser Asp Leu Lys Asn Thr Lys Thr Asn Leu Glu
        35                  40                  45

Ser Tyr Tyr Ser Glu His Gln Phe Tyr Pro Asn
    50                  55

<210> SEQ ID NO 19
<211> LENGTH: 119
<212> TYPE: PRT
<213> ORGANISM: Calditerrivibrio nitroreducens

<400> SEQUENCE: 19

Phe Thr Leu Ile Glu Leu Leu Val Val Ala Ile Ile Ala Ile Leu
1               5                   10                  15

Ala Ala Ile Ala Ile Pro Gln Phe Ala Lys Tyr Arg Glu Asn Ala Ala
            20                  25                  30

Lys Ala Ser Ala Val Ala Asp Ala Lys Asn Ile Ala Thr Ala Ile Glu
        35                  40                  45

Ser Tyr Tyr Ala Asp Thr Gln Ser Phe Pro Ser Ser Ile Ser Asp Gly
    50                  55                  60

Ser Ile Val Pro Leu Gly Thr Gln Thr Phe Ser Leu Ser Lys Asn Asn
65                  70                  75                  80

Ser Phe Lys Gly Tyr Tyr Asn Asn Pro Ser Tyr Thr Phe Val Val
            85                  90                  95

Ser Asn Thr Ala Phe Asn Arg Ser Val Thr Phe Asn Ser Ala Thr Gly
            100                 105                 110

Gly Val Asp Val Asn Val Trp
            115

<210> SEQ ID NO 20
<211> LENGTH: 182

<212> TYPE: PRT
<213> ORGANISM: Desulfurvibrio alkaliphilus

<400> SEQUENCE: 20

```
Phe Thr Leu Val Glu Leu Met Ile Val Val Ala Ile Ile Gly Ile Leu
1               5                   10                  15

Ala Ala Val Ala Ile Pro Gln Phe Ala Gln Tyr Arg Ile Arg Gly Phe
                20                  25                  30

Asn Ser Ser Ala Leu Ser Asp Val Arg Asn Leu Thr Thr Ala Gln Glu
            35                  40                  45

Ala Phe Phe Ala Asp Trp Leu Arg Tyr Ala Val Thr His Glu Ala Ala
        50                  55                  60

Asp Val Thr Glu Val Lys Ala Thr Gly Asp Leu Leu Glu Gly Pro Ser
65                  70                  75                  80

Thr Gly Ala Met Val Leu Ala Gln Trp Ala Arg Gln Ala His Gln Gln
                85                  90                  95

Leu Pro Leu Ala Ile Gly Asn Gly Val Val Met Gln Ala Asp Val Ile
                100                 105                 110

Pro Ala Thr Ala Val Ser Tyr Val Ala Ile Ser Lys His Leu Gln Gly
            115                 120                 125

Asn Thr Met Tyr Gly Ala Thr Asn Thr Ser Thr Ala Ile His Arg Asp
        130                 135                 140

Gln Glu Thr Leu Val Pro Gly Gln Gly Gly Asp Val Leu Pro Ile Thr
145                 150                 155                 160

Gly Tyr Met Pro Glu Pro His Glu Thr Asp Asp Pro Phe Ile Asp His
                165                 170                 175

Glu Glu Phe Glu Ala Gln
                180
```

<210> SEQ ID NO 21
<211> LENGTH: 60
<212> TYPE: PRT
<213> ORGANISM: Felxistipes sinusarabici

<400> SEQUENCE: 21

```
Phe Thr Leu Ile Glu Leu Leu Val Val Val Ala Ile Ile Gly Ile Leu
1               5                   10                  15

Ala Ala Ile Ala Ile Pro Gln Phe Ala Lys Tyr Arg Ile Asn Ala Phe
                20                  25                  30

Asn Ser Ala Ala Gln Ser Asp Leu Ala Asn Val Lys Ser Ala Leu Glu
            35                  40                  45

Ser Tyr Tyr Ala Glu Asn Phe Thr Tyr Pro Ser Pro
        50                  55                  60
```

<210> SEQ ID NO 22
<211> LENGTH: 110
<212> TYPE: PRT
<213> ORGANISM: Synthrophus aciditrophicus

<400> SEQUENCE: 22

```
Phe Thr Leu Ile Glu Leu Met Ile Val Ile Ala Ile Ile Gly Ile Leu
1               5                   10                  15

Ala Ala Ile Ala Ile Pro Gln Phe Gln Gln Tyr Arg Thr Arg Gly Tyr
                20                  25                  30

Asn Thr Ala Ala Lys Ala Asp Ala Lys Asn Ala Tyr Thr Ala Ala Gln
            35                  40                  45

Ala Tyr Phe Ser Asp His Pro Ser Val Thr Ile Ser Ser Ile Thr Asp
```

```
Leu Ala Asn Tyr Gly Phe Lys Ala Ser Ala Asp Val Thr Thr Thr Ala
 65                  70                  75                  80

Ala Gly Asp Met Asp Gly Leu Ala Ile Thr Ala Lys His Ser Ala Ser
                 85                  90                  95

Asp Thr Thr Tyr Gln Val Asp Ser Gln Gly Thr Ile Thr Pro
            100                 105                 110

<210> SEQ ID NO 23
<211> LENGTH: 120
<212> TYPE: PRT
<213> ORGANISM: Syntrophus gentianae

<400> SEQUENCE: 23

Phe Thr Leu Ile Glu Leu Met Ile Val Ile Ala Ile Ile Gly Ile Leu
  1               5                  10                  15

Ala Ala Ile Ala Ile Pro Gln Phe Thr Gln Tyr Arg Lys Arg Ala Tyr
                 20                  25                  30

Asp Ala Ser Ser Lys Ala Asp Leu Lys Ser Ala Tyr Thr Ala Ala Gln
             35                  40                  45

Ala Trp Phe Asn Asp Asn Pro Ser Gly Thr Leu Pro Ala Ala Thr Ile
 50                  55                  60

Thr Ser Ala Thr Thr Thr Gly Glu Leu Pro Gly Asn Gly Phe Lys Ala
 65                  70                  75                  80

Ser Thr Gly Val Thr Ala Thr Val Thr Ser Gly Thr Met Gly Thr Phe
                 85                  90                  95

Ser Ile Ala Thr Thr His Ser Gln Gly Thr Lys Thr Tyr Asn Ile Thr
            100                 105                 110

Ala Gly Gly Thr Leu Thr Glu Ser
        115                 120

<210> SEQ ID NO 24
<211> LENGTH: 109
<212> TYPE: PRT
<213> ORGANISM: Smithella sp. F21

<400> SEQUENCE: 24

Phe Thr Leu Ile Glu Leu Met Ile Val Val Ala Ile Ile Gly Ile Leu
  1               5                  10                  15

Ala Ala Ile Ala Ile Pro Gln Phe Ala Asn Tyr Arg Thr Lys Gly Tyr
                 20                  25                  30

Asn Thr Lys Ala Lys Ala Glu Leu Lys Ser Ala Tyr Thr Ala Cys Gln
             35                  40                  45

Ala Tyr Phe Ser Asp Asn Pro Gly Ala Thr Ala Cys Ala Asn Ala Thr
 50                  55                  60

Leu Gly Gly Phe Asn Asn Ser Ser Asp Val Asn Ile Ala Val Gly Leu
 65                  70                  75                  80

Ser Thr Pro Thr Gly Trp Thr Ala Thr Ala Ser His Ile Gly Gly Asn
                 85                  90                  95

Gln Thr Phe Thr Val Asp Asn Gly Gly Arg Ile Thr Pro
            100                 105

<210> SEQ ID NO 25
<211> LENGTH: 141
<212> TYPE: PRT
<213> ORGANISM: Syntrophobacter fumaroxidans

<400> SEQUENCE: 25
```

```
Phe Thr Leu Val Glu Leu Met Ile Val Ala Ile Ile Gly Ile Leu
1               5                   10                  15

Ala Ala Val Ala Val Pro Tyr Tyr Gln Lys Tyr Ile Gln Lys Ser Arg
            20                  25                  30

Met Val Ser Lys Val Phe Pro Gly Met His Ala Ile Glu Thr Asn Met
        35                  40                  45

Gly Thr Tyr Phe Ser Phe Lys Asn Thr Leu Leu Asp Val Gly Ser Thr
    50                  55                  60

Ala Thr Phe Gly Gln Phe Val Gln Asp Ala Asp Thr Lys Cys Phe Ser
65                  70                  75                  80

Pro Ser Trp Ala Gly Glu Tyr Leu Leu Ile Thr Ile Lys Asp Pro Thr
                85                  90                  95

Leu Cys Gln Glu Leu Lys Ala Leu Thr Gly Met Thr Leu Ser Ala Thr
            100                 105                 110

Pro Arg Met Asp Thr Ser Arg Thr Lys Ile Arg Gly Trp Ala Leu Ala
        115                 120                 125

Gly Pro Leu Ala Val Gln Leu Gly Leu Glu Gly Glu Gln
    130                 135                 140
```

<210> SEQ ID NO 26
<211> LENGTH: 159
<212> TYPE: PRT
<213> ORGANISM: Syntrophobacter sp. DG_60

<400> SEQUENCE: 26

```
Phe Thr Leu Ile Glu Leu Met Ile Val Val Ala Ile Ile Ala Ile Leu
1               5                   10                  15

Ala Ala Ile Ala Ile Pro Gln Tyr Lys Lys Phe Gln Leu Lys Ala Lys
            20                  25                  30

Thr Ser Glu Ala Lys Ala Asn Leu Gly Ser Ile Arg Ser Cys Glu Glu
        35                  40                  45

Ala Tyr Ser Ala Glu Thr Asp Asn Tyr Val Phe Cys Gly Trp Thr Pro
    50                  55                  60

Ser Asn Ala Pro Thr Ala Ala Gly Gln Ala Trp Val Thr Thr Ser Gly
65                  70                  75                  80

His Glu Gly Phe Val Ser Ile Gly Phe Ala Pro Ala Gly Thr Ser Arg
                85                  90                  95

Tyr Cys Tyr Cys Val Gly Gly Ser Val Asn Thr Ala Gly Thr Asp Ala
            100                 105                 110

Ala Thr Asn Ala Phe Asn Glu Gly Asn Val Asp Ile Tyr Met Thr Ala
        115                 120                 125

Lys Gly Asp Leu Asp Gly Asp Gly Ser Asn Gln Trp Phe Tyr Ala Thr
    130                 135                 140

Asp Glu Asp Leu Lys Val Met Ala Asp Tyr Ser Gln Asp Asp Phe
145                 150                 155
```

<210> SEQ ID NO 27
<211> LENGTH: 145
<212> TYPE: PRT
<213> ORGANISM: Syntrophobacter sp. SbD1

<400> SEQUENCE: 27

```
Phe Thr Leu Val Glu Leu Met Ile Val Val Ala Ile Ile Gly Ile Leu
1               5                   10                  15

Ala Ala Val Ala Val Pro Tyr Tyr Gln Lys Tyr Ile Gln Lys Ala Arg
            20                  25                  30
```

```
Leu Thr Ser Lys Val Ile Pro Gly Ile His Ser Ile Gln Thr Asp Leu
         35                  40                  45

Ala Thr Tyr Phe Ser Phe Gln Gln Met Phe Pro Gly Ala Gly Ala Thr
 50                  55                  60

Val Asn Ala Met Phe Thr Asp Ala Asn Thr His Cys Phe Thr Pro Thr
 65                  70                  75                  80

Val Thr Ser Ala Ala Gly Ala Thr Ser Asn Phe Lys Ile Thr Phe Ala
             85                  90                  95

Ile Val Gly Ala Gly Cys Thr Glu Leu Ser Ser Leu Tyr Asn Gln Thr
            100                 105                 110

Ile Thr Ala Ser Pro Ile Leu Gly Asn Asn Ala Gln Val Ile Thr Gly
            115                 120                 125

Trp Thr Phe Gly Gly Thr Leu Ala Ala Asn Met Gly Leu Ala Gly Ala
            130                 135                 140

Gln
145

<210> SEQ ID NO 28
<211> LENGTH: 128
<212> TYPE: PRT
<213> ORGANISM: Syntrophorhabdus aromaticivorans

<400> SEQUENCE: 28

Phe Thr Leu Ile Glu Leu Leu Ile Val Ile Ala Ile Gly Val Leu
 1               5                  10                  15

Ala Ala Ile Ala Ile Pro Ala Tyr Thr Gly Tyr Thr Lys Lys Ala Lys
             20                  25                  30

Val Gly Glu Ile Ile His Ala Leu Gly Ala Ile Lys Ser Ala Val Ser
         35                  40                  45

Val Tyr Tyr Ser Glu Ala Gly Ala Thr Thr Asp Ala Thr Thr Ala Asp
 50                  55                  60

Leu Ile Arg Thr Thr Tyr Gly Val Asp Val Pro Thr Gly Arg Ala Ser
 65                  70                  75                  80

Phe Gln Tyr Thr Ala Thr Ser Arg Glu Ile Gln Ala Thr Ser Lys Ile
             85                  90                  95

Thr Gly Val Thr Gly Thr Met Thr Leu Thr Gly Ser Thr Asp Phe Lys
            100                 105                 110

Thr Trp Thr Trp Asp Gly Thr Met Asp Lys Ala Tyr Ile Pro Lys Asn
            115                 120                 125

<210> SEQ ID NO 29
<211> LENGTH: 114
<212> TYPE: PRT
<213> ORGANISM: Desulfatibacillum alkenivorans PilA

<400> SEQUENCE: 29

Phe Thr Leu Ile Glu Leu Met Ile Val Ile Ala Ile Ile Gly Ile Leu
 1               5                  10                  15

Ala Ala Ile Ala Ile Pro Asn Phe Val Ser Tyr Arg Lys Lys Ala Tyr
             20                  25                  30

Asn Arg Thr Ala Gln Ala Asp Leu Ser Ser Ala Tyr Ser Thr Val Met
         35                  40                  45

Ala Tyr Tyr Ala Asp Glu Lys His Lys Glu Ile Asp Asn Phe Thr Leu
 50                  55                  60

Asp Asn Leu Lys Asp Ala Gly Phe Lys Gln Thr Val Gly Val Ala Val
 65                  70                  75                  80
```

```
Thr Val Thr Ser Val Asn Phe Gln Asp Phe Glu Leu Thr Ala Arg His
                85                  90                  95

Ser Gln Gly Asp Ile Val Tyr Thr Ile Asp Ala Ala Gly Ala Arg Ser
            100                 105                 110

His Asn

<210> SEQ ID NO 30
<211> LENGTH: 157
<212> TYPE: PRT
<213> ORGANISM: Syntrophomonas zehnderi PilA

<400> SEQUENCE: 30

Phe Thr Leu Ile Glu Ile Leu Val Ala Leu Phe Leu Ala Ile Leu Val
1               5                   10                  15

Ala Ser Ser Leu Val Thr Val Phe Gln Met Ser His His Ile Phe Tyr
            20                  25                  30

Arg Asp Phe Ser Arg Ser Glu Leu Gln Tyr Met Ala Arg Lys Ala Met
        35                  40                  45

Glu Asp Ile Ile Asp Tyr Val Val Gln Ala Gln Pro Asp Ser Leu Ala
50                  55                  60

Val Asn Gly Ala Glu Gly Ser Gln Leu Glu Phe Ile Leu Ser Ser Gly
65                  70                  75                  80

Ala Lys Ile Gln Tyr Ser Gln Gly Ala Asn Tyr Trp Leu Tyr Arg Lys
                85                  90                  95

Gly Pro Asp Ser Gly Pro Gln Pro Ile Val Glu Gln Ile Ala Lys
            100                 105                 110

Val Lys Phe Cys Leu Ser Gly Pro His Ile Leu Thr Val Asp Val Val
        115                 120                 125

Ala Gly Asn Glu Lys Asn Ser Phe Thr Leu Thr Gln Met Ile Val Pro
    130                 135                 140

Arg Ala Glu Ile Asp Glu Asn Asp Trp Leu Asn Ser Leu
145                 150                 155

<210> SEQ ID NO 31
<211> LENGTH: 105
<212> TYPE: PRT
<213> ORGANISM: Syntrophaceticus schinkii PilA

<400> SEQUENCE: 31

Phe Thr Leu Val Glu Leu Met Val Val Leu Ile Ile Gly Ile Leu
1               5                   10                  15

Val Ala Ile Ala Ile Pro Ile Tyr Asn Lys Thr Gln Glu Asn Ala Gln
            20                  25                  30

Lys Arg Ala Cys Gln Ser Asn Leu Arg Thr Leu Asp Ser Ala Ala Ala
        35                  40                  45

Gln Tyr Gly Ala Ala Thr Gly Asn Tyr Pro Thr Asp Pro Leu Asn Asn
50                  55                  60

Ala Asn Phe Val Gly Glu Asn Gly Tyr Val Lys Thr Lys Pro Thr Cys
65                  70                  75                  80

Pro Ala Gly Gly Val Tyr Asn Tyr Asp Ala Thr Asn Gly Lys Phe Ser
                85                  90                  95

Cys Asn Val Pro Asp His Val Tyr Pro
            100                 105

<210> SEQ ID NO 32
<211> LENGTH: 144
```

```
<212> TYPE: PRT
<213> ORGANISM: Tepidanaerobacter acetatoxydans PilA

<400> SEQUENCE: 32

Phe Thr Leu Ile Glu Leu Ile Leu Ala Leu Gly Leu Leu Ser Leu Ile
1               5                   10                  15

Met Thr Thr Ser Phe Thr Ile Tyr Ser Ala Gly Gln Lys Thr Tyr Glu
            20                  25                  30

Tyr Glu Asn Ser Lys Ile Phe Val Gln Gln Asn Ala Arg Gln Ala Phe
        35                  40                  45

Leu Trp Leu Ser Thr Ser Ile Lys Gln Ala Arg Ser Val Glu Val Met
    50                  55                  60

Ser Glu Asn Ser Ile Lys Thr Val Ala Gly Asp Gly Glu Thr Ile Ile
65                  70                  75                  80

Tyr Tyr Phe Lys Asn Gly Val Leu Tyr Arg Glu Lys Asn Asn Gly Ile
                85                  90                  95

Asn Pro Ile Ala Glu Leu Ser Gln Leu Lys Phe Lys Gln Pro Lys Asp
            100                 105                 110

Lys Gln Tyr Ile Glu Ile Phe Leu Ala Ala Gln Gly Lys Glu Gly Asp
        115                 120                 125

Asp Ile Ile Ile Lys Thr Lys Ala Thr Pro Phe Gly Leu Trp Val Asn
        130                 135                 140

<210> SEQ ID NO 33
<211> LENGTH: 128
<212> TYPE: PRT
<213> ORGANISM: Thermacetogenium phaeum PilA

<400> SEQUENCE: 33

Phe Thr Met Ile Glu Met Met Val Val Leu Ile Ile Ile Ala Val Leu
1               5                   10                  15

Ile Ala Gly Gly Ile Arg Phe Tyr Leu Gly Tyr Val Glu Arg Ala Lys
            20                  25                  30

Val Thr Lys Ala Lys Ser Glu Ile Thr Thr Met Gln Ala Ala Leu Asp
        35                  40                  45

Ser Tyr Tyr Ala Glu Lys Gly Glu Tyr Pro Asp Asp Glu Asn Asp Arg
    50                  55                  60

Glu Leu Val Lys Ala Gly Leu Ala Thr Asp Arg Ile Ser Ile Ser Thr
65                  70                  75                  80

Glu Gly Asn Asp Ser Ile Gln Tyr Ile Tyr Glu Gly Gly Asn Ser
        85                  90                  95

Tyr Lys Ile Ile Thr Thr Ala Thr Phe Arg Ala Gly Lys Leu Val Gly
            100                 105                 110

Glu Gly Gln Asp Gly Lys Ser Thr Glu Pro Asp Phe Gly Ser Gly Glu
        115                 120                 125
```